United States Patent [19]
Takizawa et al.

[11] Patent Number: 5,191,688
[45] Date of Patent: Mar. 9, 1993

[54] METHOD FOR PRODUCING A SUPERIOR LONGITUDINAL VIBRATOR

[75] Inventors: Hiroyuki Takizawa; Sumio Kawai, both of Hachioji; Sadayuki Ueha, Machida, all of Japan

[73] Assignee: Olympus Optical Co., Ltd., Tokyo, Japan

[21] Appl. No.: 806,167

[22] Filed: Dec. 12, 1991

Related U.S. Application Data

[62] Division of Ser. No. 558,826, Jul. 26, 1990, Pat. No. 5,136,200.

[30] Foreign Application Priority Data

| Jul. 27, 1989 | [JP] | Japan | 1-195767 |
| Nov. 28, 1989 | [JP] | Japan | 1-310011 |
| Dec. 21, 1989 | [JP] | Japan | 1-332155 |
| Mar. 27, 1990 | [JP] | Japan | 2-79800 |
| Apr. 10, 1990 | [JP] | Japan | 2-95399 |
| Apr. 20, 1990 | [JP] | Japan | 2-104589 |
| Apr. 27, 1990 | [JP] | Japan | 2-113683 |
| May 18, 1990 | [JP] | Japan | 2-128852 |

[51] Int. Cl.⁵ .................................... H01L 41/22
[52] U.S. Cl. .................... 29/25.35; 310/323
[58] Field of Search ............ 29/25.35; 320/323, 325, 320/328

[56] References Cited
U.S. PATENT DOCUMENTS

| 4,882,500 | 11/1989 | Iijima | 310/323 |
| 4,884,002 | 11/1982 | Eusamann et al. | 310/323 |
| 4,912,351 | 3/1990 | Takata et al. | 310/323 |

Primary Examiner—Carl E. Hall
Attorney, Agent, or Firm—Louis Weinstein

[57] ABSTRACT

An ultrasonic motor including a driving member and a driven member, the driving member comprising a plate- or rod-like elastic member, a flexural vibrator fixed to the elastic member and causing the elastic member to induce a standing wave type flexural vibration upon application of an AC voltage thereto, and a longitudinal vibrator provided on a node line of the flexural vibration at the surface of the elastic member, the longitudinal vibrator being pivoted about the node line by the flexural vibrator and adapted to expand and contract in an amplitude direction of the flexural vibration upon application of an AC voltage thereto, the driven member being brought into pressure contact with an end face of the longitudinal vibrator. The longitudinal vibrator is expanded or contracted in synchronism with the flexural vibration, whereby the driving member and the driven member are moved relatively to each other.

9 Claims, 36 Drawing Sheets

(T1)

(T2)

(T3)

(T4)

(T5)

(T6)

(T7)

(T8)

METHOD FOR PRODUCING A SUPERIOR LONGITUDINAL VIBRATOR

This is a division of application Ser. No. 558,826, filed Jul. 26, 1990, now U.S. Pat. No. 5,136,200.

BACKGROUND OF THE INVENTION

The present invention relates to an ultrasonic motor and more particularly to an ultrasonic motor in which a flexural vibrator and a longitudinal vibrator constituted by electro-mechanical transducing elements are combined together, the longitudinal vibrator being mounted to a node of flexural vibration of the flexural vibrator, and a driven member is moved by an ultrasonic driving force generated by both vibrators.

Ultrasonic motors have recently occupied the attention of people concerned. As is well known, this type of motor has the characteristic in that a low-speed drive is easy and a high torque output is obtained. Some of them have already been commercialized. However, the commecialized ultrasonic motors are rotary type motors, and small-sized linear type motors having a high degree of design freedom and capable of being easily modified into a rotary type motor have not been commercialized yet. This is because it is difficult to manufacture a small-sized linear type ultrasonic motor of high efficiency and high output. For example, in a travelling wave type linear ultrasonic motor proposed in Japanese Patent Laid Open No. 96881/84, it is necessary to use a closed loop-shaped flexural vibrator for generating a travelling wave efficiently. Consequently, the vibrator becomes very large in size and the mechanism for supporting the vibrator is complicated in structure. Further, the motor efficiency itself is only several percent and thus not always high. In Japanese Patent Laid Open No. 277477/88 there is proposed a linear type ultrasonic motor in which a flexural resonance vibration of a plate and a longitudinal resonance vibration thereof are combined together. In this case, in order to realize a high efficiency motor it is necessary to make the resonance frequency in the flexural resonance of the plate and that in the longitudinal resonance thereof coincident with each other. Thus, restrictions are imposed on the size and shape, and hence it has been not easy to attain the reduction of size and high efficiency. In the motor in question, moreover, it is impossible to increase the pressure-contacting force and hence impossible to generate a large driving force because the vibration for generating a frictional force utilizes a transverse effect (the vibrating direction is orthogonal to a voltage application direction) of a piezoelectric element.

Further, an ultrasonic motor which utilizes nodes of a standing wave to drive a moving member as a contact member is disclosed, for example, in Japanese Patent Laid Open No. 69472/88. In this ultrasonic motor, projections projecting in the normal direction are disposed at node portions of a standing wave on one-side circumference portion of a disc-like vibrator which generates a standing wave of thickness flexural vibration, while on the other side of the vibrator there is disposed means for vibrating every other projection at opposite phases in the thickness direction. When a rotor is brought into pressure contact with each projection, the inclination in the circumferential direction of the projection is changed by the standing wave, and this change of the said inclination is utilized to impart a rotating force in a certain direction to the rotor. In the above prior art references there also is proposed a construction in which a plurality of longitudinal vibrators utilizing the transverse effect are mounted in the positions of nodes of a disc-like flexural vibrator.

On the other hand, as is well known, an ultrasonic motor is attracting the attention of many concerns as an actuator which permits a focusing operation of a photographic lens of a camera, for example, in a small space. This is for the following reason. Ultrasonic motors, as compared with conventional electromagnetic motors, can afford a large torque at low speed, so a lens holding frame can be driven directly, that is, a reduction gear is not needed, and it is possible to realize the driving of a lens at high accuracy, high response, reduced and without noise.

In the case of using an ultrasonic motor as an actuator for driving a lens of a camera, some consideration is needed about the shape and position of the actuator for disposing the actuator in a small space within a hollow cylindrical frame containing a lens holding frame. This has been realized by an annular ultrasonic motor using a travelling wave which is disclosed in Japanese Patent Laid Open No. 222672/89. According to this ultrasonic motor, a travelling wave is generated in the circumferential direction of a ring-shaped vibrator and an end face of a cylindrical body serving as a rotor is brought into pressure contact with an end face at which the travelling wave is generated to rotate the cylindrical body; further, for converting the rotation of the cylindrical body to a rectilinear motion of a lens, the cylindrical body is provided with a conversion mechanism such as a cam or a helicoid screw, whereby the lens is moved forward and backward in the optical axis direction.

There has also been proposed such a construction as disclosed in Japanese Patent Publication No. 7245/85 in which a lens is provided with inch worm type actuators whereby the lens is driven rectilinearly. More particularly, two actuators for clamping and one actuator for driving are operated successively to drive a lens holding frame rectilinearly.

Further, according to the construction disclosed in Japanese Patent Laid Open No. 99714/87, a travelling wave type rail-shaped rectilinear motor is disposed on the outer periphery of a lens holding frame and the lens holding frame is driven by a travelling vibration wave generated in the motor.

In the construction proposed in the foregoing Japanese Patent Laid Open No. 69472/88, it is necessary that projections disposed on nodes of a first vibrator be vibrated in the thickness direction by a flexural vibration generated at a second vibrator in synchronism with a flexural vibration generated by the first vibrator. To this end it is necessary to make the resonance frequency of the first vibrator and that of the second vibrator coincident with each other, and hence a high level of technique is required for the manufacture of the vibrators. Besides, even when the first vibrator is vibrated, the vibration of the first vibrator is suppressed by the second vibrator disposed adjacent the first vibrator. Conversely, the vibration of the second vibrator is suppressed by the first vibrator. Thus, loss of vibration energy is large.

In Japanese Patent Laid Open No. 69472/88 there is disclosed means using a longitudinal vibrator which utilizes the transverse effect of a piezoelectric element on a node of a flexural disc. In this case, for driving at an amplitude required for driving a moving member, there may be adopted any of the following means:

① Applying a high voltage signal to the longitudinal vibrator.
② Making the longitudinal vibrator longer.
③ Resonating the longitudinal vibrator.

However, many problems are involved in practising these means, which problems will be explained below with reference to FIG. 19.

FIG. 19 is a perspective view for explaining the operation of a longitudinal vibrator indicated at 101. In the same figure, when voltage is applied to the longitudinal vibrator 101 in the thickness direction for utilizing the transverse effect of a piezoelectric element, if the original length, thickness and width of the longitudinal vibrator are L (m), T (m) and W (m), respectively, a piezoelectric distortion constant in the length L direction is $d_{31}$ (m/V) and an applied voltage is V (v), then a displacement $\Delta L$ (m) is expressed by the following relationship:

$$\Delta L = d_{31}(-L/T)V \qquad (1)$$

In the case where 100 V is applied to a longitudinal vibrator having a length of 10 mm and a thickness of 2 mm, V is $-100$ V because the voltage application direction is opposite to a polarization direction $A_1$. If the piezoelectric distortion constant $d_{31}$ is set to $d_{31} = -130 \times 10^{-12}$ m/V which is a standard value of a piezoelectric element material used in ultrasonic motors, the displacement $\Delta L$ (m) is given as follows:

$$\begin{aligned}\Delta L &= -130 \times 10^{-12} \times 0.01/0.002 \times (-100) \\ &= 6.5 \times 10^{-8} (m)\end{aligned} \qquad (1a)$$

Thus, even under the application of negative 100 V, the displacement $\Delta L$ (m) is as small as 0.065 $\mu$m. In this connection, studies will be made below about means for increasing the displacement $\Delta L$.

First, a study will be made about enlarging the displacement $\Delta L$ by increasing voltage as in the foregoing item ①. For example, where a displacement of 1 $\mu$m is to be obtained, $\Delta L = 0.065$ $\mu$m at V = 100 V in the above equation (1a), so $1/0.065 = 15$, that is, a very high application voltage of 1,500 V corresponding to fifteen times the voltage of 100 V is required.

Next, a study will be made about obtaining a sufficient displacement $\Delta L = 1$ $\mu$m by making the longitudinal vibrator longer as in the foregoing item ②. If the above equation (1) is changed in form to determine the original length L of the longitudinal vibrator, the length L is given as follows:

$$L = \frac{\Delta L \cdot T}{d_{31} V}$$

Substitution of actual numerical values into the above equation gives:

$$\begin{aligned}L &= \frac{1 \times 10^{-6} \times 0.002}{-130 \times 10^{-12} \times (-100)} \\ &= 0.153 \, (m)\end{aligned}$$

That is, a longitudinal vibrator as long as 15.3 cm is required for obtaining a displacement of 1 $\mu$m.

Further, a study will now be made about the utilization of resonance as in the foregoing item ③. If a frequency constant in the longitudinal direction is $N_2$ (Hz−m) and the length is L (m), a resonance frequency, $f_r$ (Hz), in the longitudinal direction is expressed by the following relationship:

$$f_r = N_2/L \qquad (2)$$

This equation (2) can be transformed as follows:

$$L = N_2/f_r \qquad (2a)$$

If the value 1570 (Hz−m) of the material commonly used in ultrasonic motors, as the longitudinal frequency constant $N_2$, and a general driving frequency 40 KHz of ultrasonic motors, as the longitudinal resonance frequency $f_r$ of the longitudinal vibrator, are substituted into the above equation (2a), the length L of the longitudinal vibrator is given as follows:

$$L = 1570/40{,}000 = 0.03925 \, (m)$$

That is, the length L of the longitudinal vibrator which resonates at 40 KHz is about 4 cm, corresponding to about one fourth of 15.3 cm which has been obtained in the study of the foregoing item ②. But even this length is still large as the length of the longitudinal vibrator In such a longitudinal vibrator about 4 cm in length, a flexural resonance point exists at a point lower in frequency, so the operation of longitudinal vibration becomes unstable and impractical, and the piezoelectric element itself becomes easier to be broken.

In the case where a large number of longitudinal vibrators are arranged on a disc, it is necessary that the front ends of the longitudinal vibrators be contacted uniformly with the rotor in order to transfer driving forces generated by the longitudinal vibrators effectively to the rotor. Consequently, it becomes difficult to maintain the flatness of the contact surface of each longitudinal vibrator.

For driving a lens by the foregoing annular ultrasonic motor using a travelling wave disclosed in Japanese Patent Laid Open No. 222672/89, it is necessary to provide a conversion mechanism, e.g. helicoid screw or cam, for converting a rotational motion generated in the motor to a rectilinear motion. And a hollow motor is large in size and complicated in structure. Moreover, the use of a helicoid screw or a cam causes mechanical wobbling, thus making it difficult to attain a high positional accuracy of the lens holding frame.

In the foregoing Japanese Patent Publication No. 7245/85 using an inch worm type actuator for driving a lens, the operational mechanism disclosed therein permits driving only up to a step frequency of several KHz or so, and thus there is the drawback that the operating speed is low. Further, it is necessary for the clamping actuators to fix and hold the lens frame to a stationary frame during clamping and be completely spaced away from the stationary frame when clamping is not made. As the clamping actuators there are used piezoelectric laminates having an operating stroke of several to several tens of micron meters. Wear of the clamped surface may cause the clamping operation to become unstable, sometimes resulting in discontinuance of the driving of the lens. Moreover, for holding the lens in a certain position it is necessary to continue the application of power to the actuators and thereby keep the actuators clamped. This means energy consumption even when operation is not performed.

In the travelling wave type linear ultrasonic motor disclosed in the foregoing Japanese Patent Laid Open No. 99714/87, a closed loop-shaped vibrator for generating a travelling wave must be disposed at the outer periphery of lens, so if a lens frame is used, it is required to be larger in size. Besides, since a travelling wave is used, it is difficult to fix the vibrator without impairment of vibration, and if the vibrator is supported through a damping material or the like, the lens position in the direction orthogonal to the optical axis of the lens with respect to the stationary member is not determined accurately.

SUMMARY OF THE INVENTION

It is a first object of the present invention to eliminate the conventional problems of ultrasonic motors mentioned above and provide an ultrasonic motor high in both productivity and efficiency and superior in response characteristic.

It is a second object of the present invention to provide an ultrasonic motor capable of sufficiently withdrawing a driving force generated by a longitudinal vibrator without impairing flexural vibration of a flexural vibrator, and thereby permitting a highly efficient stable operation.

It is a third object of the present invention to provide an ultrasonic motor capable of supporting a flexural vibrator so as to minimize the efficiency loss of the flexural vibrator and preventing the generation of unnecessary slip vibration caused by such support, said ultrasonic motor being small in size, high inefficiency, and affording a highly stable output without generation of any disagreeable sound.

It is a fourth object of the present invention to provide a linear type ultrasonic motor of high efficiency in which a hollow moving member can be driven rectilinearly in a small space and in a simple structure and can be positioned and guided with high accuracy relative to a stationary member.

According to the present invention, longitudinal vibrators are provided on node lines of a standing wave vibration generated by a flexural vibrator, and a driven member in contact with the front ends of the longitudinal vibrators can be moved by adjusting the expansion and contraction timing of the flexural vibrator and the longitudinal vibrators. Therefore, the moving direction can be adjusted by changing the timing, and the driving force can be adjusted by voltage control. Besides, this control is easy, and the flexural vibrator is driven in a resonant state, while the longitudinal vibrators are driven in a non-resonant state, so it is not necessary to make the resonance frequency of the flexural vibrator and that of the longitudinal vibrators coincident with each other. Therefore, the manufacture is easy. Moreover, since a vibration member can be constituted by only a flexural vibrator and thin, longitudinal vibrators, it is possible to obtain a motor which is very small in both size and thickness.

Further, the width of the mounting base portion of each longitudinal vibrator in the wavelength direction of flexural vibration in the ultrasonic motor is set to a value not larger than one-third the wavelength of the flexural vibrator, so even when the shape of the flexural vibrator or the vibration mode used is determined mainly on the basis of the function of the motor as an actuator, operation is ensured at a high efficiency and with a stable driving force if only the above width is satisfied.

Therefore, it is possible to eliminate the conventional drawback of this sort that in some particular shape of longitudinal vibrators provided on node lines of a flexural vibrator, the longitudinal vibrators impede the flexural vibration of the flexural vibrator and the motor no longer operates.

According to the present invention, moreover, the flexural vibrator serving as a drive source of the ultrasonic motor can be supported without impeding the vibration thereof, so it is possible to manufacture a high-efficiency motor without impairment of the motor efficiency.

Further, the vibrators can be supported stably and securely by a simple supporting structure; besides, since a vibration absorbing material is disposed in the support portion, the motor can be driven stably thereby. Therefore, unnecessary vibrations are not generated and it is possible to prevent the generation of disagreeable audible sounds.

According to an ultrasonic motor of the present invention, moreover, a plurality of longitudinal vibrators are disposed with an odd number of node(s) of a flexural vibrator between and all of them act on a driven member, so a large driving force is obtained in a reduced size; besides, the operation is stable and the efficiency is high.

Further, the ultrasonic motor of the present invention is most suitable as a drive source for a member requiring a rectilinear operation such as a camera lens. It permits a construction in which a hollow moving frame and a stationary frame are mounted in a minimum space within a lens barrel.

Besides, according to the present invention, it is only the support as a guide member provided between the stationary frame and the moving frame and an ultrasonic vibrator for driving that hold the moving member as a driven members so the energy which is lost directly by the support structure is kept to a minimum. And since the moving frame is driven directly by vibrators, there is attained a very high motor efficiency. Additionally, since the moving frame is always held in a state of pressure contact with the support, the positional accuracy of the moving frame relative to the stationary frame is maintained extremely high.

BRIEF DESCRIPTION OF THE DRAWINGS

FIG. 17 is a side view of a principal portion of a driving member, showing a further modification of the third embodiment illustrated in FIG. 14a;

DETAILED DESCRIPTION OF THE PREFERRED EMBODIMENTS

Figure 1:
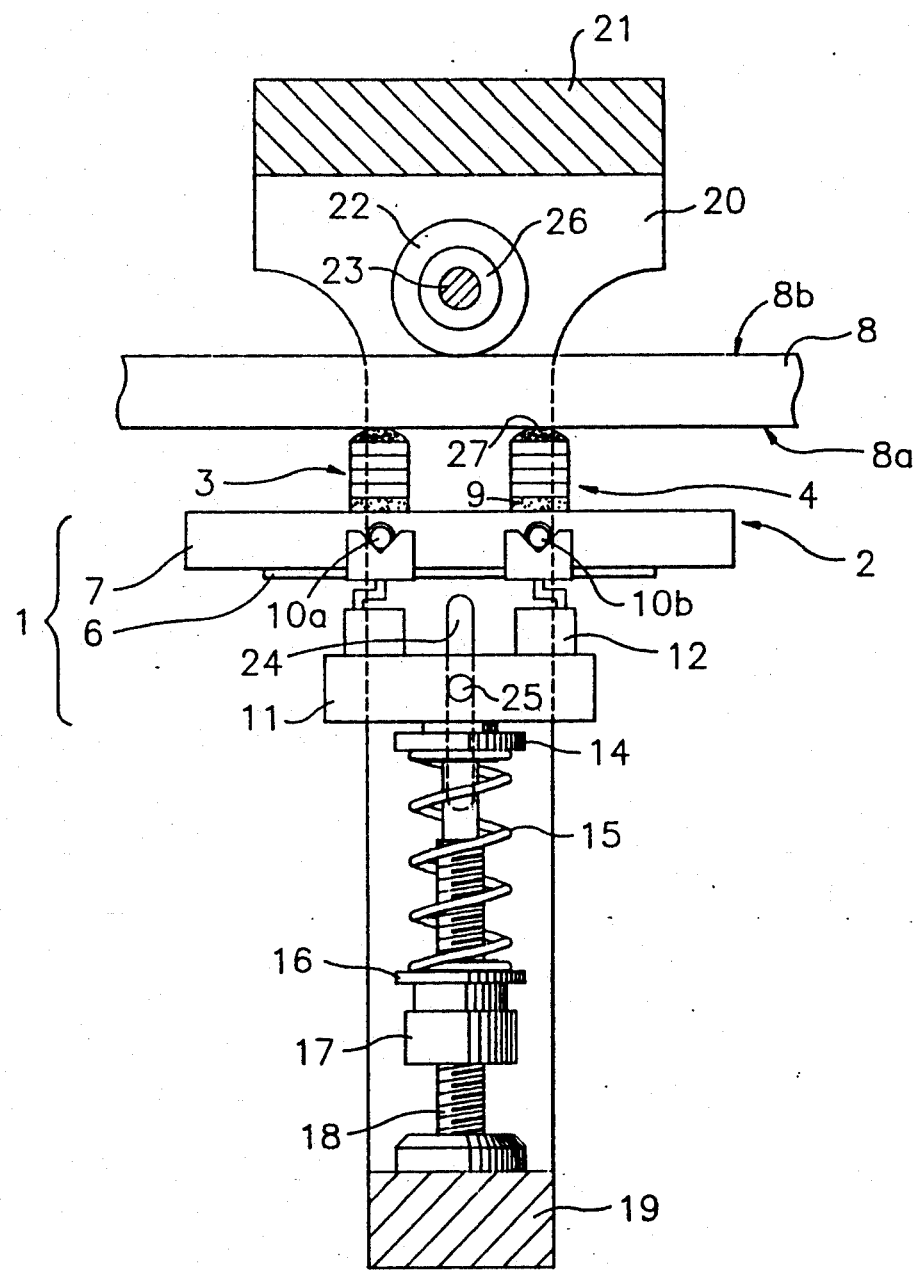
FIG. 1 is a sectional side view of an ultrasonic motor according to a first embodiment of the present invention.

Prior to describing embodiments of the present invention, basic principles of the invention will first be stated, then a longitudinal vibrator formed by the lamination of piezoelectric elements will be described with reference to FIG. 20, and description will also be made about the structure, operation and vibrating conditions of a driving member comprising a flexural vibrator and longitudinal vibrators with reference to FIGS. 2 and 3.

Although in the following description of embodiments a piezoelectric element is used as an electromechanical transducing element in the present invention, it goes without saying that there may be used an electrostrictive element in place of such piezoelectric element. As an elastic number there is used a unidirectionally elongated plate- or rod-like elastic member.

Basic principles of the ultrasonic motor of the present invention will now be explained. The ultrasonic motor of the invention comprises a driving member and a driven member, the driving member comprising a flexural vibrator which comprises a rod- or plate-like elastic member having both end portions and one or plural piezoelectric elements fixed to the elastic member to generate a standing wave of thickness flexural vibration, and longitudinal vibrators each consisting of plural piezoelectric elements laminated on node lines of the standing wave excited by the flexural vibrator and utilizing a thickness longitudinal effect at the same height from a neutral axis, the longitudinal vibrators vibrating in an amplitude direction of flexural vibration, and the driven member being in pressure contact with end faces of the longitudinal vibrators. The flexural vibrator and the longitudinal vibrators are driven by AC voltages having a predetermined phase difference to move the driving member and the driven member relatively to each other. In this ultrasonic motor, the flexural vibrator and the longitudinal vibrators are used in the state of resonance and the state of non-resonance, respectively, so it is not necessary to make the resonance frequency of the flexural vibrator and that of the longitudinal vibrators coincident with each other, and hence the productivity is improved. Moreover, since the flexural vibrator has nodes, it is possible to effect a low-loss support. Further, that the longitudinal vibrators vibrate in a non-resonance state ensures a very stable vibration as compared with the vibration in a resonance state, so it is possible to realize an ultrasonic motor of high efficiency.

Now, the construction and operation of a laminated longitudinal vibrator constituted by a laminate of piezoelectric elements will be described with reference to FIG. 20. In the same figure, if the length of the laminated vibrator with no voltage applied thereto is l (m), the number of piezoelectric elements laminated is n, a piezoelectric distortion constant in the direction of height l is $d_{33}$ (m/V), and an applied voltage is V (v), a displacement of $\Delta l$ (m) when voltage is applied with the piezoelectric elements arranged electrically in parallel and laminated n layers, is generally expressed by the following relationship:

$$\Delta l = n\, d_{33} V \ldots \quad (3)$$

The equation (3) can be transformed into the following:

$$n = \frac{\Delta l}{d_{33} V}$$

Then, if as the piezoelectric distortion constant $d_{33}$ a standard value of the piezoelectric element material used in a laminate actuator, $d_{33} = 635 \times 10^{-12}$ m/V, and 100 V as the voltage applied to the laminated longitudinal vibrator, are substituted into the above equation (3a), the number n of laminated piezoelectric elements required to obtain a displacement of 1 μm is as follows:

$$n = \frac{1 \times 10^{-6}}{635 \times 10^{-12} \times (-100)}$$
$$= 15.7$$

That is, a displacement of 1 μm can be obtained by using sixteen piezoelectric elements.

For example, in the case of using sixteen piezoelectric elements each 0.12 mm in thickness:

$$16 \times 0.12 = 1.92 \text{ (mm)}$$

Therefore, a displacement of 1 μm is obtained by applying 100 V to a laminated longitudinal vibrator having a height of about 2 mm. Thus, by using piezoelectric elements in a laminated form as a longitudinal vibrator it is possible to realize an ultrasonic motor having an external form which is greatly reduced in size and capable of being driven at low voltage.

The structure, operation and vibrating conditions of the driving member used in the ultrasonic motor of the present invention will be described below.

Figure 2A:
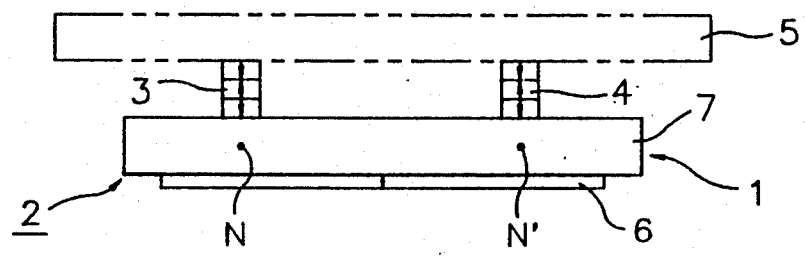
FIGS. 2A and 2B are respectively a side view of a driving member used in the ultrasonic motor and an operation diagram showing a vibrating state.
Figure 2B:
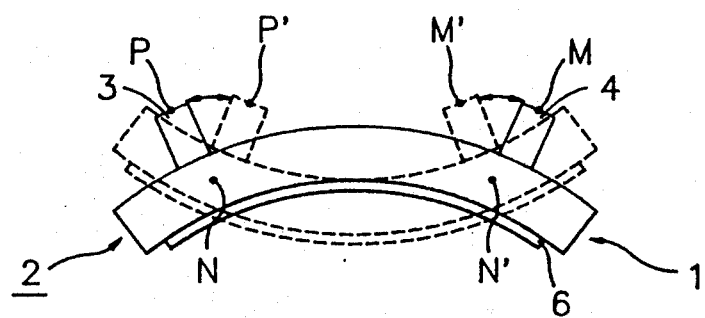

FIGS. 2A and 2B are a front view of a driving member 2 and an operation diagram showing vibrating conditions of the driving member, respectively, the driving member 2 comprising a flexural vibrator 1 including a piezoelectric element 6 and first and second longitudinal vibrators 3, 4. In these figures, it is nodes N, N' that do not undergo any displacement even upon flexural vibration of the flexural vibrator 1, and it is a node line that is drawn in a direction perpendicular to the paper surface through the nodes N or N'. The arrows in the figures represent polarizing directions. Further, the numeral 5 denotes a moving member as a driven member which is brought into pressure contact with the front end faces of the longitudinal vibrators 3 and 4.

The flexural vibrator 1 is composed of a plate-like elastic member 7 and a piezoelectric element 6 bonded to the lower surface of the elastic member 7, the piezoelectric element 6 being polarized in the plate thickness direction. On the node lines of the flexural vibrator 1 there are disposed the first and second longitudinal vibrators 3, 4 so that their polarizing directions are opposed to each other, in a projected state from the surface of the flexural vibrator.

In this structure, upon flexural vibration of the flexural vibrator 1, as shown in FIG. 2B, there occur fine rotational reciprocating motions around the nodes N and N' of the flexural vibration. Consequently, the first and second longitudinal vibrators 3, 4 perform fine rotational reciprocating motions different in rotating direction from each other, that is, both perform rocking motions. The longitudinal vibrators 3 and 4, which are kept in pressure contact with the moving member 5, are driven so that out of the fine rotational reciprocating motions, either the going motion or the returning motion is exerted on the moving member 5 to drive the moving member in one direction in a relative manner.

Figure 3:
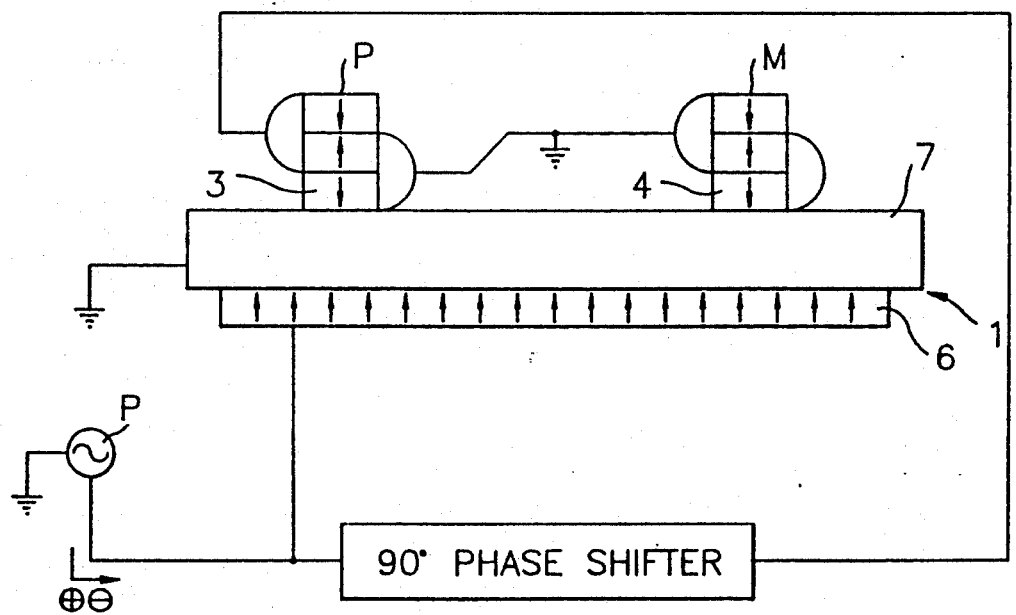
FIG. 3 is a diagram showing an example of a wiring method in the application of AC voltage to a piezoelectric element and longitudinal vibrators illustrated in FIG. 2A, and also showing polarizing directions.

Referring now to FIG. 3, there are shown polarizing directions of the piezoelectric element 6 and the longitudinal vibrators 3, 4, as well as the method of lamination and of wiring. In FIG. 3, if the AC voltage applied to an electrode on the lower side of the piezoelectric element 6 is positive, the flexural vibrator 1 is convex upwards, while if such AC voltage is negative, the flexural vibrator 1 is convex downwards. If the AC voltages applied to the longitudinal vibrators 3 and 4 are positive, the first longitudinal vibrator 3 assumes an expanded state, while the second longitudinal vibrator 4 assumes a contracted state. Further, if the AC voltages applied to the longitudinal vibrators 3 and 4 are negative, the first longitudinal vibrator 3 assumes a contracted state, while the second longitudinal vibrator 4 assumes an expanded state. The arrows in the figure represent polarizing directions.

The operation will now be described with reference to FIG. 2B. The flexural vibrator 1 and the longitudinal vibrators 3, 4 are driven by 90° phase-shifted AC voltages, so in the position of node N of the flexural vibrator 1 in which the first longitudinal vibrator 3 is disposed, there occurs a slight counterclockwise rotation P'→P of a front end P of the first longitudinal vibrator 3 about the node N, in synchronism with the expansion of the first longitudinal vibrator 3 and the resulting pressure contact thereof with the moving member 5 and the contraction of the second longitudinal vibrator 4 and the resulting disengagement thereof from the moving member 5. Consequently, the first longitudinal vibrator 3 acts to kick up the moving body 5 from the right to the left, imparting a horizontal moving force to the moving member 5. At this time, in the position of node N' of the flexural vibrator 1 in which the second longitudinal vibrator 4 is disposed, there occurs slight clockwise rotation M'→M about the node N', but a force acting in the opposite direction is not imparted to the moving member 5 because the second longitudinal vibrator 4 is contracted and is thus out of contact with the moving member 5.

In synchronism with the contraction of the first longitudinal vibrator 3 and the resulting disengagement thereof from the moving member 5 and the expansion of the second longitudinal vibrator 4 and the resulting pressure contact thereof with the moving member 5, there occurs, in the position of node N' of the flexural vibrator 1 in which the second vibrator 4 is disposed, a slight counterclockwise rotation M→M' about the node N', so that the second longitudinal vibrator 4 acts to kick up the moving member 5 from the right to the left, imparting a horizontal moving force to the moving member 5. At this time, in the position of node N of the flexural vibrator 1 in which the first longitudinal vibrator 3 is disposed, there occurs a slight clockwise rotation P→P' about the node N, but a force acting in the opposite direction is not imparted to the moving member 5 because the first longitudinal vibrator 3 is contracted and out of contact with the moving member 5. Therefore, the repetition of this operation causes the moving member 5 to move in the same horizontal direction.

The moving member 5 can be moved in the opposite direction by reversing the expansion/contraction timing of the first and second longitudinal vibrators 3, 4 with respect to the flexural vibrator 1. More specifically, by a 180° phase shift of the signal applied to the flexural vibrator 1 or the first and second longitudinal vibrators 3, 4 with respect to the above case, the moving member 5 can be driven in the direction opposite to the above example given.

The structure, operation and vibrating conditions of the driving member used in the ultrasonic motor of the present invention are as described above. Now, concrete embodiments of the present invention will be described below with reference to the accompanying drawings.

Figure 4:
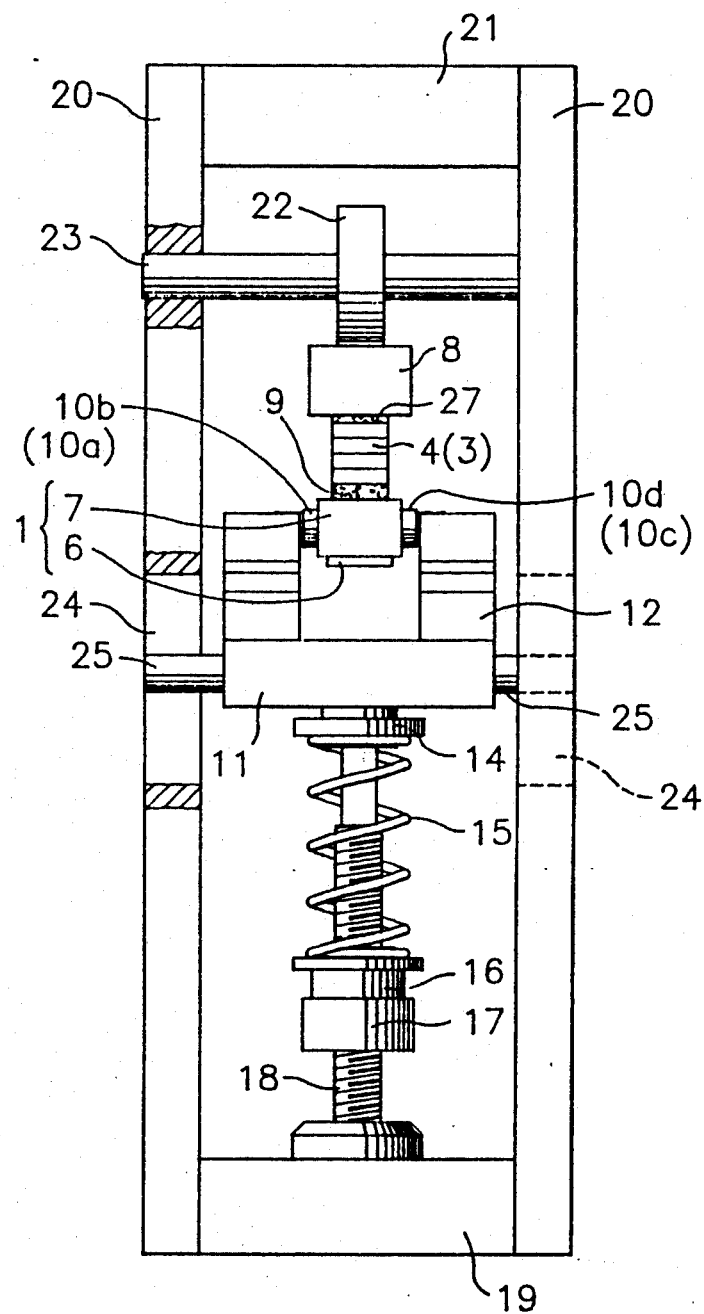
FIGS. 4 and 5 are a front view and a perspective view, respectively, of the ultrasonic motor shown in FIG. 1.
Figure 5:
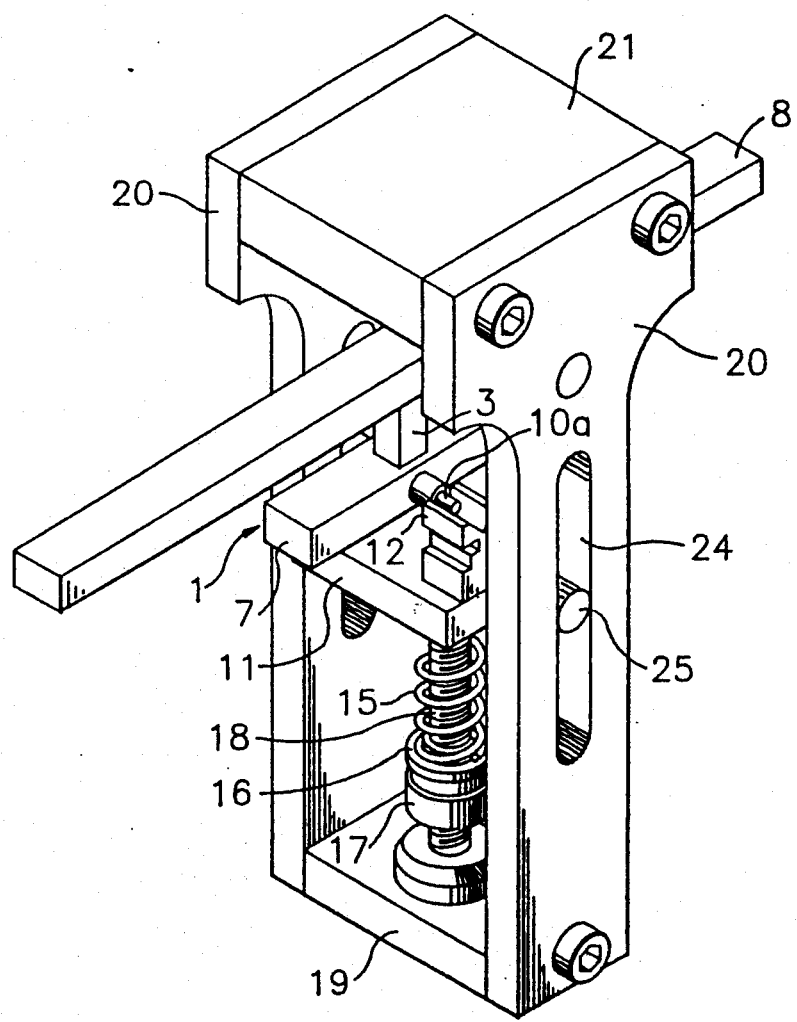
Figure 6:
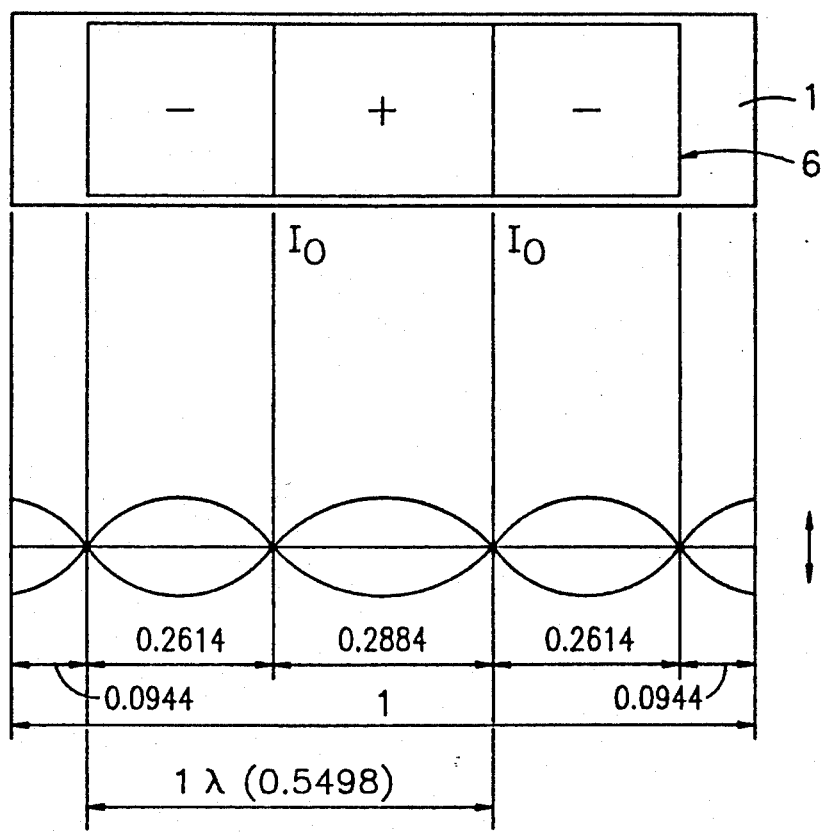
FIG. 6 is a diagram showing a flexural vibration state of third order excited in the flexural vibrator illustrated in FIG. 1.

FIGS. 1, 4 and 5 are a sectional side view, a front view and a perspective view, respectively, of an ultrasonic motor according to a first embodiment of the present invention.: FIG. 6 is a diagram showing the state of third-order vibration excited by a flexural vibrator used in this first embodiment. In the above description of to FIG. 3 the flexural vibrator and the longitudinal vibrators are fixed while the moving member as a driven member is moved, but in this first embodiment a linear rail corresponding to the above driven member is fixed while a driving member comprising a flexural vibrator and longitudinal vibrators is moved.

In the figures, a flexural vibrator 1 comprises an elastic member 7 formed of, for example, stainless steel, brass, phosphor bronze, or aluminum, and a piezoelectric element 6 bonded integrally to the lower surface of the elastic member 7 at the ratio shown in FIG. 6. In the presence of the piezoelectric element 6 disposed in such a fashion a flexural vibration of third order free at both ends can be excited most efficiently, and in this case there are formed vibration nodes in such positions as shown in FIG. 6. In the case where the length in the longitudinal direction of the elastic member 7, including the node positions of the flexural vibrator 1, is assumed to be 1, first and second longitudinal vibrators 3, 4 each comprising a plurality of laminated piezoelectric elements polarized in the thickness direction, in positions corresponding to the ratio of (0.0944+0.2614)/1 from both longitudinal side faces. End faces of the longitudinal vibrators 3 and 4 are in pressure contact perpendicularly with a sliding surface 8a of a linear rail 8. The first and second longitudinal vibrators 3, 4 have the same polarization structure.

In this embodiment, an insulating layer 9 is provided on the lower surfaces of the first and second longitudinal vibrators 3, 4, namely, the surfaces thereof bonded to the flexural vibrator 1. The insulating layer 9 is required when the upper surfaces of the first and second longitudinal vibrators 3, 4 of laminated piezoelectric elements contacted with the linear rail sliding surface 8a serve as positive electrodes. In the case where the contact portions to the sliding surface 8a are negative electrodes, the linear rail 8 may be connected to ground, and in this case the insulating layer 9 is not necessary. If a friction material 27 having insulating property and abrasion resistance such as, for example, a high polymer, a ceramic material, or a composite material, is stuck on the upper surfaces of the longitudinal vibrators 3 and 4, i.e., the contact surfaces thereof with the sliding surface 8a of the linear rail 8, it is possible to prevent the voltage applied to the longitudinal vibrators 3 and 4 from leaking to the linear rail 8, and the motor can be made durable.

In this embodiment the friction material 27 has a half-cylindrical front end. As shown in FIG. 2B, upon flexural vibration of the flexural vibrator 1, there occurs a slight rotational reciprocating motion about each node, so that the front ends of the longitudinal vibrators 3 and 4 describe a circular arc. If the front end of the friction material 27, or the contact surface thereof with the linear rail 8, is square, the portion of contact with the linear rail 8 changes like edge→plane→edge, so the state of contact becomes unstable and there occurs unevenness in the relative moving speed of the linear rail 8. In view of this point, if the front end of the friction material 27, i.e., the surface of contact thereof with the linear rail 8, is made half-cylindrical, there is ensured a stable contact between the front end of the friction material 27 and the linear rail 8. For example, as shown in FIG. 2B, it is desirable that the radius of curvature, R, of the surface of the half-cylindrical portion of the friction material 27 be made equal to the length, P'N (or M'N) from the front end P' (or M') of the friction material to the node N which is related to the total height of the longitudinal vibrators 3, 4 and the friction material 27.

In the presence of the friction material 27, moreover, by adjusting the thickness of the friction material 27 or by polishing the friction material after integral forming of the piezoelectric element and the friction material, it is possible to attain the best contact of the longitudinal vibrators 3, 4 with the linear rail sliding surface 8a of the linear rail 8.

Figure 7A:
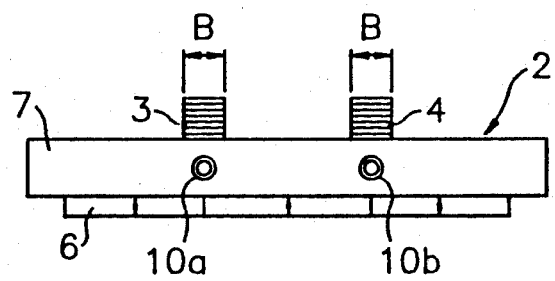
FIGS. 7A and 7B are a side view and a front view, respectively, of the driving member illustrated in FIG. 1.
Figure 7B:
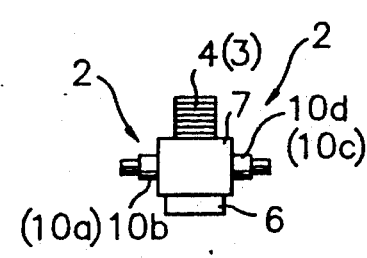

In the node positions of the flexural vibrator 1, four support pins 10a, 10b, 10c and 10d serving as support portions for the flexural vibrator are mounted to both side faces in the width direction of the elastic member. FIGS. 7A and 7B are a side view and a front view, respectively, of a driving member 2. The driving member 2 is composed of the elastic member 7, piezoelectric element 6, first and second longitudinal vibrators 3, 4 and four support pins 10a, 10b, 10c, 10d. The arrows in the figures represent polarizing directions.

The four support pins 10a, 10b, 10c, 10d projecting from the side faces of the elastic member 7 as a constituent of the driving member 2 are each formed by a short cylinder so as not to obstruct the slight rotational reciprocating motion of each node induced by flexural vibration, and are supported by support bases 12 fixed to a support base mounting plate 11. The upper surfaces of the support bases 12, which serve as contact portions with the support pins 10a, 10b, 10c and 10d, are each in the form of a V-shaped groove so as not to obstruct the flexural vibration of the flexural vibrator, like the support pins, and because it is necessary to obtain proper positioning. The support bases 12 each have a crank-shaped thin-walled portion to prevent unnecessary vibrations induced in the driving member 2 from leaking to the support base mounting plate 11. Further, in order to prevent the driving member 2 from shifting in the direction perpendicular to the vibrating direction of the flexural vibrator 1, the short cylindrical portions of the support pins 10a, 10b, 10c and 10d are formed with a difference in diameter, so that when the driving member tries to shift, the support pins come into abutment with the support bases 12.

In a central part of the support base mounting plate 11 there is formed a hole for passing therethrough a front end portion of a supporting bolt 18. A pressure adjusting spring 15 which is guided by upper and lower spring retainers 14, 16, as well as a spring pressure adjusting nut 17, are fitted on the bolt 18, and an upper front end portion of the bolt 18 is fitted into the central hole of the support base mounting plate 11. Since the spring pressure adjusting nut 17 is engaged with a threaded portion of the bolt 18, the pressure adjusting spring 15 can be moved and adjusted upwards in the figure by turning the nut 17. Consequently, the support base mounting plate 11 moves upwards and end portions of the longitudinal vibrators 3 and 4 mounted to the moving member are brought into pressure contact with the sliding surface 8a of the linear rail 8.

A bottom plate 19 is centrally threaded and a lower end portion of the bolt 18 is threadedly engaged with the bottom plate 19. The lower portion of the bolt 18 is in the shape of a disc, and the lower surface of the disc is in contact with the upper surface of the bottom plate 19, so the bolt 18 is fixed without looseness. On a sliding surface 8b of the linear rail 8 is carried a wheel 22 which is fitted on a shaft 23 and rotatable supported by a bearing 26.

Top and bottom plates 21, 19 are fixed by both right and left side plates 20, 20. These plates 21, 19, 20, 20 are each formed by a rigid body. And the shaft 23 with the wheel 22 fitted thereon is fixed to both side plates 20 in upper central positions of the plates, as shown in FIGS. 1 and 4. In both side faces 20 of the support base mounting plate 11 there are embedded mounting plate guide rods 25 one on the front side and the other on the back side in FIG. 1, the guide rods 25 being guided along slots 24 formed centrally vertically in the walls of the side plates 20, 20 whereby the support base mounting plate 11 is prevented from wobbling when moving vertically at the time of adjusting the pressure of contact of the longitudinal vibrators 3 and 4 with the sliding surface 8a of the linear rail.

In the first embodiment thus constructed, the method for moving the other moving member rather than the linear rail 8 in the right-hand direction as indicated by arrow A in FIG. 1 along the linear rail will be described below with reference to FIGS. 8A-8C and 9A-9H.

Figure 8A:
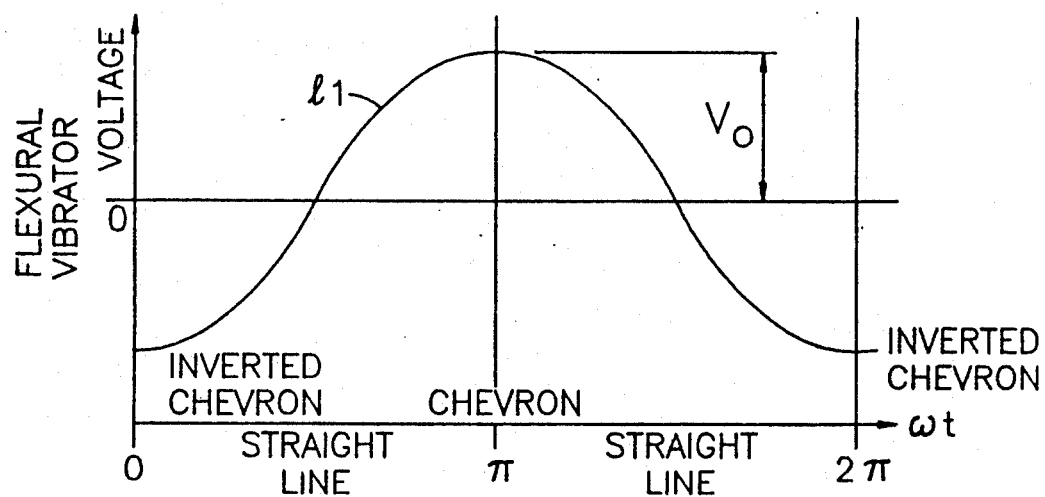
FIGS. 8A and 8C are waveform diagrams showing phases of AC voltages applied respectively to the flexural vibrator and first and second longitudinal vibrators illustrated in FIG. 1.
Figure 8B:
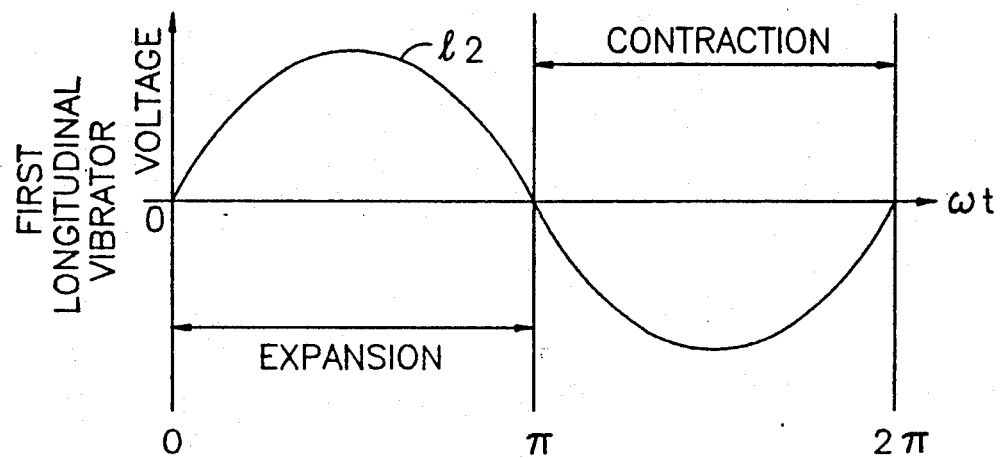
Figure 8C:
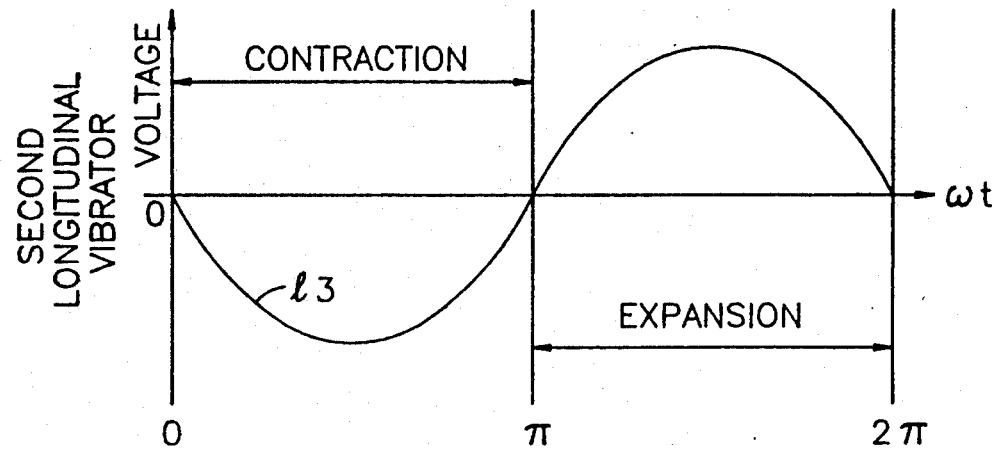
Figure 9A:
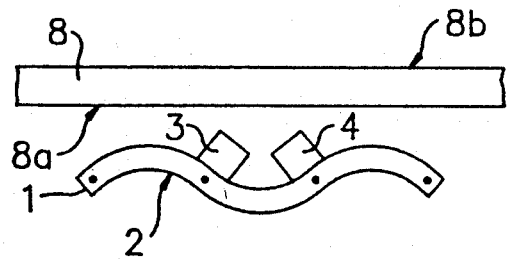
FIGS. 9A to 9H are operation diagrams explaining movements of a vibrating member with respect to a linear rail upon application thereto of the AC voltages shown in FIGS. 8A to 8C.
Figure 9E:
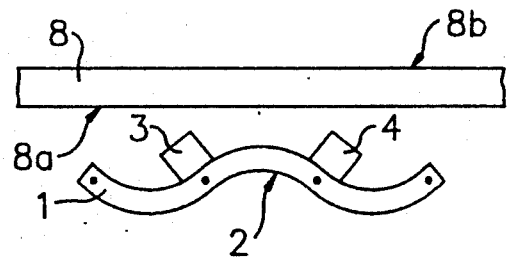
Figure 9B:
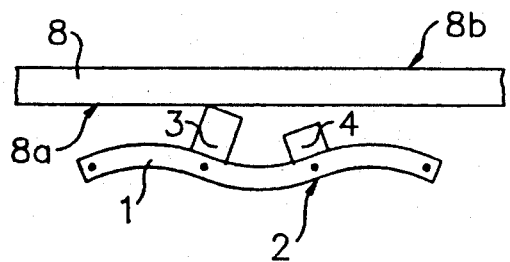
Figure 9F:
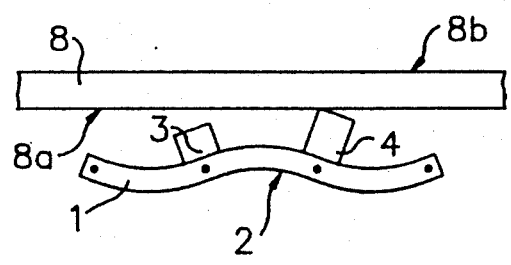
Figure 9C:
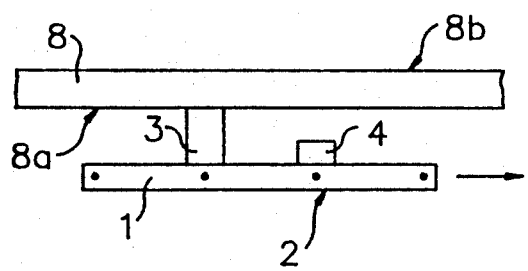
Figure 9G:
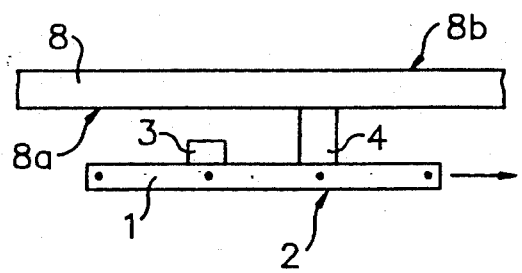
Figure 9D:
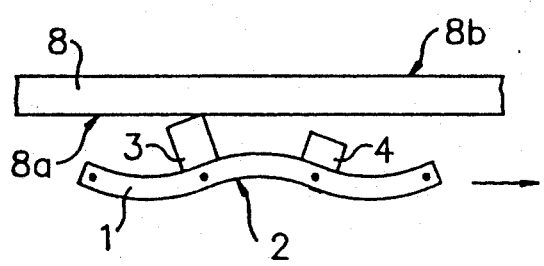
Figure 9H:
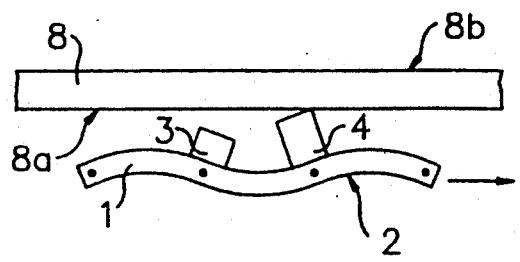

An AC voltage $V_o \sin \Omega t$ of a sinusoidal waveform $l_1$ having an amplitude $V_o$ and an angular frequency w, as shown in FIG. 8A, is applied to the flexural vibrator 1. Also, an AC voltage of a sinusoidal waveform, $l_2$ leading the sinusoidal waveform $l_1$ by a phase angle of 90°, as shown in FIG. 8b, is applied to the first longitudinal vibrator 3. Further, an AC voltage of a sinusoidal waveform $_3$ which is 180° out of phase with the sinusoidal waveform $l_2$ applied to the first longitudinal vibrator 3, is applied to the second longitudinal vibrator 4. Consequently, as shown in FIGS. 9A to 9D, in synchronism with expansion of the first longitudinal vibrator 3 and contraction of the second longitudinal vibrator 4, the flexural vibrator 1 is driven and performs a flexural vibration in which end portions of the longitudinal vibrators change in state from approached to spaced state. As a result, the first longitudinal vibrator 3 comes into pressure contact with the sliding surface 8a, while the second longitudinal vibrator 4 moves away from the same surface. In the driving member 2, therefore, the first longitudinal vibrator 3 kicks up the sliding surface 8a of the linear rail 8 from the right to the left, so that the driving member 2 moves rightwards.

Next, in FIGS. 9E to 9H, in synchronism with contraction of the first longitudinal vibrator 3 and expansion of the second longitudinal vibrator 4, the flexural vibrator 1 is driven and performs a flexural vibration in which the end portions of both longitudinal vibrators change in state from approached to spaced state, whereupon the sliding surface 8a and the second longitudinal vibrator 4 come into pressure contact with each other, while the first longitudinal vibrator 3 leaves the same surface. In the driving member 2, therefore, the second longitudinal vibrator 4 kicks up the sliding surface 8a from the right to the left, so that the driving member 2 moves rightwards.

As the above operations are repeated continuously, the driving member 2 moves with the flexural vibration of the flexural vibrator 1. At the same time, the moving member integral with the top and bottom plates 19, 21 travels rightwards while rotating the wheel 22 on the sliding surface 8b of the linear rail 8. The other moving member other than the linear rail can be moved leftwards by reversing the expansion/contraction timing of the longitudinal vibrators 3 and 4 with respect to the flexural vibrator. More specifically, by shifting the phase of the signal applied to the flexural vibrator 1 or the longitudinal vibrators 3, 4 180° with respect to the above case, the other moving member other than the linear rail in FIG. 1 can be driven in the direction opposite to the arrow A.

Figure 10A:
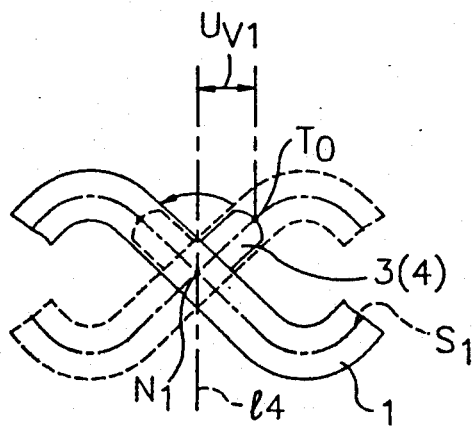
FIGS. 10A and 10B are operation diagrams showing operations of the driving member when the vibration amplitude of the longitudinal vibrators in the first embodiment is zero and there occurs only a flexural vibration of the flexural vibrator.
Figure 10B:
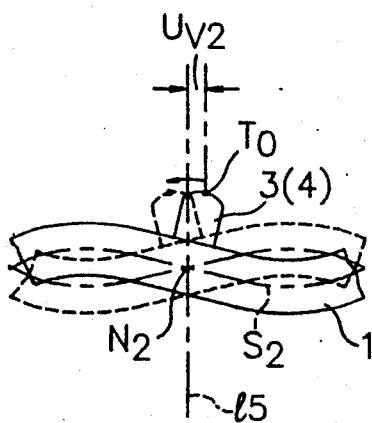
Figure 10C:
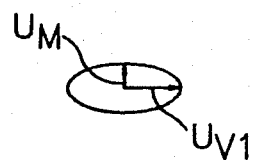
FIGS. 10C and 10D are diagrams showing a front end path of a longitudinal vibrator, FIGS. 10A and 10C showing the case where the flexural vibration amplitude is large, and FIGS. 10B and 10D showing the case where the flexural vibration amplitude is small.
Figure 10D:
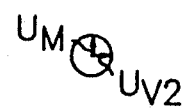

The moving speed of the driving member and the driving force for the same member in this first embodiment are related to the ratio of the flexural vibration amplitude of the flexural vibrators 1 and the vibration amplitude of the longitudinal vibrators 3, 4, so this point will now be explained with reference to FIGS. 10A to 10D. FIGS. 10A and 10B are operation diagrams showing the operation of the driving member when the vibration amplitude of the longitudinal vibrators is zero and there occurs only the flexural vibration of the flexural vibrator. FIGS. 10C and 10D are diagrams showing moving paths of the front ends To (see FIGS. 10A and 10B) of the longitudinal vibrators 3 and 4 in the case where the flexural vibration amplitude of the flexural vibrator 1 and the vibration amplitude of the longitudinal vibrators 3, 4 are combined together. FIGS. 10A and 10C show the case where the vibration amplitude of the flexural vibrator 1 is large, while FIGS. 10B and 10D show the case where the said vibration amplitude is small. In FIGS. 10C and 10D, the longitudinal vibrators 3 and 4 are the same in vibration amplitude $U_M$. This can be realized by keeping constant the amplitude of the voltage applied to the longitudinal vibrators 3 and 4. In this case, it is necessary that the amplitude of the longitudinal vibrators be of a value not lower than the surface accuracy of the contact surface thereof with the driven member (linear rail 8). Practically, an amplitude of not smaller than 0.1 μm is required. The forces generated by the longitudinal vibrators 3 and 4 are proportional to the voltages applied thereto, and it is necessary to obtain a value sufficient to generate a required amplitude of not smaller than 0.1 μm mentioned above against the force of pressure contact with the driven member (linear rail 8). The force of pressure contact with the linear rail 8 is proportional to the driving force of the motor. The driving force can be increased by enlarging the pressure contact force and increasing the voltages applied to the longitudinal vibration.

The moving speed is proportional to horizontal components $U_{V1}$ and $U_{V2}$ generated by the flexural vibration of the flexural vibrator 1 in FIGS. 10A to 10D, and this is in proportion of the voltage applied to the piezoelectric element integral with the flexural vibrator 1. That is, in the case where only the longitudinal vibrators 3 and 4 are driven and the flexural vibrator 1 not driven, the moving speed is zero and the driven member does not move, and hence the moving member does not move. If in this state the amplitude of the flexural vibrator 1 is increased, the moving speed increases in proportion thereto. The amplitude of the flexural vibrator 1 can be changed by changing the above applied voltage, or by changing the driving frequency of the flexural vibrator 1 from a resonance point, or by making a high frequency voltage applied to the flexural vibrator intermittent as a burst signal. By using any of these methods, the speed can be changed steplessly from speed zero up to a maximum speed at which slipping does not occur between the contact surfaces of the longitudinal vibrators and the driven member (linear rail 8).

In this embodiment it is desirable that the width of each of the longitudinal vibrators 3 and 4 along the longitudinal direction of the flexural vibrator 1 at the bonded portions of the longitudinal vibrators 3, 4 to the flexural vibrator 1 be as small as possible. This is because there occurs flexural vibration in the flexural vibrator 1 and so enlarging the width of the longitudinal vibrators 3, 4 would obstruct the said flexural vibration. On the other hand, if the width of the longitudinal vibrators 3 and 4 is made too small, the bonding force thereof to the flexural vibrator 1 weakens, so the flexural vibration of the flexural vibrator 1 may cause breakage of the bonded portions of the longitudinal vibrators 3, 4 to the flexural vibrator 1 or breakage of the longitudinal vibrators. In this embodiment, however, since laminates are used as the longitudinal vibrators, it is possible to make the height of the longitudinal vibrators sufficiently small and hence there is no fear of breakage of the longitudinal vibrators.

The longitudinal vibrators 3 and 4 used in this first embodiment are, for example, 1.5 mm wide, 7.4 mm long and 2 mm high. In these longitudinal vibrators, a resonance frequency in the longitudinal direction and that in the vertical direction exist in the vicinities of about 200 KHz and about 700 KHz, respectively. Further, a resonance frequency of the flexural vibration of the flexural vibrator exists in the vicinity of 40 KHz, which is not larger than one third of the resonance frequency in the longitudinal direction of the longitudinal vibrators, so the longitudinal vibrators are not influenced by the flexural vibration during resonance of the flexural vibrator.

Figure 20:
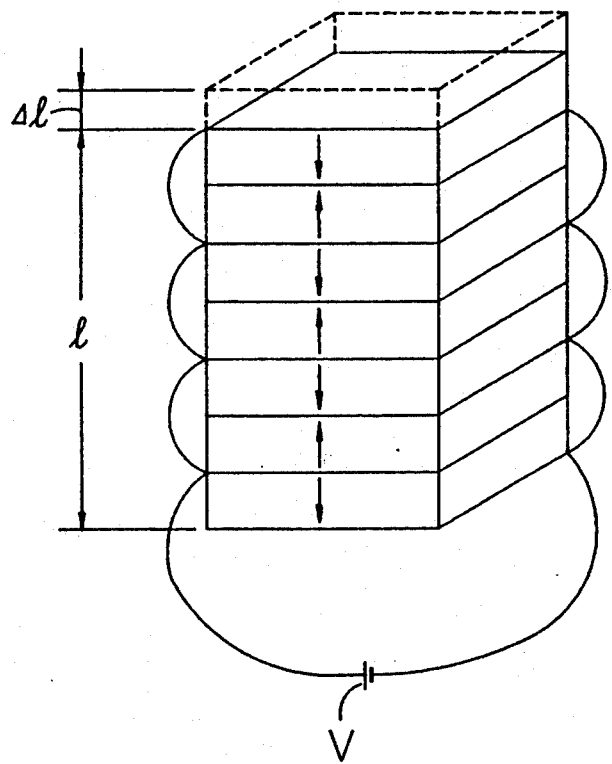

In the case of the longitudinal vibrators used in this embodiment, as mentioned in detail in connection with FIG. 20, a displacement of 1 μm can be obtained by applying 100 V to a laminate of about 2 mm constituted by sixteen plate-like piezoelectric elements each 0.12 mm in thickness. Thus, there can be obtained an ultrasonic motor very small in size and capable of being driven at low voltage.

Further, the longitudinal vibrators 3, 4 and the support portions are disposed at points with little displacement in the flexural vibration of the flexural vibrator, namely, within the planes of nodes $N_1$ and $N_2$ perpendicular to neutral surfaces $S_1$ and $S_2$ of the flexural vibrator 1 in FIGS. 10A and 10B, whereby the leakage of the flexural vibration in the flexural vibrator 1 is minimized, and therefore the flexural vibration can be best excited.

Besides, the support portions are disposed so that a pressure contact force is exerted in the same direction as the longitudinal vibration direction of the longitudinal vibrators 3 and 4 on the node planes. During the flexural vibration of the flexural vibrator 1, the neutral surfaces of the flexural vibrator vibrates vertically at right and left portions thereof on the paper surface about the nodes. Therefore, if the support portions are provided in other positions than the node positions in the flexural vibration, they will obstruct the flexural vibration of the flexural vibrator, with the result that the state of vibration becomes unstable and hence the motor efficiency is deteriorated. Moreover, since the longitudinal vibration direction of the longitudinal vibrators 3 and 4 is substantially coincident with the direction and position of the supporting force of the support portions, the pressure contact force induced by the longitudinal vibration is transferred effectively to the driven member (linear rail 8) and so a stable motor of high efficiency can be realized.

The ultrasonic motor of the first embodiment described above is, for example, a self-travelling type motor constructed so that the linear rail 8 is fixed and the moving member including the driving member 2 comprising the flexural vibrator 1 and the longitudinal vibrators 3, 4 is allowed to travel along the linear rail 8. Now, a modification of the first embodiment in which modification the said moving member is fixed and the linear rail 8 is moved, will be described below with reference to FIGS. 11A and 11B.

Figure 11A:
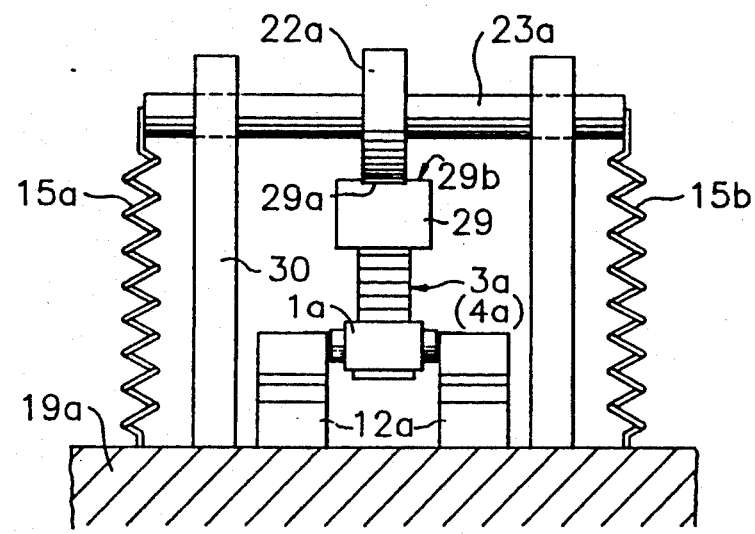
FIGS. 11A and 11B are a front view and a side view, respectively, of a modification of the first embodiment in which the driving member is fixed and the linear rail moves.
Figure 11B:
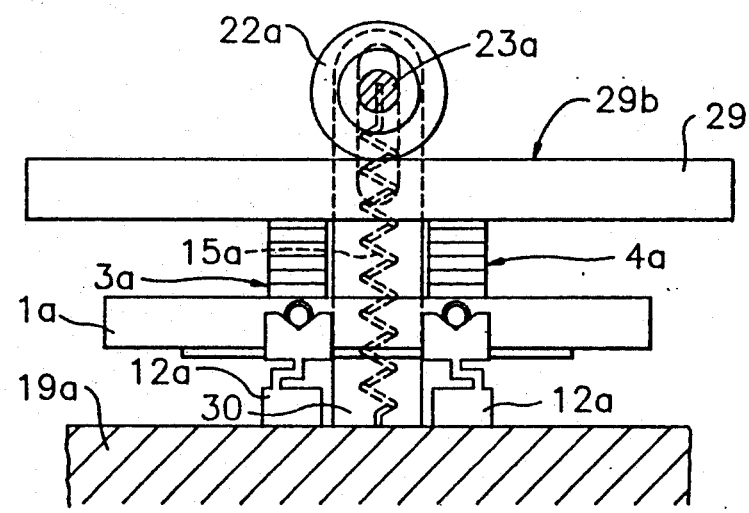

FIGS. 11A and 11B are a front view and a side view, respectively, of this modification. In these figures, a driving member comprising a flexural vibrator 1a and longitudinal vibrators 3a, 4a is mounted on a pair of support bases 12a fixed to a bottom plate 19a, the longitudinal vibrators 3a and 4a of the driving member being in contact with part of the lower surface of a moving member 29 as a driven member. Above these components there are mounted a support shaft 23a and a wheel 22a mounted thereon, the support shaft 23a being pulled downwards by pressure adjusting springs 15a and 15b. The wheel 22a can be rotated in contact with the moving member 29. The support shaft 23a for the wheel 22a and the pressure adjusting springs 15a, 15b are incorporated in a frame 30 of a structure which permits vertical movements of the wheel, the frame 30 being mounted to the bottom plate 19a. The pressure of contact between the moving member 29 and the driving member is adjusted by the pressure adjusting springs 15a and 15b. In this driving member, when AC voltages of the same phase difference as in the first embodiment are applied to the flexural vibrator 1a and the longitudinal vibrators 3a, 4a, only the moving member 29 moves linearly. In this modification, moreover, a groove 29a which is a little wider than the width of the wheel 22a is formed in a sliding surface 29b of the moving member 29 to prevent the wheel 22a from being disengaged in the width direction of the linear rail.

Figure 12A:
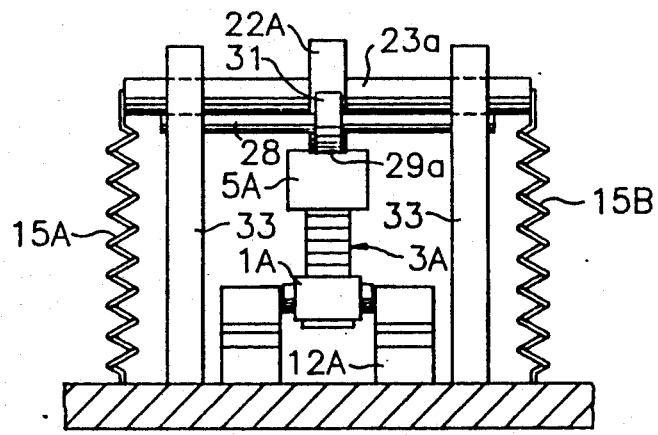
FIGS. 12A and 12B are a front view and a side view, respectively, of an ultrasonic motor according to a second embodiment of the present invention, FIG. and 12C is an operation diagram of a vibrating state in the second embodiment.
Figure 12B:
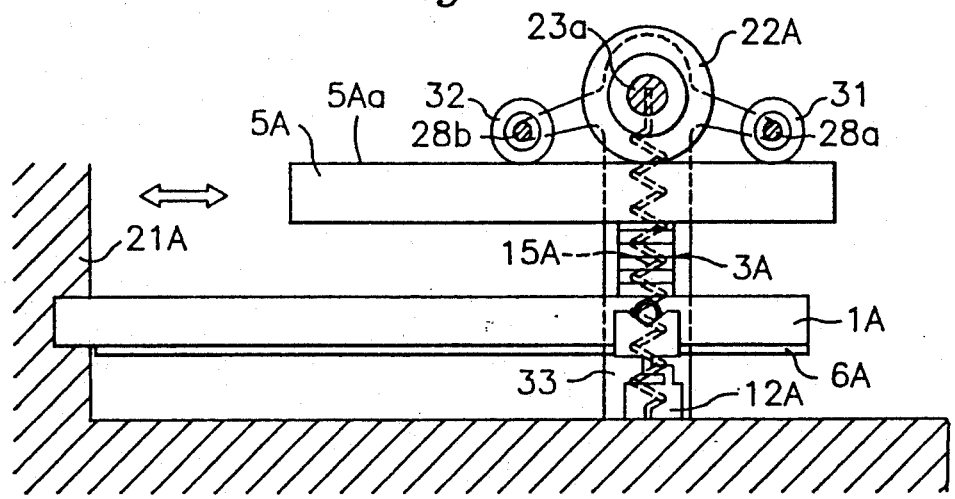

FIGS. 12A and 12B are a front view and a side view, respectively, of an ultrasonic motor according to a second embodiment of the present invention, in which there is used only one longitudinal vibrator. In the first embodiment there was used a flexural vibration mode of third order with both ends free having two nodes, while in this second embodiment there is used a flexural vibration mode of second order with one end clamped and having one node. This is a different point.

Figure 12C:
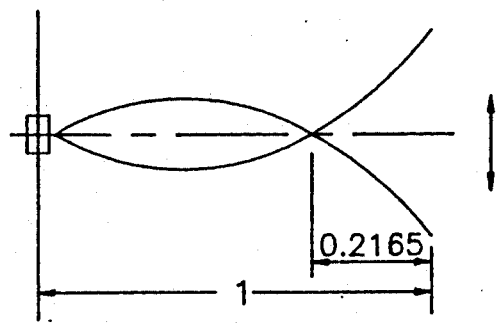

As a vibration mode, a flexural resonance mode with one side clamped completely is here considered, as shown in FIG. 12C. A flexural vibration node of this plate is present in a position of 0.2165 from the front end of the plate, assuming that the overall length is equal to 1. In this embodiment, therefore, one end of a flexural vibrator 1A is fixed to a side plate 21A so as to be clamped completely, and a longitudinal vibrator 3A is disposed in a node position corresponding to the ratio of (0.2165/1) from the front end of the flexural vibrator 1A. In the node position where the longitudinal vibrator 3A is disposed, like the above first embodiment, there are disposed support bases 12A, a moving member 5A as a driven member, pressure adjusting springs 15A, 15B, a wheel 22A, and a pair of frames 33. The flexural vibrator 1A and the longitudinal vibrator 3A constitute a driving member. Therefore, if AC voltages of the same phase difference as in the first embodiment are applied to the driving member, only the moving member 5A moves linearly. In order to prevent the moving member 5A from tilting when moved in the horizontal direction, small-sized rotatable wheels 31 and 32 are mounted respectively on two support shafts 28a and 28b which are mounted transversely to the frames 33, the wheels 31 and 32 being pushed against the moving member 5A. Also in this embodiment, like the above first embodiment, a groove 29a is formed in a sliding surface 5Aa of the moving member 5A.

The ultrasonic motor according to the second embodiment of the present invention is as outlined above. Now, an example in which the ultrasonic motors of the first and second embodiments are each applied to a lens barrel of a camera will be described below with reference to FIGS. 13A and 13B.

Figure 13A:
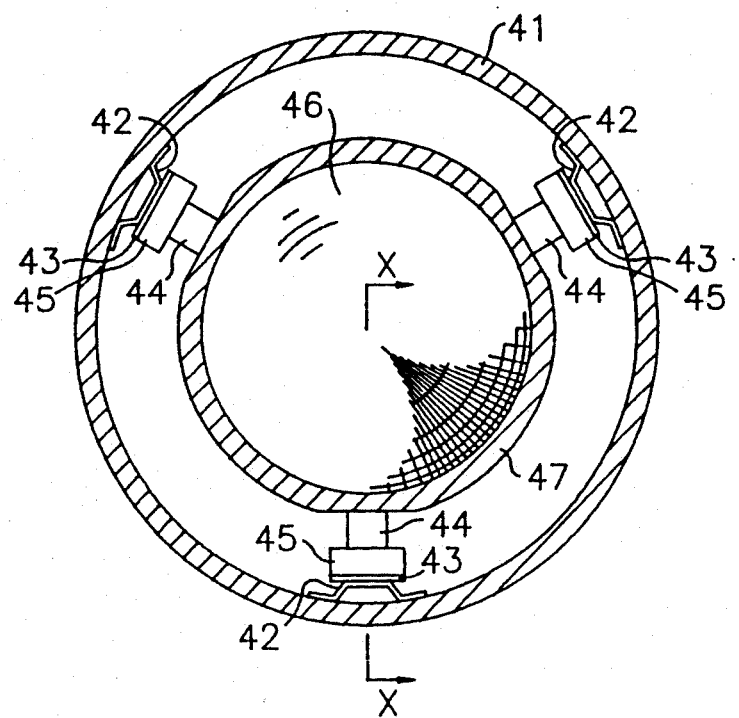
FIGS. 13A and 13B are respectively a sectional view of a lens barrel and a sectional view taken along line X—X in an application example in which the ultrasonic motor of the present invention is applied to the lens barrel of a camera.
Figure 13B:
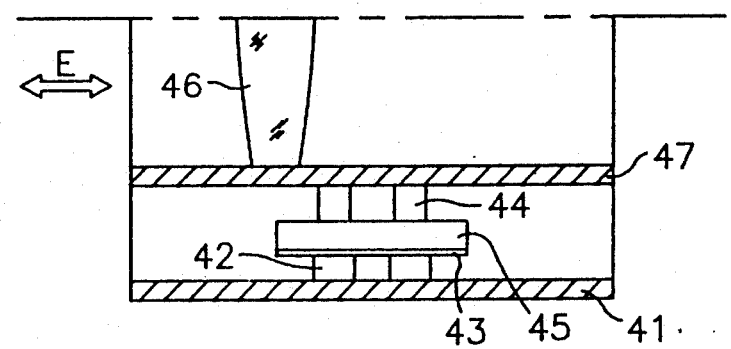

FIGS. 13A and 13B show an application example in which an internal moving member, e.g. a lens supporting frame, disposed within a cylinder such as a lens barrel of a camera is moved using each of the ultrasonic motors described above.

FIG. 13A is a sectional view of a lens barrel, and FIG. 13B is a sectional view taken along line X—X in FIG. 13A. In this application example illustrated in these figures, pressure adjusting plate springs 42 are fixed to the inner surface of an outer wall 41 of the lens barrel. The pressure adjusting plate springs 42 fixedly support a flexural vibrator 45 as a vibration member with a piezoelectric element 43 and longitudinal vibrators 44 secured thereto. The front ends of the longitudinal vibrators 44 secured to the flexural vibrator 45 are pressure-adjusted by the corresponding pressure adjusting springs 42 and thereby kept in contact with an internal moving member 47 which is cylindrical and with a lens 46 fixed in the interior thereof. The portions where the internal moving member 47 as a driven member is in contact with the longitudinal vibrator 44 are each in the form of a plane for efficient transfer of a driving force generated by both the flexural vibrator 45 and the longitudinal vibrators 44. Such plane form prevents the occurrence of unnecessary rotation. As in the foregoing embodiments, by applying voltages of different phases to the flexural vibrator 45 and the longitudinal vibrators 44, the internal moving member 47 with the lens 46 fixed can be moved in parallel with a central axis of the outer wall 41.

Although in this example the internal moving member 47 comprises a cylinder and the lens 46 fixed therein and the lens 46 is selectively moved in one of the directions of double-headed arrow E in FIG. 13B, the internal moving member 47 is not specially limited if only it is cylindrical or columnar, or is mounted within a cylinder.

Although in the foregoing embodiments the support portions of the flexural vibrator and the longitudinal vibrators are on the same node lines of flexural vibration and in the amplitude direction thereof, the support portions of the flexural vibration and the longitudinal vibrators need not always be on the same node lines if only both are on node lines of the flexural vibration and in positions symmetric right and left of the flexural vibrator. In other words, the support portions of the flexural vibrator and the longitudinal vibrators may be disposed on straight lines passing through the same or different nodes of flexural vibration and extending in the amplitude direction of flexural vibration.

An ultrasonic motor according to a third embodiment of the present invention will now be described. The ultrasonic motor of this embodiment is provided with additional mass members, whereby longitudinal vibrators and first-order resonance nodes of flexural vibration of a flexural vibrator are positioned on a central surface in the thickness direction of an elastic member itself. This ultrasonic motor is a highly efficient motor in which flexural vibrations as slight reciprocating vibrations around the nodes are not impeded as far as possible while the motor is driven.

Figure 21:
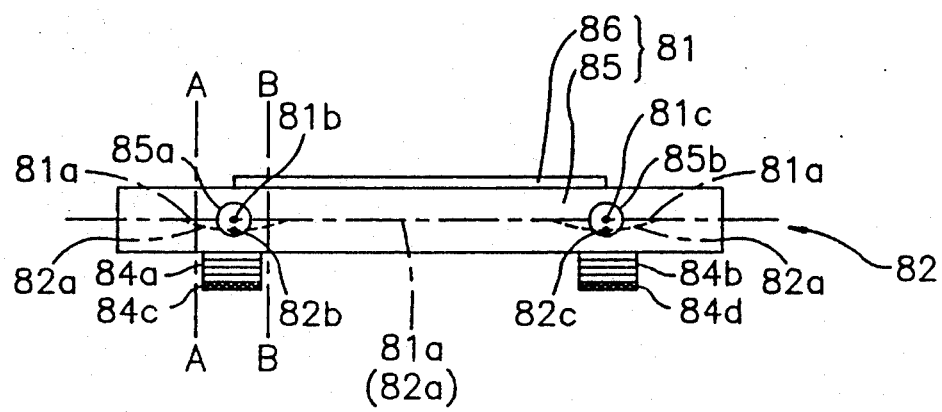
FIG. 21 is a side view of a principal portion of a driving member.

In this ultrasonic motor using a driving member composed of a flexural vibrator and longitudinal vibrators, as shown schematically in FIG. 21, longitudinal vibrators 84a and 84b are attached to one side of a flexural vibrator 81 in such driving member indicated at 82. Therefore, the positions of flexural vibration nodes 82b and 82c in the driving member 82 are slightly displaced from the positions of nodes 81b and 81c of the flexural vibrator 81 itself due to unbalance masses of the longitudinal vibrators. Also, the node positions of the flexural vibrator 82 itself are slightly displaced to the piezoelectric element side, not actually found centrally in the thickness direction of an elastic member, because a piezoelectric element is mounted to only one side of an elastic member 85. The following description is now provided about unbalance masses which cause the difference between the positions of the nodes 82b, 82c and the nodes 81b, 81c of the flexural vibrator 81 itself in the driving member 82 shown in FIG. 21. First, in the driving member 82 of FIG. 21, the range form the A—A plane to the B—B plane is considered, and it is assumed that an equivalent mass on the upper side with the longitudinal vibrator 84a not fixed is $m_1$, the distance from the center of that equivalent mass to a virtual rotational axis is $r_1$, while an equivalent mass on the lower side with the longitudinal vibrator 84a fixed is $m_2$, and the distance from the center of this mass to the said axis is $r_2$ (see FIG. 22) Inertial masses $I_1$ and $I_2$ of rotation on the upper and lower sides, respectively, around the above virtual rotational axis are:

$$I_1 = m_1 \times r_1^2 \quad \ldots (4)$$

$$I_2 = m_2 \times r_2^2 \quad \ldots (5)$$

Assuming that the virtual rotational axis corresponds to the node 81b on a neutral plane 81a of the flexural vibrator 81, as in the prior art, this node is positioned near the central position of the elastic member 85 because the piezoelectric element is light-weight. Therefore, the above distances $r_1$ and $r_2$ have the relation of $r_1 < r_2$. As to the relation of the masses $m_1$ and $m_2$, it is $m_1 < m_2$ because the longitudinal vibrator 84a is added to the mass $m_2$. In accordance with the above equations (4) and (5), the relation of the upper and lower inertial masses $I_1$, $I_2$ of rotation with the node 81b as a rotational axis is $I_1 < I_2$, thus showing an unbalanced state and showing that the node 81b is not a true node of flexural vibration in the driving member 82. In the case where the driving member 82 is flexurally vibrated under the support of support portions 85a and 85b, centered on the node 81b, this flexural vibration is impeded, thus making an efficient drive impossible.

Figure 22:
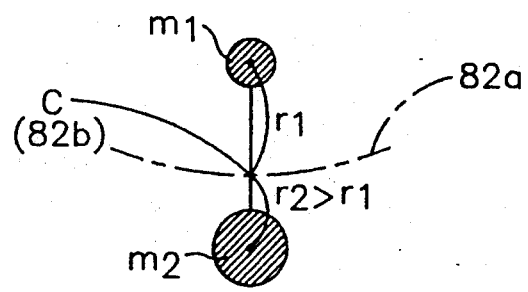
FIG. 22 is a view showing the state of balance of rotational inertial masses of the driving member illustrated in FIG. 21.

If true nodes on the neutral plane 82a for the flexural vibration in the driving member 82 are assumed to be the nodes 82b and 82c (see FIG. 21), a rotational axis C in which the distance $r_1$ from the axis C to the position of the upper-side mass $m_1$ is shorter than the distance $r_2$ from the axis C to the position of the lower-side mass $m_2$ with the longitudinal vibrator added thereto, as shown in FIG. 22, corresponds to the node 82b or 82c. However, it is extremely difficult to determine the position of the node 82b or 82c by calculation for example.

In view of this point, in the driving member used in the ultrasonic motor of this embodiment, additional mass members having a mass corresponding to the mass of the longitudinal vibrators are fixed in positions opposed to the longitudinal vibrators. And in this driving member, the equivalent masses $m_1$, $m_2$ and the distances $r_1$, $r_2$ up to the node have the relations of $m_1 = m_2$ and $r_1 = r_2$, respectively, and the values of the upper and lower inertial masses of rotation around the node mentioned above are well balanced. Consequently, the flexural vibration nodes in the driving member are positioned on the neutral plane of the elastic member. And the driving member is constituted with such nodes as support portions. Under this construction, the driving member can be vibrated efficiently while slight reciprocating vibrations about the flexural vibration nodes are not obstructed.

Figure 14A:
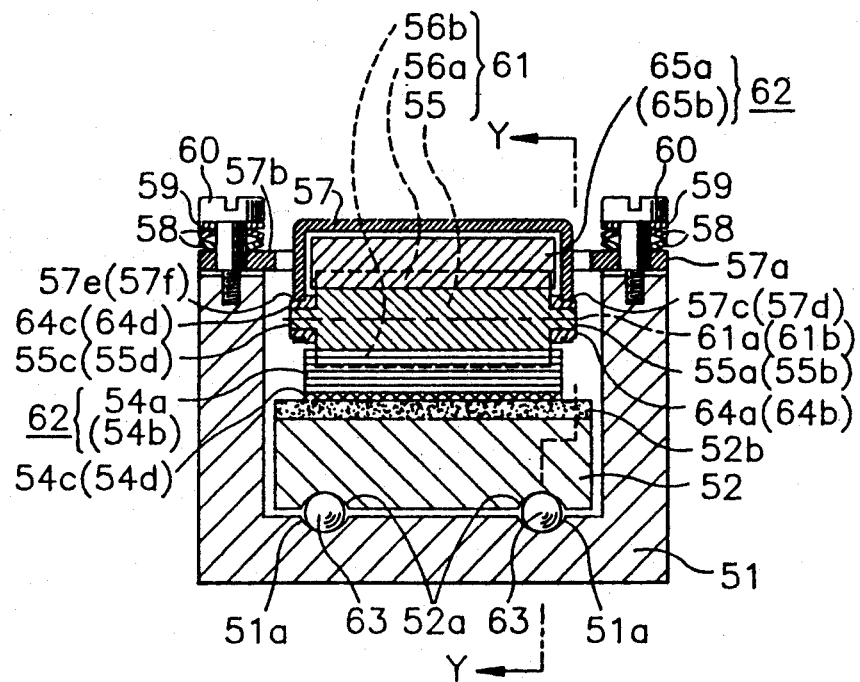
FIG. 14A is a vertical sectional view of a principal portion of an ultrasonic motor according to a third embodiment of the present invention.
Figure 14B:
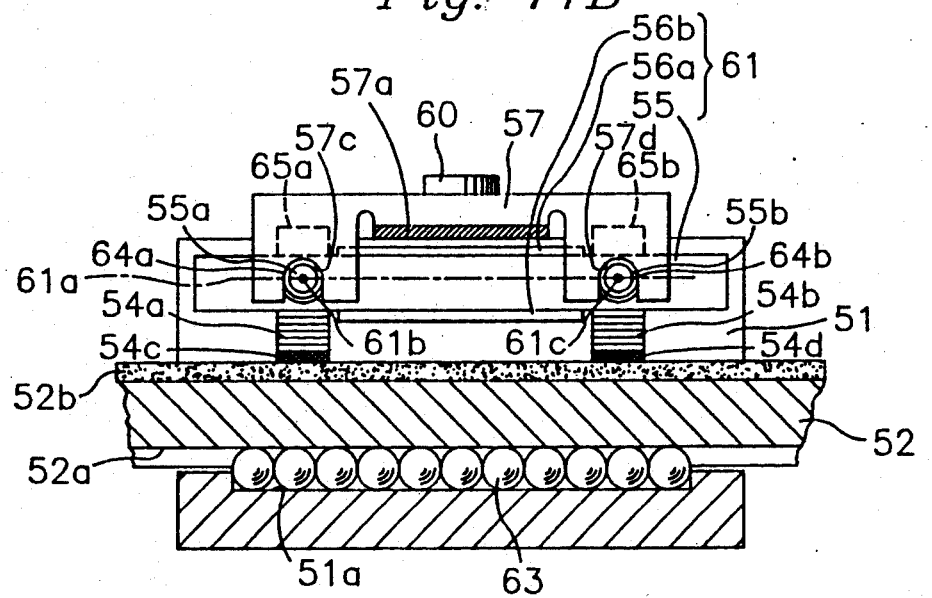
FIG. 14B is a sectional view of the motor taken on line Y—Y in FIG. 14A.

FIG. 14A is a vertical sectional view of a principal portion of the ultrasonic motor of the above third embodiment. The driving member indicated at 62 used in this motor is composed of longitudinal vibrators 54a, 54b, a flexural vibrator 61 and additional mass members 65a, 65b. The flexural vibrator 61 comprises a plate-like elastic member 55 having a rectangular planar shape and a relatively large thickness, and thin plate-like piezoelectric elements 56a and 56b polarized in the plate thickness direction and bonded to the upper and lower surfaces of the elastic member 55. When a high frequency voltage is applied in the polarizing direction of the piezoelectric elements 56a and 56b, the flexural vibrator 61 induces flexural vibration. Further, if a signal of a certain specific frequency is applied, the flexural vibrator will create a flexural standing wave vibration of resonance. The flexural vibrator 61 used in this embodiment is constructed so that a flexural resonant vibration of first order is excited most efficiently.

On the other hand, the longitudinal vibrators 54a and 54b are constituted by laminated piezoelectric elements wider than the flexural vibrator 61 (see FIG. 14A). And they are fixed to the surface of the elastic member 55 of the flexural vibrator 61 on a straight line from the two nodes' positions of the first-order flexural vibration of the flexural vibrator 61 in the amplitude direction of the flexural vibration. The longitudinal vibrators 54a and 54b vibrate in the plate thickness direction of the flexural vibrator 61 upon application of a high frequency voltage thereto. Further, the additional mass members 65a and 65b having the same specific gravity and shape as those of the longitudinal vibrators 54a and 54b are fixed to the surface of the elastic member 55 of the flexural vibrator on the side opposite to the surface of the elastic member to which the longitudinal vibrators are fixed. To the front end faces of the longitudinal vibrators 54a and 54b are fixed sliders 54c and 54d formed using a friction material which resists abrasion.

The sliders 54c and 54d are kept in frictional pressure contact with a sliding plate 52b of an abrasion-resistant friction material fixed to the upper surface of a rail member 52 which is a driven member as illustrated in the figure. It is assumed that the rail member 52 is fixed to a stationary member (not shown).

In the surface of the rail member 52 on the side with the sliding plate 52b not fixed thereto there are formed two rows of rectilinear guide grooves 52a of a semicircular section in the driven direction of the driving member 62. Part of the rail member 52 and the flexural vibrator 61 are disposed within a motor supporting frame 51. The motor supporting frame 51 is constituted by a channel-like member of U-shaped section so as to surround both part of the rail member 52 and the flexural vibrator 61. Further, rectilinear and parallel ball receiving grooves 51a having ends and having a semicircular section substantially the same as that of the guide grooves 52a are formed in the motor supporting frame 51 in positions opposed to the guide grooves 52a, and a plurality of bearing balls 63 are disposed in the spaces defined by the ball receiving grooves 51a and the guide grooves 52a. Thus, the supporting frame 51 is constructed so as to be movable only in the direction of the guide grooves 52a of the rail member 52 while holding the balls 63 in the ball receiving grooves 51a.

The flexural vibrator 61 is mounted as follows with respect to the supporting frame 51. Cylindrical shaft-like support pins 55a, 55b, 55c and 55d projecting in the width direction of the flexural vibrator 61 are provided in the node positions of flexural vibration of the flexural vibrator 61, more particularly in symmetrical right and left positions, at four points on a central position in the thickness direction of the elastic member 55, integrally with the elastic member. These support pins serve as support portions of the flexural vibrator 61. Further, support members 64a, 64b, 64c and 64d each having a flange and formed of a material superior in slidability are fixed or fitted onto the outer peripheries of the support pins 55a-55d, respectively.

A holder member 57 for the driving member 62 is constituted by a channel member having an inverted U-shaped section to surround the flexural vibrator 61 from above. The holder member 57 has engaging cutout portions 57c, 57d, 57e and 57f at both right and left side edges thereof in positions opposed to the support pins 55a-55d. The support pins 55a-55d provided in the elastic member 55 of the flexural vibrator 61 are fitted in the engaging cutout portions 57c-57f rotatably through the support members 64a-64d. Further, the holder member 57 has mounting pieces 57a and 57b overhanging horizontally outwards to the right and left in the width direction, the mounting pieces 57a and 57b being formed by bending upwards middle portions of both right and left edges of the holder member 57. In the engaged state of the support pins 55a-55d with the engaging cutout portions 57c-57f, the mounting pieces 57a and 57b are placed on the upper surface of the supporting frame 51, then two machine screws 60 are respectively inserted through the mounting pieces 57a and 57b each through a coned disc spring 58 and a spacer 59 and are threaded into the upper surface of the supporting frame 51. In this way the holder member 57 is fixed to the frame 51. The motor being considered is designed so that in this mounted state there is formed a slight gap between the mounting pieces 57a, 57b and the upper surface of the supporting frame 51.

One of the biasing forces of the coned disc springs 58 is transferred to the sliders 54c and 54d through the holder member 57 and the vibrators 54a, 54b, while the other biasing force is transferred to the sliding plate 52b through the supporting frame 51 and the rail member 52. Consequently, these biasing forces act as forces for pressure contact between the sliders 54c, 54d and the sliding plate 52b. And the forces in question are adjusted by changing the thickness of the spacers 59. In this way, the driving member 62 comprising the flexural vibrator 61, longitudinal vibrators 54a, 54b and additional mass members 65a, 65b can be brought into pressure contact with the sliding plate 52b with an appropriate force.

According to the ultrasonic motor of the third embodiment, as described above, first the piezoelectric elements 56a and 56b of the same shape are fixed to the upper and lower surfaces of the elastic member 55 so as to be symmetrical in shape and mass with respect to a neutral plane 61a of the elastic member 55. Then, the additional mass members 65a and 65b of the same shape and mass are fixed to the longitudinal vibrators 54a and 54b in positions symmetrical with respect to the neutral plane represented by dot-dash line 61a. Therefore, flexural vibration nodes 61b and 61c of the driving member 62 are positioned on the neutral plane 61a. More specifically, the nodes 61b and 61c are positioned centrally in the thickness direction of the elastic member 55.

The ultrasonic motor of the third embodiment constructed as above is driven by applying phase-controlled AC voltages to the flexural vibrator 61 and longitudinal vibrators 54a, 54b. The sliders 54c and 54d fixed to the longitudinal vibrators 54a and 54b which are brought into pressure contact with the sliding plate 52b of the rail member 52, perform such a circular or elliptical path behavior as has been shown in the foregoing first embodiment. consequently, the supporting frame 51 is moved along the rail member 52 and a moving member (not shown) mounted to the frame 51 is also driven at the same time.

According to the ultrasonic motor of this embodiment, the flexural vibration nodes of the driving member 62 can be set accurately on the neutral plane of the elastic member, and those portions are supported by the holder member 57, so the flexural vibration is not obstructed and there is attained a highly efficient and stable driving condition. Besides, it is possible to prevent the generation of disagreeable audible sounds during the operation of the motor. Further, the design of the elastic member itself becomes easier, and even in the event of slight change in position of the nodes due to components' error, the displacement can be corrected easily by adjusting the magnitude of the additional mass.

Although in the above third embodiment the flexural vibration is of first order, it may be of a higher order, e.g. second or third order. Although the support pins 55a-55d are disposed in the same positions as the mounted positions of the longitudinal vibrators, they may be mounted in different node positions. Although the piezoelectric elements 56a and 56b are mounted on both sides of the elastic member 55, there may be provided a piezoelectric element on only one side. Further, although in the above third embodiment the additional mass members 65a and 65b are of the same specific gravity and shape as those of the longitudinal vibrators 54a and 54b, they may be of different specific gravities and shapes so long as their inertial masses of rotation about the nodes are made equal above and below the nodes, namely, in the amplitude direction. For example, the additional mass members 65a, 65b and the elastic member 55 may be formed integrally with each other. In this case, the number of components is reduced, and the operation for mounting the additional masses to the elastic member is no longer required.

Figure 15:
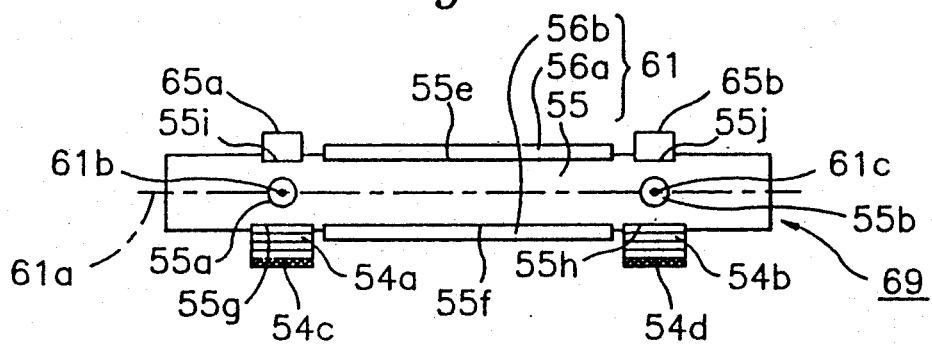
FIG. 15 is a side view of a principal portion of a driving member, showing a modification of the third embodiment illustrated in FIGS. 14A and 14B.

FIG. 15 is a side view of a driving member 69 according to a modification of the third embodiment. The driving member 69 is different from the driving member 62 of the third embodiment in that in the elastic member 55 there are formed grooves 55e, 55f, and 55g, 55h, and 55i, 55j, for mounting and positioning of the piezoelectric elements 56a, 56b, longitudinal vibrators 54a, 54b, and additional mass members 65a, 65b, and in that the additional mass members 65a and 65b are reduced in size by using a material of a large specific gravity. By so doing, the vibrator manufacturing error can be kept as small as possible, so the flexural vibration is enhanced in its accuracy of symmetry and becomes stabler and higher in efficiency. Moreover, it becomes possible to reduce the size of the driving member 69. As to the material of the additional masses 65a and 65b, iron and copper group metals are suitable. For further reduction of the size, it is desirable to use tungsten.

Figure 16:
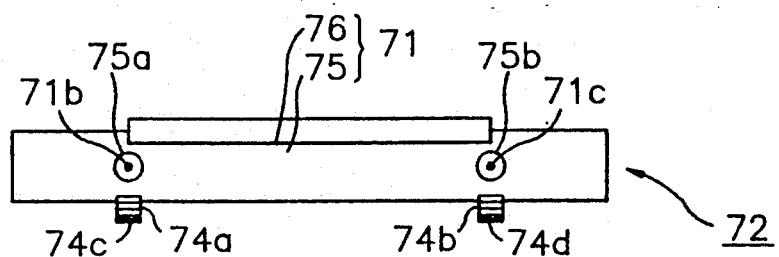
FIG. 16 is a side view of a principal portion of a driving member, showing another modification of the third embodiment illustrated in FIG. 14A.

FIG. 16 illustrates a driving member according to another modification of the third embodiment. The driving member 72 of this modification uses no special additional mass members. The masses of longitudinal vibrators 74a and 74b are made small, and a piezoelectric element 76 provided on one side acts as an additional mass. In this modification, the mass of an elastic member 75 is sufficiently larger than the masses of the longitudinal vibrators 74a and 74b, so even without the provision of any special additional mass members, the inertial masses of rotation for the flexural vibration nodes are not greatly different above and below the nodes, so there scarcely occurs unbalance of flexural vibration. Therefore, in the operation of an ultrasonic motor to which the driving member of this modification is applied, like the ultrasonic motor of the foregoing third embodiment, the flexural vibration is only slightly impeded and it becomes possible to provide a highly efficient ultrasonic motor.

Figure 17:
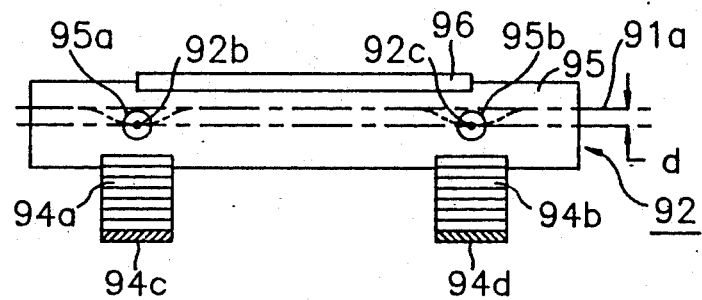

FIG. 17 illustrates a driving member according to a further modification of the foregoing third embodiment. In this modification, like the modification just described above, it is not necessary to provide any special additional mass members. Further, support portions 95a and 95b for supporting a driving member 92 are not always set on a neutral plane 91a in the vibrating direction of an elastic member 95. Taking into account the balance of rotational inertial masses of a piezoelectric element 96, the elastic member 95 or longitudinal vibrators 94a, 94b in the flexural vibration direction and also taking into account the balance of rigidity of the elastic member, there are determined node positions deviated by an amount of displacement d from the neutral plane 91a in calculation or experimentally, and in those positions there are disposed four support pins 95a, 95b (the others are not shown) which support the driving member 92.

Like the previous modification, the ultrasonic motor using the driving member of this modification is highly efficient and free of disagreeable audible sounds. Although in each of the ultrasonic motors of the foregoing third embodiment and modifications thereof the support member is used as a moving member and the rail member is fixed, it is possible to provide an ultrasonic motor in which the support member is fixed and the rail member is used as a moving member.

Figure 18:
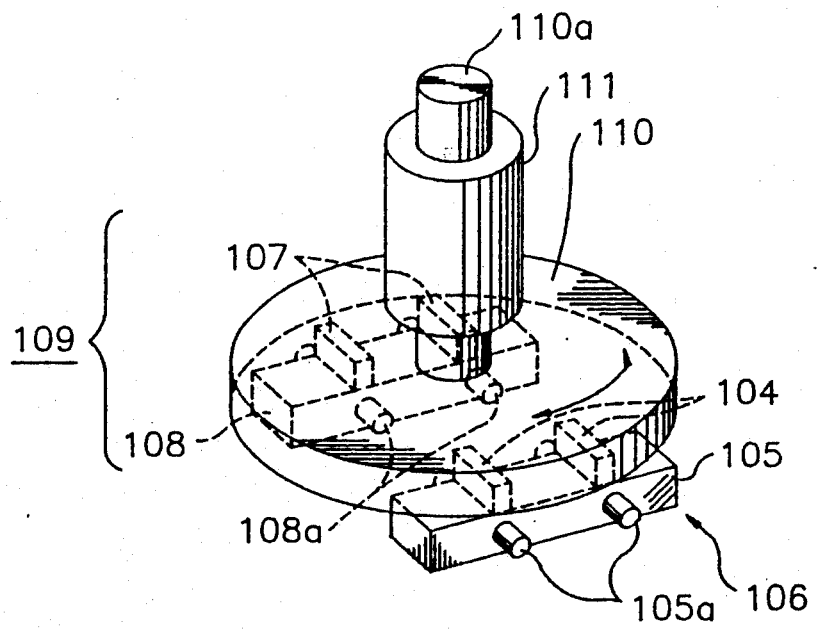
FIG. 18 is a schematic perspective view of a principal portion of an ultrasonic motor according to a fourth embodiment of the present invention.
Figure 19:
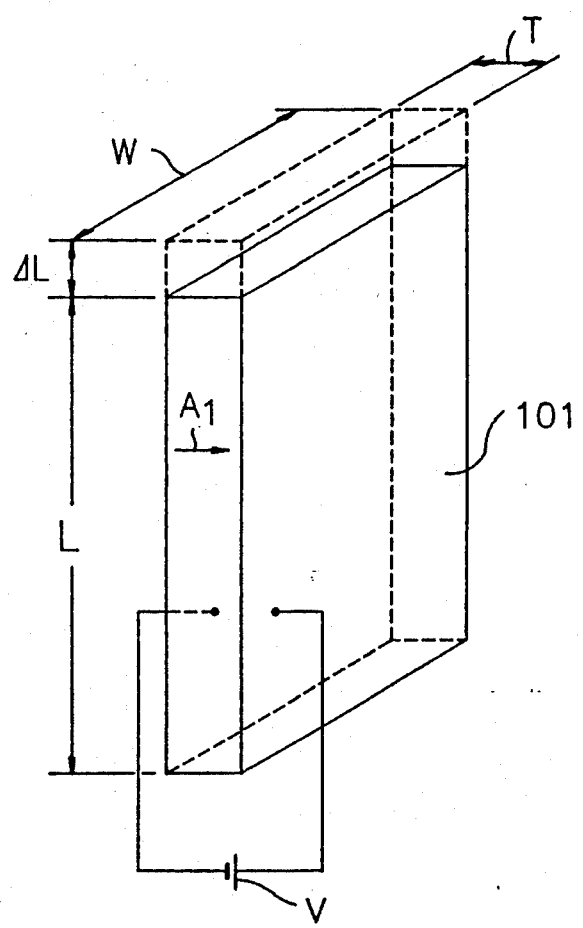
FIGS. 19 and 20 are perspective views each explaining the operation of a longitudinal vibrator.

An ultrasonic motor according to a fourth embodiment of the present invention will now be described with reference to FIG. 18. In this embodiment the present invention is applied to a rotative driving type ultrasonic motor in which a contacting member which is brought into pressure contact with driving members 106 and 109 is a disc-shaped moving member 110. The driving members 106 and 109 for driving the moving member 110 are respectively composed of flexural vibrators 105 and 108 having support pins 105a and 108a, and longitudinal vibrators 104 and 107. The longitudinal vibrators 104 and 107 are brought into pressure contact with the moving member 110 through support members (not shown) respectively. The moving member 110 is supported by an output shaft 110a through a bearing 111, the output shaft 110a being integral with the moving member 110. The driving members 106 and 109 have the same structure as in the foregoing embodiments.

The operation of the ultrasonic motor of this embodiment constructed as above will now be described. A phase-controlled AC voltage is applied to each of the vibrators of the driving members 106 and 109 to vibrate the vibrators, thereby causing the moving member 110 to rotate clockwise or counterclockwise to drive an object as a load to be moved (not shown) through the output shaft 110a.

According to this embodiment it is possible to provide an ultrasonic motor of high efficiency having more stabilized characteristics. Although in this embodiment there are used two driving members 106 and 109, it is also possible to constitute such ultrasonic motor by using only one driving member.

In some particular shape of the longitudinal vibrators provided on the node lines of the flexural vibrators in the ultrasonic motor constructed as above, there arises an inconvenience such that the longitudinal vibrators obstruct the flexural vibration of the flexural vibrators, resulting in that the motor scarcely moves.

More specifically, when the longitudinal vibrators are fixed by bonding onto the nodes of the flexural vibrators, the flexural vibrators become difficult to bend due to the rigidity of the longitudinal vibrators. As to this bending property, the larger the width of the base end portion of each longitudinal vibrator, the rigidity of the longitudinal vibrators exterts a greater influence, thus preventing the bending of the flexural vibrators and exerting a bad influence on the vibration amplitude.

Moreover, a neutral axis 0 (see FIG. 23) of a flexural vibrator 1 deviates to the side where longitudinal vibrators 3 and 4 are bonded. Further, the vibration mode in the flexural vibration is influenced, the node positions in the vibration are displaced, and an elliptical path at the front end of each longitudinal vibrator is also influenced.

It is difficult to fabricate the above longitudinal vibrators at a width of 0.5 mm or less. Even if they are fabricated at such small width, the front-end acceleration of each longitudinal vibrator is $1 \times 10^5$ m/s², namely, ten thousand times as large as gravitational acceleration, assuming that the front-end amplitude of each longitudinal vibrator is about 1 μm and the driving frequency is about 50 KHz. Moreover, since the bending force is also applied to the longitudinal vibrators, these vibrators are apt to be broken and become less durable in point of rigidity. Further, since it is impossible to apply a large power input to the longitudinal vibrators, it is impossible to obtain a sufficient amplitude and the efficiency is deteriorated. Thus, longitudinal vibrators not larger than 0.5 mm in width are not suitable.

Figure 23:
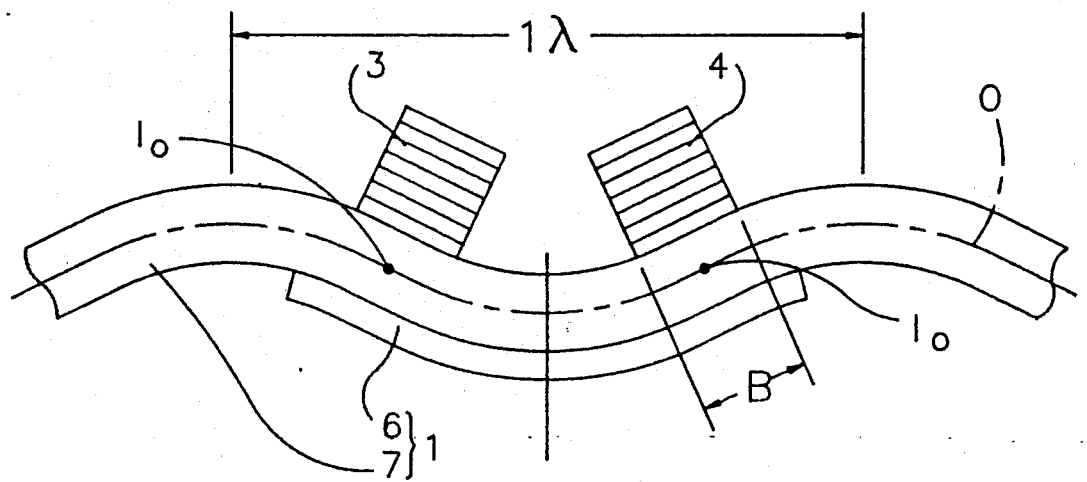
FIG. 23 is a diagram showing a basic concept of base end portions of longitudinal vibrators as mounted to a flexural vibrator.

According to the present invention, in order to eliminate such inconveniences, as in FIG. 23 in which a basic concept of the invention is shown, in an ultrasonic motor including a flexural vibrator 1 for generating flexural vibration of a standing wave type, longitudinal vibrators 3 and 4 each constituted by a laminate of piezoelectric elements, the longitudinal vibrators 3 and 4 being provided on nodes 10 of the flexural vibrator 1 and adapted to expand and contract in the thickness direction, and a moving member which is brought into pressure contact with end faces of the longitudinal vibrators, the width B of the mounting base end in the flexural vibration wavelength direction of each of the longitudinal vibrators 3 and 4 which are attached to the flexural vibrator 1 comprising an elastic member 7 and a piezoelectric element 6 bonded thereto is set to a value of one third of the wave length λ of the flexural vibrator 1.

By using the longitudinal vibrators 3 and 4 of such size, the flexural vibration of the flexural vibrator is no longer obstructed and elliptical vibrations at the front end portions of the longitudinal vibrators are generated efficiently.

Now, in the linear type ultrasonic motor constructed as in FIGS. 1 to 5, the width B of the mounting base end in the flexural vibration wavelength direction of the longitudinal vibrators 3 and 4 will be explained. First, a linear motor is considered in which the overall length of the flexural vibrator 1 is, say, 27.9 mm and which is driven in a three-order flexural mode free at both ends. And there are measured impedance curves of the flexural vibrator at various widths B of base ends of longitudinal vibrators mounted to the flexural vibrator. longitudinal vibrator used is made constant, and the mounting base ends B of the longitudinal vibrators to the flexural vibrator are 1 mm, 3 mm, 5 mm, 6 mm, 7 mm and 8 mm in width B. Then, Qm which represents the sharpness of vibration is determined from impedance curves measured with respect to the vibrators having the above widths B as characteristics of the motor.

Qm is the reciprocal of dissipation factor of vibration, i.e., the reciprocal of the proportion of dissipation energy of vibration in the interior of the material.

Figure 24:
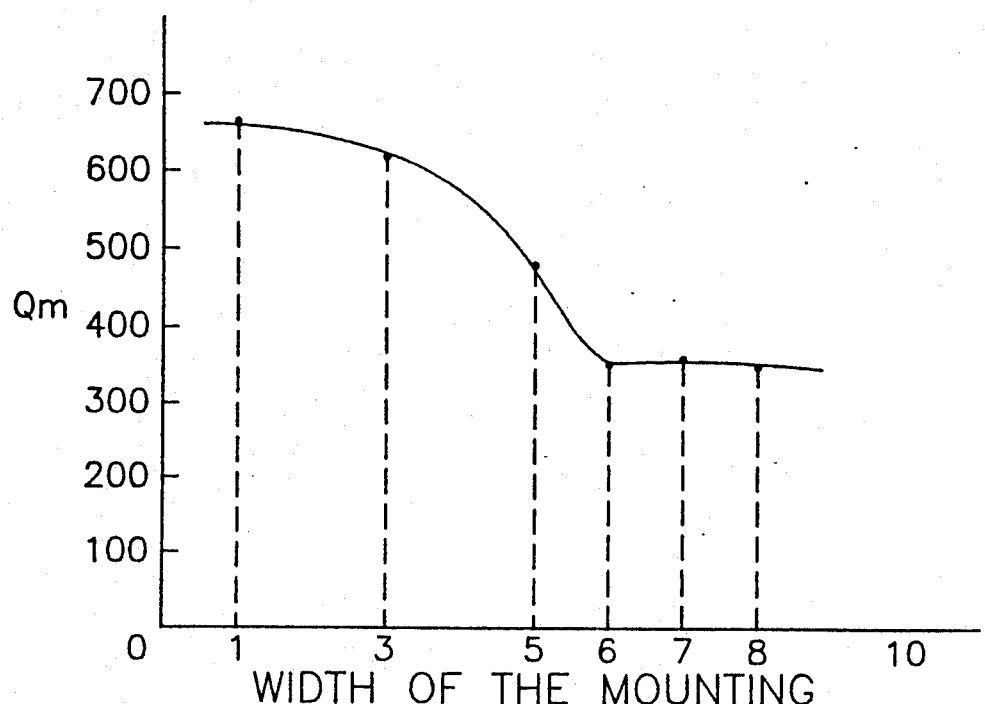
FIG. 24 is a diagram showing Qm values in flexural resonance relative to the width B of the base end portions of the longitudinal vibrators as mounted to the flexural vibrators.

FIG. 24 is a diagram showing Qm values in flexural resonance for the above-mentioned widths B of the mounting base ends of the longitudinal vibrators. From this figure it is seen that Qm values are small at the widths B of 6, 7 and 8 mm. This indicates that at widths B of the base ends of the longitudinal vibrators not smaller than 6 mm, the loss of flexural vibration of the flexural vibrator is large and the characteristics of the motor are deteriorated.

More specifically, the width B of the base end of each longitudinal vibrator is one third or less in terms of the relation between the vibration of the flexural vibrator and the wave length λ thereof.

Although the flexural vibrator of a third-order flexural mode free at both ends was used in the above measurement, it goes without saying that there may be used a flexural vibrator of a second or first-order flexural mode free at both ends, or a flexural vibrator supported at one or both ends.

Such a stable linear type ultrasonic motor of high output can be obtained by setting the width B of the mounting base end in the wavelength direction of flexural vibration to one third or less of the wave length of the flexural vibrator.

Figure 25:
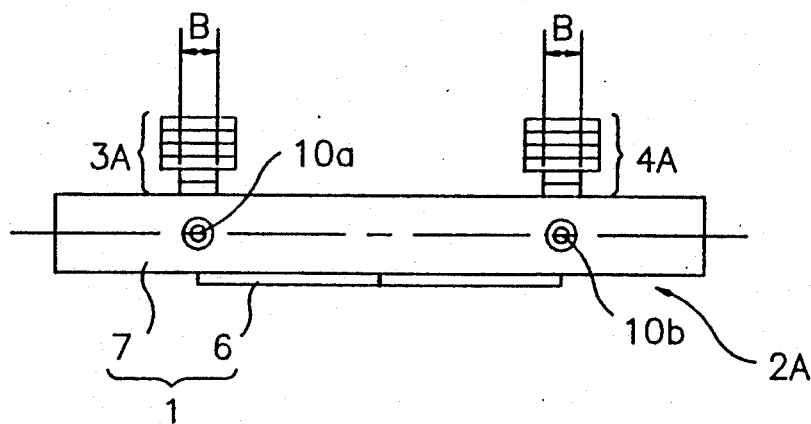
FIGS. 25 to 27 are side views each showing a mounting mode of the longitudinal vibrators to the flexural vibrator in the ultrasonic motor being considered.
Figure 26:
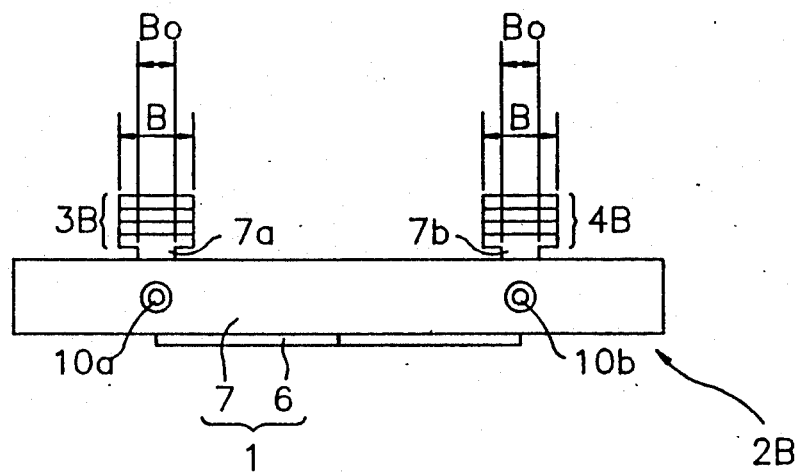
Figure 27:
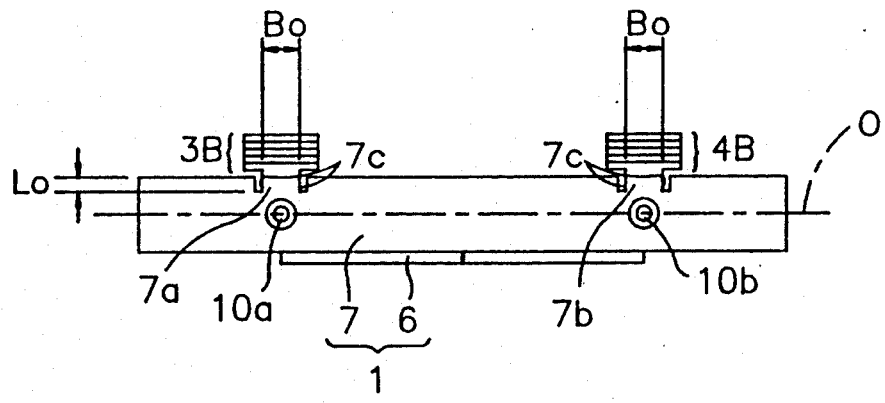

FIGS. 25 to 27 each show a modification of a driving member 2 comprising a flexural vibrator 1 and longitudinal vibrators 3, 4 in the ultrasonic motor of the present invention.

Although in the driving member 2 used in the first embodiment the longitudinal vibrators 3 and 4 are square pillar-shaped in which the entire width thereof and the width B of their mounting base ends are the same, it is not always necessary for the longitudinal vibrators to be in the shape of a square pillar. For example, the driving member may be constructed like a driving member 2A shown in FIG. 25, in which longitudinal vibrators 3A and 4A are formed in the shape of a "T" by laminating piezoelectric elements, and the width B of the mounting base end of each of the longitudinal vibrators 3A, 4A to the flexural vibrator 1 is not larger than λ/3. Even if the longitudinal vibrators 3A and 4A are constructed as above, it is possible to provide a high-efficiency motor.

Although in the above examples the longitudinal vibrators 3, 4, 3A and 4A are fixed by bonding onto the plane of the flexural vibrator on a plate, the driving member may be like a driving member 2B shown in FIG. 26, in which T-shaped bases 7a and 7b are integrally formed on an elastic member 7 and on node lines of a flexural vibrator 1 comprising a metallic elastic member 7 and a piezoelectric element 6 so that the width Bo of each fixed portion is not larger than ¼λ, and longitudinal vibrators 3B and 4B of a larger width than the said fixed portion are fixedly bonded to the upper surfaces of the bases 7a and 7b, respectively.

Under such construction, since the portions of the T-shaped bases 7a and 7b are formed using the same metal as that of the elastic member 7 which is formed of phosphor bronze, brass, stainless steel, or aluminum, those portions are higher in strength than the piezoelectric elements and hence it is possible to make the width Bo of the fixed portion of each of the bases 7a, 7b narrower than the width B of the laminated piezoelectric elements. Moreover, by fixedly bonding wide longitudinal vibrators onto the T-shaped bases it becomes possible to reduce the vibration loss of the flexural vibrator 1 and increase the vibrational force generated by the longitudinal vibrators.

If on both sides of each of the bases 7a, and 7b formed as in FIG. 27 and having fixed portions of width Bo there are formed cut-in grooves 7c as shown in FIG. 27, the fixed portions of the longitudinal members 3B and 4B approach the neutral axis 0 of the flexural vibrator 1 by a distance corresponding to the depth Lo of the cut-in grooves 7c, it is possible to provide an ultrasonic motor smaller in both thickness and size.

Generally, in an ultrasonic motor using a resonant standing wave, a mounting structure of a flexural vibrator to a stationary support frame is an important condition for the improvement of the motor efficiency and stabilization of output. On this regard, since the flexural vibrator performs a resonant vibration of standing wave, it can be mounted to the stationary support frame without impairment of a its vibration by supporting nodes of the standing wave vibration.

In the above ultrasonic motor, however, a very small pendulum vibration generated around the nodes of flexural vibration is utilized, so if the nodes are fixed completely, the said very small pendulum vibration will also stop, creating a completely stationary condition. In this ultrasonic motor, moreover, since the node portions of flexural vibration are each supported by a bearing which permits a very small vibration around each node, there occurs a relative, very small frictional vibration between the supported and supporting portions of the flexural vibrator. Due to friction loss, this very small frictional vibration not only deteriorates the motor efficiency but also causes a non-uniform slip vibration from a non-uniform frictional state, resulting in the generation of disagreeable audible sounds.

In the present invention, in order to overcome the above-mentioned problems, in an ultrasonic motor wherein a driven member and vibrators are moved relatively to each other by the combination of a flexural vibration of a flexural vibrator and a longitudinal vibration of longitudinal vibrators, the support member for supporting the vibrators through another member is constructed so as not to obstruct the rotation around the nodes of the flexural vibration.

Figure 28:
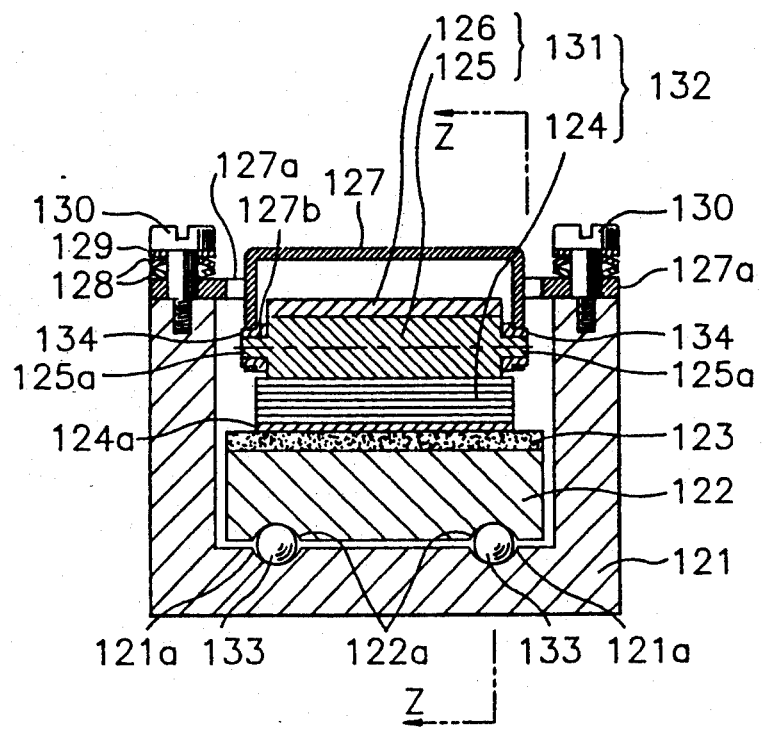
FIG. 28 is a vertical sectional view of a principal portion of an ultrasonic motor, showing fifth and sixth embodiments of the present invention.
Figure 29:
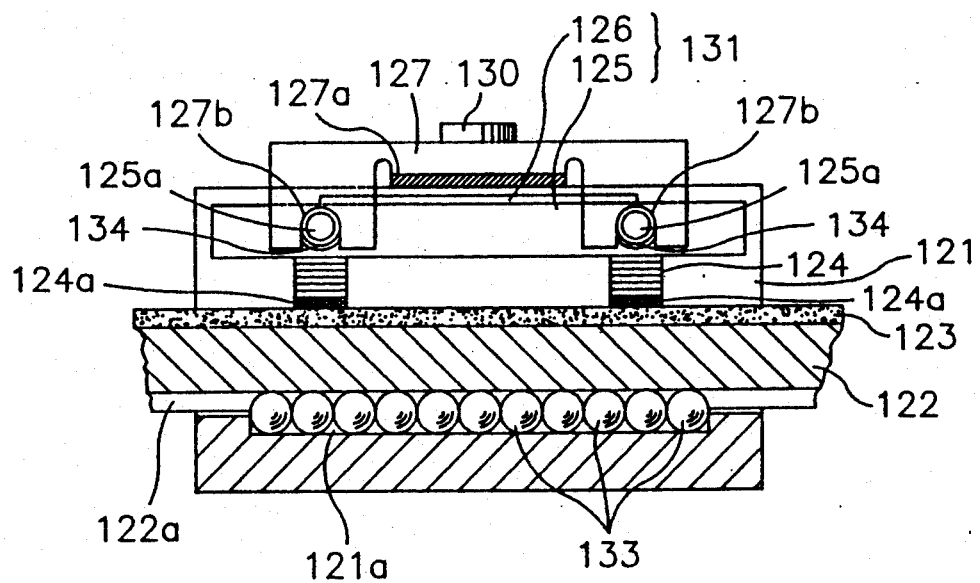
FIG. 29 is a sectional view of the motor taken on line Z—Z in FIG. 28.

Now, a fifth embodiment of the present invention to which the above technical means is applied will be described with reference to FIGS. 28 and 29. A driving member 132 used in this motor comprises longitudinal vibrators 124 and a flexural vibrator 131. The flexural vibrator 131 comprises a relatively thick plate-like elastic member 125 which is rectangular in plan and a thin plate-like piezoelectric element 126 polarized in the plate thickness direction and bonded to the upper surface of the elastic member 125. When a high-frequency voltage is applied in the polarizing direction of the piezoelectric element 126, the flexural vibrator 131 induces a flexural vibration. Particularly, if a signal of a specific frequency is applied to the piezoelectric element, the flexural vibrator will perform a flexural standing wave vibration of resonance. The flexural vibrator used in this element is of a construction in which a flexural resonant vibration of first order is excited most efficiently.

On the other hand, the longitudinal vibrators 124 are each formed by a laminate of piezoelectric elements wider (see FIG. 28) than the flexural vibrator 131, and are fixed to the side of the flexural vibrator 131 opposite to the side to which the piezoelectric element 126 is attached, in the positions of two nodes of first-order flexural vibration of the flexural vibrator. Upon application of a high-frequency voltage, the longitudinal vibrators 124 vibrate in the thickness direction of the flexural vibrator 131. Sliders 124a formed using an abrasion-resistant friction material are fixed to end faces of the longitudinal vibrators 124.

The sliders 124a are in frictional pressure contact with a sliding plate 123 formed of an abrasion-resistant friction material and fixed to the upper surface of a rail member 122 which is fixed to a stationary member (not shown).

In the surface of the rail member 122 on the side where the sliding plate 123 is not fixed there are formed two rectilinear guide grooves 122a of a semicircular section in parallel with each other in the direction in which the driving member 132 is driven. Part of the rail member 122 and the flexural vibrator 131 are disposed within a motor supporting frame 121. The motor supporting member 121 is formed by a channel member of U-shaped section so as to surround part of the rail member 122 and the flexural vibrator 131. In the supporting frame 121 there are formed parallel, rectilinear ball receiving grooves 121a having ends and having a semi-circular section substantially the same as that of the guide grooves 122a, in positions opposed to the guide grooves 122a. A plurality of bearing balls 133 are disposed in the spaces defined by the ball receiving grooves 121a and the guide grooves 122a, whereby the motor supporting frame 121 is made movable only in the direction of the guide grooves 122a of the rail member 122 while the balls are held within the ball receiving grooves 121a. The flexural vibrator 131 is mounted to the supporting frame 121 as follows. In the node positions of flexural vibration of the flexural vibrator 131, cylindrical shaft-like support portions 125a projecting in the width direction of the flexural vibrator 131 are provided in four symmetrical positions integrally with the elastic member 125. A support member 134 with a flange is fixed or fitted on the outer periphery of each of the projecting support portions 125a. The projecting support portions 125a are fitted in engaging cutout portions 127b of a holder member 127 which is fixed to the supporting frame 121 with machine screws 130, whereby the flexural vibrator 131 is mounted to the frame 121.

The holder member 127 is constituted by a channel member having an inverted U-shaped section to cover the flexural vibrator 131 from above. At both right and left edges of the holder member 127 there are formed the engaging cutout portions 127b in positions opposed to the projecting support portions 125a. Middle portions of both right and left edges are bent upwards to form mounting pieces 127a overhanging right and left horizontally outwards in the width direction. Both mounting pieces 127a of the holder member 127 with the engaging cutout portions 127b fitted on the projecting support portions 125a are placed on the upper surface of the supporting frame 121. Machine screws 130 are threaded into the upper surface of the supporting frame 121 through coned disc springs 128 and spacers 129 and further through the mounting pieces 127a, whereby the holder member 127 is fixed to the supporting frame 121. The ultrasonic motor of this embodiment is designed so that a slight gap is formed in this mounted state between each mounting piece 127a and the upper surface of the supporting frame 121. Therefore, if the resilience of the coned disc springs 128 and the amount of the machine screws 130 to be threaded in are adjusted by the spacers 129, the pressure-contact force induced by the springs 128 will be applied directly to the driving member 132, whereby the pressure-contact force for the contact surface of the sliding plate 123 of each slider 124a can be adjusted to an optimal value.

In this embodiment, the support members 134 are formed of a soft elastic material such as rubber, urethane, or felt.

According to the ultrasonic motor of the fifth embodiment constructed as above, very small rotational vibrations created at the outer peripheries of the projecting support portions 125a are absorbed by elastic deformations of the support members 134, so the energy loss of the flexural vibrator 131 caused by the support can be reduced. Further, since the elastic deformations of the support members 134 are constant and stable, the output of the flexural vibrator 131 is also stable. Besides, even in the event unbalanced vibration is included in the combined vibration of the vibration of the longitudinal vibrators 124 and that of the flexural vibrator 131, unnecessary vibrations will never leak to the exterior of the driving member 132 because the support members 134 exhibit a vibration insulating action. Consequently, it is possible to prevent the generation of disagreeable audible sounds and the motor output is stable.

As to the material of the support members 134, in addition to the materials referred to above, there may be used other synthetic resins so long as they exhibit a vibration insulating property and are low in rigidity. For example, there may be used composites of inorganic materials such as carbon fibers or glass fibers and resins, as well as felt, woven fabrics and foamed materials.

The support members 134 may be produced as parts, and in this case the parts are bonded or press-fitted onto the projecting support portions 125a; or the projecting support portions 125a may be coated with a material; or molding may be adopted. In this embodiment, the support members 134 are each formed by a cylindrical body with a flange, and the flange portions act to prevent direct contact of the holder member 127 with the elastic member 125. Therefore, the driving member 132 can be positioned laterally with respect to the holder member 127 while the vibration from the flexural vibrator 131 is prevented. If the support members 134 are formed using an insulating material, even if the holder member 127 is formed using a metal, it is possible to simplify an electrical insulation for an electrode which is exposed on the surface of the piezoelectric element 126 and to which is applied a high-voltage electric signal of high frequency.

Moreover, since the holder member 127 can be obtained easily by pressing a thin metallic sheet, it is possible to manufacture the motor less expensively and in a smaller size.

Further, although in the above fifth embodiment the support members 134 are self-deformed to absorb very small rotational reciprocating vibrations around the nodes of the flexural vibrator 131, this also can be attained by reducing the friction between the support members 134 and the engaging cutout portions 127b or the support portions 125a and constructing the contact portion movably.

Now, the construction just referred to above will be described as a sixth embodiment. The surfaces of the engaging cutout portions 127b and the support portions 125a which are in contact with the support members 134 are made fine and smooth. Also, the support members 134 are formed using a low frictional material so as to have fine and smooth surfaces. Either the support members 134 and the support portions 125a or the support members 134 and the engaging cutout portions 127b or both may be constituted as movable contact portions.

Vibrational node motions of the flexural vibrator 131 involve very small rotational motions around the nodes and a motion comprising expansion and contraction of the node spacing. In the foregoing fifth embodiment this expanding and contracting motion can be absorbed by elastic deformations of the support members 134, while in this sixth embodiment a gap is formed in the expanding and contracting directions between the outer peripheral surface of each support member 134 and the inner peripheral surface of each engaging cutout portion 127b to absorb the expanding and contracting motion of the node spacing. It goes without saying that such gap may be formed between the inner peripheral surface of each support member 134 and the outer peripheral surface of each support portion 125a.

The position of the driving member 132 relative to the holder member 127 is determined precisely under centripetal action induced by compression of the outer peripheral surfaces of the support members 134 and the inner peripheral surfaces of the engaging cutout portions 127b.

As the material of such movable support portions it is desirable to use a resin superior in slidability and durability and exhibiting a vibration insulating action. Examples are such resins as PTFE (polytetrafluoroethylene), PPS (polyphenylene sulfide), PAI (polyamideimide), PI (polyimide), PES (polyether sulfone), and PEEK (polyether ether ketone), as well as composite resins obtained by reinforcing those resins with GF (glass fibers), CF (carbon fibers), etc. The support members 134 may be formed by molding or may be coated with any of these resins. They may be coated with a dry lubricant such as Teflon or molybdenum disulfide, or there may be used a ball bearing or a bearing using rollers.

As another example of the above movable support portions, a lubricant such as oil or grease may be applied to the support portions to attain low friction and high durability. The use of oil permits easy attainment of low friction and high durability. Without maintenance, however, it will be impossible to attain sufficient durability. The scattering of oil from the support portions will rapidly result in wear of the support portions or deteriorate the motor performance markedly, so instead of applying oil directly to the support portions it is desirable to form the support members 134 using an oil-impregnated material, whereby the above inconvenience is eliminated. Even without using the support members 134, either the support portions 125a or the holder member 127 may be formed using an oil-impregnated material.

The use of oil or grease mentioned above permits the prevention of unnecessary vibrations because the film of oil or grease exhibits a damping action.

Figure 30:
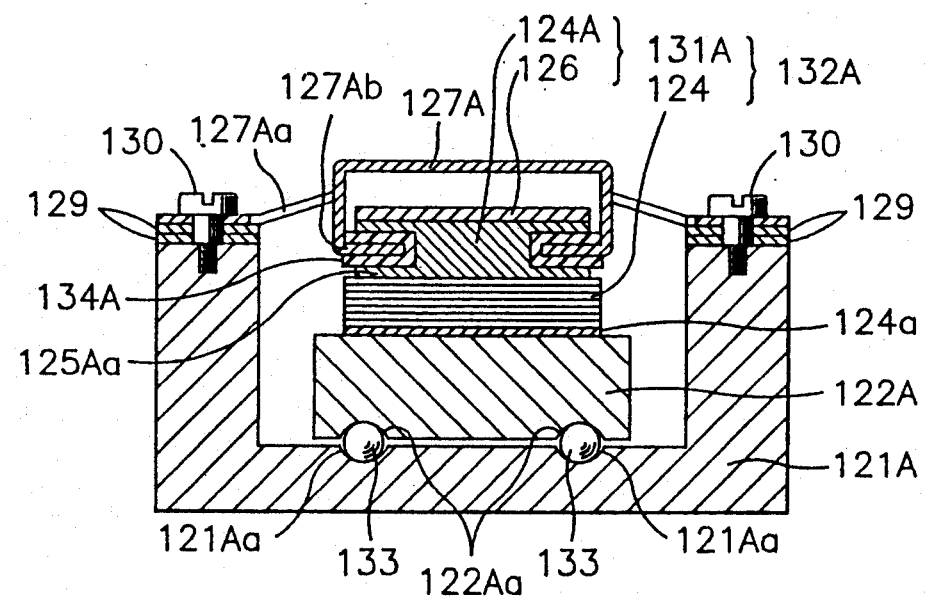
FIG. 30 is a vertical sectional view of a principal portion of an ultrasonic motor according to a seventh embodiment of the present invention.
Figure 31:
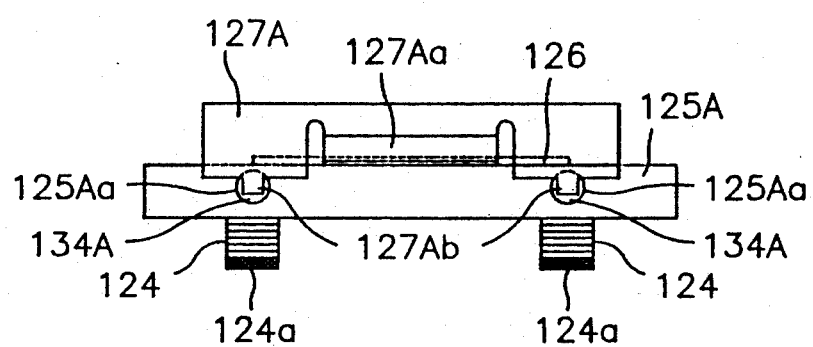
FIG. 31 is a side view of a driving member shown in FIG. 30.

FIGS. 30 and 31 are construction diagrams of principal portions of an ultrasonic motor according to a seventh embodiment of the present invention. The construction of this ultrasonic motor is almost the same as that of the ultrasonic motor of the above sixth embodiment except the mounting structure of a flexural vibrator 131A to a support frame 121A. Therefore, main differences from the sixth embodiment will be described below, and the same components as in the sixth embodiment will be indicated by the same reference numerals.

The main differences are as follows. The foregoing support portions 125a are formed by support concaves 125Aa which are circular holes formed in an elastic member 125A, and the foregoing engaging cutout portions 127b are constituted by engaging bent portions 127Ab which are bent lugs formed integrally with a holder member 127A. The holder member 127A is formed by an inverted U-shaped channel member which covers the flexural vibrator 131A from above. The engaging bent portions 127Ab are inwardly bent portions formed at the lower portions of both right and left side edges of the holder member 127A, and are fitted in the support concaves 125Aa.

Between the support concaves 125Aa and the engaging bent portions 127Ab there are provided support members 134A similar to those used in the fifth and sixth embodiments. Mounting pieces 127Aa for mounting the holder member 127A to the upper surface of the support frame 121A are bent to serve as plate springs in this embodiment and have an elastic function for bringing a driving member 132A into pressure contact with a rail member 122A. The foregoing sliding plate 123 is not attached to the rail member 122A. The contacting interface of a slider 124a and the rail member 122A is maintained to afford optimal frictional force and abrasion resistance by selecting suitable materials of the two. For example, it is most suitable to use SK steel or stainless steel as the material of the rail member 122A, and an abrasion-resistant resin free of attacking property, e.g. PTFE, including Teflon, as the material of the slider 124a. It goes without saying that the material of the rail member and that of the slider may be reverse to each other.

According to the seventh embodiment constructed as above, the support portions 125Aa can be easily formed in the elastic member 125A, and the engaging bent portions 127Ab can also be easily formed integrally with the holder member 127A. Besides, since it is no longer necessary to use a spring for pressure contact of the driving member 132A with the rail member 122A, the support structure for the driving member 132a is more simplified than in the fifth embodiment and hence the cost is reduced. In this embodiment, moreover, the length of engagement between the support members 134A and the support concaves 125Aa can be taken larger than in the fifth embodiment, and the space required may be small. Thus, the driving member 132A can be supported stably in a small space.

Figure 32:
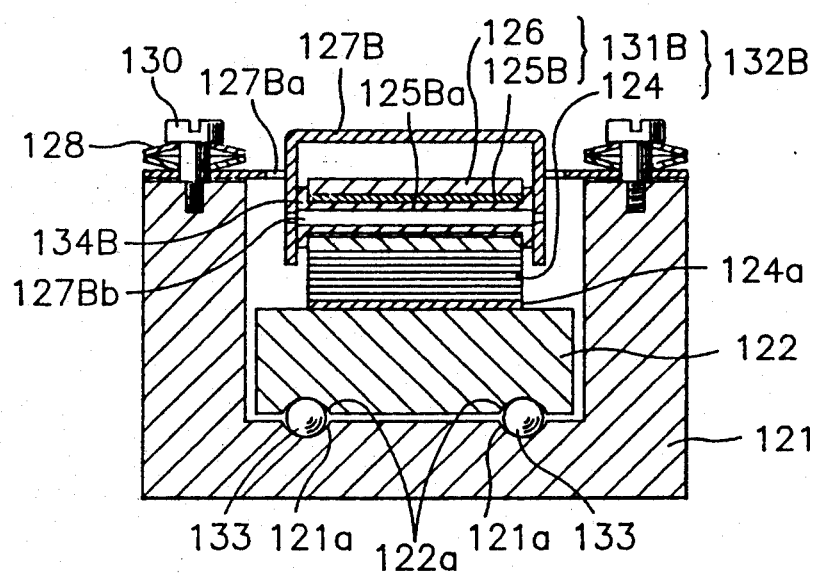
FIG. 32 is a vertical sectional view of a principal portion of an ultrasonic motor according to an eighth embodiment of the present invention.
Figure 33:
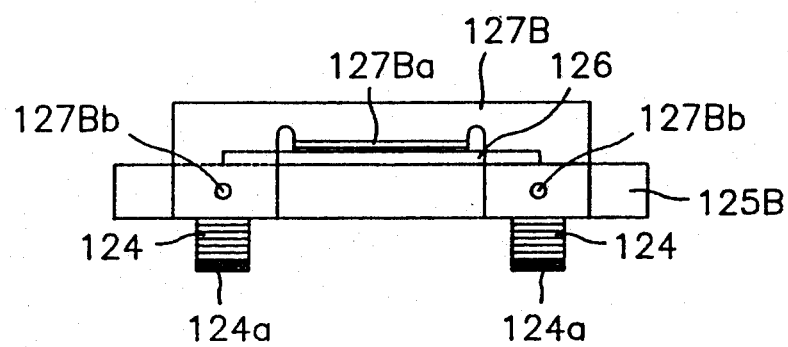
FIG. 33 is a side view of a driving member shown in FIG. 32.

FIGS. 32 and 33 illustrate an ultrasonic motor according to an eighth embodiment of the present invention. The construction of this ultrasonic motor is almost the same as that of the ultrasonic motor of the fifth embodiment except the mounting structure of a flexural vibrator 131B to the support frame 121, so only different points from the fifth embodiment will be described below.

Support portions 125Ba provided in an elastic member 125B are formed by through holes extending in the width direction of the elastic member 125B, and engaging shafts 127Bb are inserted into the support portions 125Ba to constitute engaging portions. The engaging shafts 127Bb are round rod-like shafts fixed at both ends to both right and left side edges of a holder member 127B in positions near open ends. On the outer periphery of each engaging shaft 127Bb there is provided a support member 134B formed of the foregoing soft or low-friction material.

Mounting pieces 127Ba of the holder member 127B are formed in just the same manner as in the fifth embodiment and are also mounted to the support frame 121. A sliding plate is not used in this embodiment, either.

According to this eighth embodiment constructed as above, the length engagement between the support members 134B and the support portions 125Ba can be taken larger than in the seventh embodiment, so it is possible to support a driving member 132B stably. Assuming that the pressure-bonding force is constant, the area of contact between the support members 134B and the support portions 125Ba is the largest and the contact pressure per unit area exerted on the support members 134B is the smallest, so the durability is improved in both the cases of using a soft material and a low-friction material for the support members 134B.

Even if the support members 134, 134A and 134B in the fifth to eighth embodiments are formed using a rigid material, since some consideration is given so as not to obstruct the rotation around nodes, a satisfactory effect can be obtained merely by planishing the support member surfaces or subjecting the same surfaces to a lubricating treatment for obtaining good sliding surfaces.

Although in the fifth to eighth embodiments the rail member is fixed, it goes without saying that the support frames 121, 121A, holder members 127, 127A, 127B and vibrators may be fixed, while the rail members 122, 122A may be moved.

In the ultrasonic motors described above, there is used a first-order flexural vibration of a flexural vibrator comprising an elastic member 145 and a piezoelectric element 146, as in FIGS. 40A through 40H in which vibrating conditions of a driving member 152 are respectively shown time-divisionwise like (T1) to (T8). Therefore, two longitudinal vibrators 143 and 144 mounted on nodes $152a_1$ and $152a_2$ are opposite to each other in their vibrational phases so that the longitudinal vibrators act on a moving member 142 in an alternate manner. But such an alternate action of the longitudinal vibrators on the moving member gives rise to the following problems. When one longitudinal vibrator acts on the moving member, if the support portion which supports the flexural vibrator through its support frame is not present in the direction of force acting on the longitudinal vibrators, a moment around the support portion serving as the center of rotation gives rise to unstable rocking motions of the flexural vibrator, resulting in that the operation of the ultrasonic motor becomes unstable or the motor efficiency is deteriorated.

The force of each longitudinal vibrator acting on the moving member is proportional to the maximum driving force acting on the contact portion between the longitudinal vibrator and the moving member. For example, when the longitudinal vibrator is brought into pressure contact with the moving member at a certain pressure-contact force, a frictional force proportional to the coefficient of friction of the above contact portion is created in the contact portion, but as a matter of course the ultrasonic motor cannot transmit a larger driving force than the said frictional force to the moving member. At this time, moreover, unless the longitudinal vibrators generate vibration of a minimum amplitude required for driving the ultrasonic motor, against the pressure-contact force of the longitudinal vibrators to the moving member, it is impossible to drive the ultrasonic motor. Therefore, in order to generate a large driving force it is necessary to enlarge the working force of the longitudinal vibrators. In the ultrasonic motor illustrated in FIGS. 40 through 40H, however, such working force is generated by only one longitudinal vibrator because it is only one longitudinal vibrator out of the two longitudinal vibrators that acts on the moving member.

The force generated by each longitudinal vibrator may be enlarged by providing three or more vibrational nodes in the flexural vibrator and increasing the number of longitudinal vibrators to be attached to the flexural vibrator. But if the number of such nodes is increased, the flexural vibrator becomes larger in size, and if three or more longitudinal vibrators are provided, there will occur variations in the force of the longitudinal vibrators operating on the moving member unless the surfaces of contact of the longitudinal vibrators with the moving member are formed with an extremely high accuracy As the case may be, a certain longitudinal vibrator may not come into contact with the moving member.

In the present invention, therefore, in an ultrasonic motor wherein the longitudinal vibrators are expanded and contracted in synchronism with the flexural vibration, plural such longitudinal vibrators are disposed with an odd number of node(s) of the flexural vibrator between.

Now, an ultrasonic motor according to a ninth embodiment of the present invention to which is applied the above technical means will be described with reference to FIGS. 34 and 35. This ultrasonic motor is constructed in almost the same manner as the ultrasonic motor shown in FIGS. 28 and 29. A driving member 132C used in this motor is composed of plural longitudinal vibrators 124C and a flexural vibrator 131C. The flexural vibrator 131C comprises a relatively thick plate-like elastic member 125C which is rectangular in plan and a thin plate-like piezoelectric element 126C which is polarized in the plate thickness direction and bonded to the upper surface of the elastic member 125C. When a high-frequency voltage is applied in the polarizing direction of the piezoelectric element 126C, the flexural vibrator 131C causes a flexural vibration, and upon application of a signal having a specific frequency, the flexural vibrator performs a flexural standing wave vibration of resonance. The flexural vibrator used in this embodiment is constructed so that a second-order flexural resonance vibration is excited most efficiently. More specifically, the piezoelectric element 126C is fixed to the elastic member 125C symmetrically with respect to the longitudinal center of the elastic member 125C so as to be opposite to each other in polarizing directions.

Figure 34:
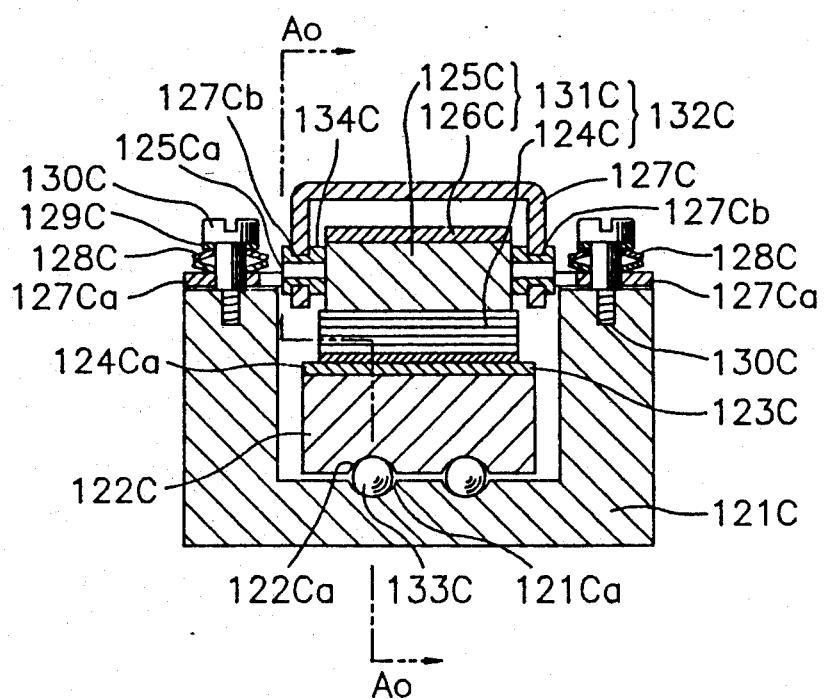
FIG. 34 is a vertical sectional view of a principal portion of an ultrasonic motor according to a ninth embodiment of the present invention.
Figure 35:
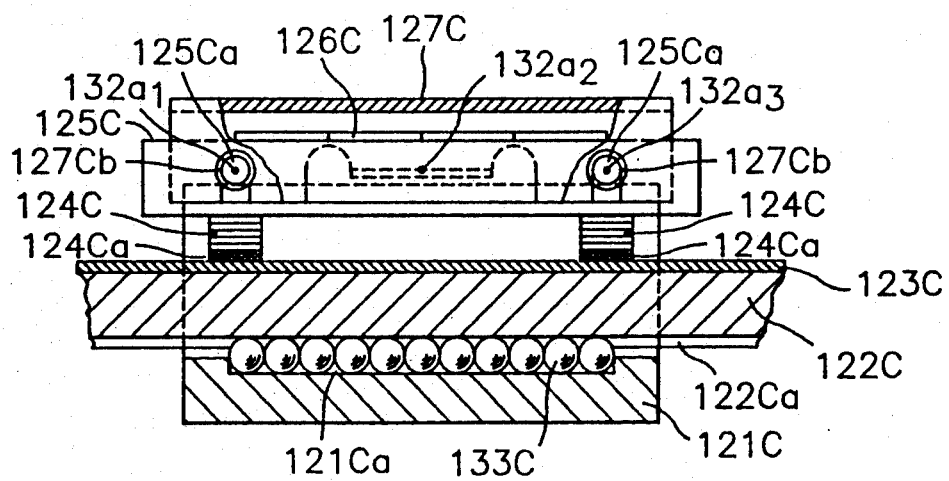
FIG. 35 is a sectional view of the motor taken on line Ao—Ao in FIG. 34.

On the other hand, the longitudinal vibrators 124C are each constituted by a laminate of piezoelectric elements wider than the flexural vibrator 131C, as shown in FIG. 34, and are fixed to the surface of the flexural vibrator 131C on the side opposite to the attached side of the piezoelectric element 126C and in the positions of two nodes $132a_1$ and $132a_3$ of the flexural vibrator which are the same in the phase of second-order flexural vibration, as shown in FIG. 35. Upon application of a high-frequency voltage, the longitudinal vibrators vibrate in the same phase in the thickness direction of the flexural vibrator 131C. To end faces of the longitudinal vibrators 124C there are fixed sliders 124Ca formed using an abrasion-resistant friction material.

The sliders 124Ca are in frictional pressure contact with a sliding plate 123C formed of an abrasion-resistant friction material, the sliding plate 123C being fixed to the upper surface of a rail member 122C fixed to a stationary member (not shown).

On the other hand, in the surface of the rail member 122C on the side where the sliding plate is not fixed there are formed two parallel, rectilinear guide grooves 122Ca of a semicircular section in the direction in which the driving member 132C is driven. Part of the rail member 122C and the flexural vibrator 131C are disposed within a motor supporting frame 121C. The motor supporting frame 121C is formed by a channel member of U-shaped section so as to surround part of the rail member 122C and the flexural vibrator 131C. In the supporting frame 121C there are formed parallel, rectilinear ball receiving grooves 121Ca of a semicircular section like that of the guide grooves 122Ca and having ends, in the positions opposed to the guide grooves 122Ca. A plurality of bearing balls 133C are disposed within the spaces defined by both the ball receiving grooves 121Ca and the guide grooves 122Ca, whereby the motor supporting frame 121C can be moved only in the direction of the guide grooves 122Ca of the rail member 122C while the balls 133C are held within the ball receiving grooves 121Ca.

The flexural vibrator 131C is mounted to the supporting frame 121C as follows. In the positions of flexural vibration nodes $132a_1$ and $132a_3$ of the flexural vibrator 131C, cylindrical shaft-like support portions 125Ca projecting in the width direction of the flexural vibrator 131C are provided in four symmetrical positions integral with the elastic member 125C. A support member 134C with a flange and formed of a material superior in slidability is fixed or fitted on the outer periphery of each of the projecting support portions 125Ca, and the support portions 125Ca are fitted in engaging cutout portions 127Cb of a holder member 127C which is fixed to the supporting frame 121C with machine screws 130C, whereby the flexural vibrator 131C is mounted to the frame 121C.

The holder member 127C is constituted by a channel member having an inverted U-shaped section to cover the flexural vibrator 131C from above. At both right and left edges of the holder member 127C there are formed the engaging cutout portions 127C in positions opposed to the projecting support portions 125Ca. Middle portions of both right and left side edges are bent upwards to form mounting portions 127Ca overhanging right and left horizontally outwards in the width direction. Both mounting portions 127Ca of the holder member 127C with the engaging cutout portions 127Cb fitted on the projecting support portions 125Ca are placed on the upper surface of the supporting frame 121C, and machine screws 130C are threaded into the upper surface of the supporting frame 121C through coned disc springs 128C and spacers 129C and further through the mounting portions 127Ca, whereby the holder member 127C is fixed to the supporting frame 121C. The ultrasonic motor of this embodiment is designed so that a slight gap is formed in this mounted state between each mounting portion 127Ca and the upper surface of the supporting frame 121C. Therefore, if the resilience of the coned disc springs 128C and the amount of the machine screws 130C to be threaded in are adjusted by the spacers 129C, the pressure-contact force induced by the springs 128C will be applied directly to the driving member 132C, whereby the pressure-contact force for the contact surface of the sliding plate 123C of each slider 124Ca can be adjusted to an optimal value.

Figure 36:
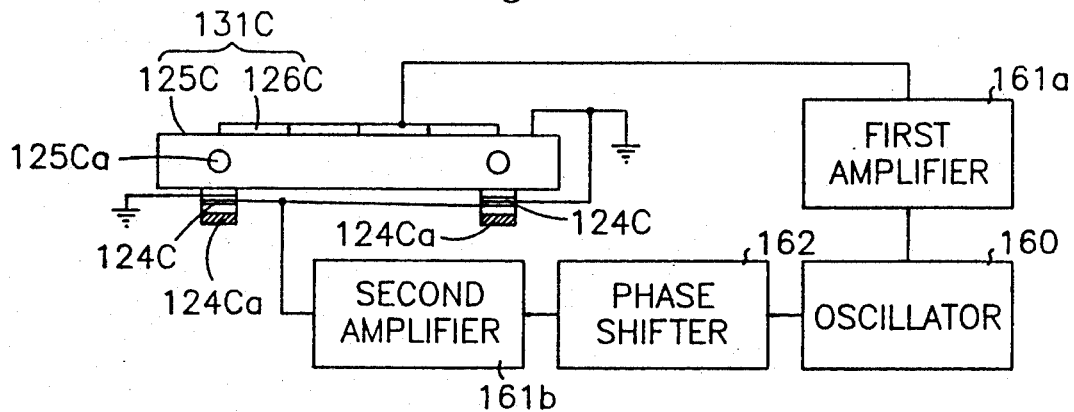
FIG. 36 is a block diagram of a driving circuit for the ultrasonic motor of the ninth embodiment.
Figure 37A:
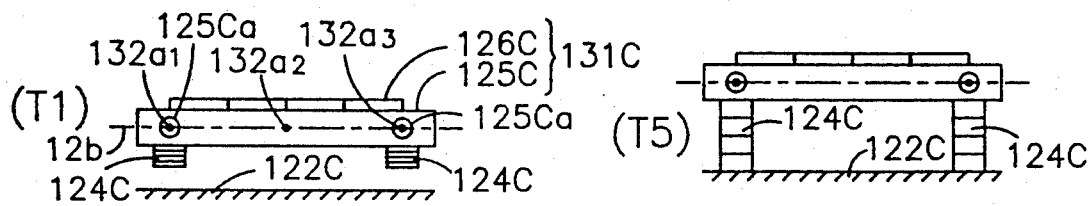
FIGS. 37A through 37H show operation diagrams for explaining vibrating conditions of a driving member used in the ninth embodiment.
Figure 37E:
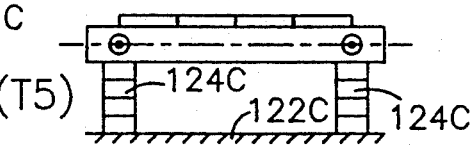
Figure 37B:
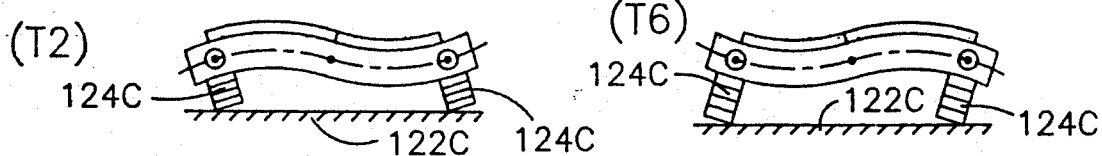
Figure 37F:
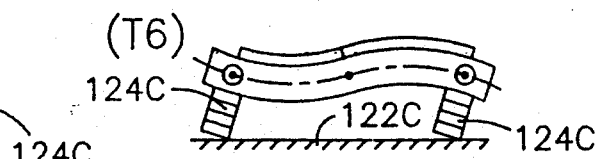
Figure 37C:
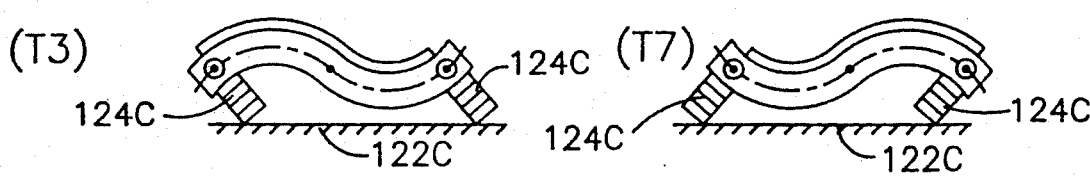
Figure 37G:
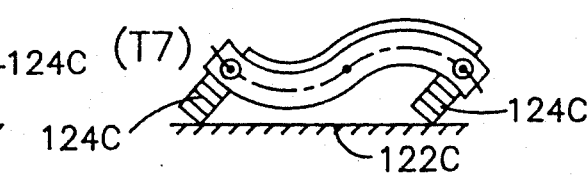
Figure 37D:
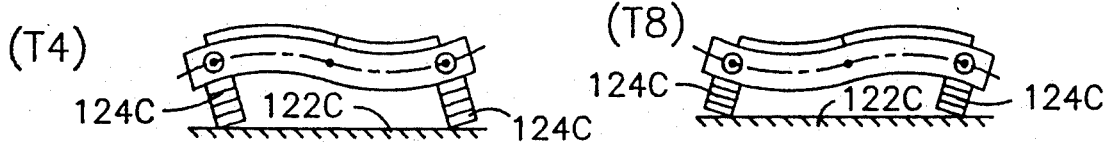
Figure 37H:
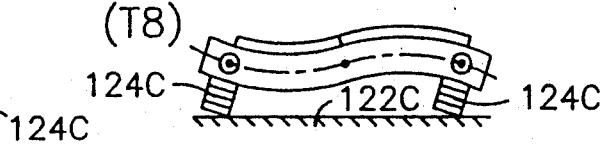

Now, a driving circuit for the ultrasonic motor of this ninth embodiment constructed above will be described with reference to FIG. 36. In the same figure, an oscillator 160 outputs a high-frequency signal at a frequency at which the flexural vibrator 131C generates a flexural resonant vibration of second order. This high-frequency signal is fed to a first amplifier 161a, in which it is amplified up to a voltage level to afford a predetermined vibrational amplitude in the flexural vibrator 131C. This amplified signal is fed to an electrode for signal application of the piezoelectric element 126C. The above high-frequency signal is also fed to a phase shifter 162, in which its phase is changed. If in this phase shifter the amount of such phase change is set so that the longitudinal vibrators are different by 90° in their longitudinal vibration phases with respect to the phase of the flexural vibration, it is possible to drive this ultrasonic motor at the highest speed.

In the ultrasonic motor being considered, the ultrasonic motor 131C is in a resonating condition, the flexural vibration phase is out of phase with an electric signal input. On the other hand, the longitudinal vibrators 124C are driven in a non-resonance state, so the longitudinal vibration phase is coincident with the longitudinal vibration phase. Therefore, the phase difference between the flexural vibration and the longitudinal vibration can be set at 90° by setting the phase difference of electric signals at 30°-120°. The reason why there is such a range in phase is because the phase difference between the flexural vibration and the electric signal input changes due to a manufacturing error of the flexural vibrator or due to different mounting conditions. The signal output from the phase shifter 162 is fed to a second amplifier 161b, in which it is amplified up to a voltage level to afford a predetermined vibration amplitude in the longitudinal vibrators 124C. This amplified signal is fed to an electrode for signal application of each longitudinal vibrator 124C. On the other hand, ground electrodes of the longitudinal vibrators 124C and the piezoelectric element 126C are each connected to an elastic member formed of an electroconductive material and also connected to the ground on the driving circuit side.

The operation of the ultrasonic motor of this ninth embodiment constructed as above will now be described. FIGS. 37A through 37H is an operation diagram respectively showing vibrating conditions time-divisionwise upon operation of the driving member 132C used in the ninth embodiment. (T1)-(T8) indicate the lapse of time after the application of signal. In FIGS. 37A through 37H, vibration amplitudes of the flexural vibrator 131C and the longitudinal vibrators 124C are shown exaggeratively. The longitudinal vibrators 124C operate on the rail member 122C between the time lapses (T3) and (T7) in each of which the flexural vibrator 131C exhibits a maximum amplitude, whereby the driving member 132C is moved relatively to the rail member 122C. At this time, since the two longitudinal vibrators operate on the rail member 122C, a force twice as large as that in the driving member 152 explained in connection with FIGS. 40A through 40H acts on the rail member 122C. In this embodiment, therefore, even if the driving member 122C is brought into pressure contact with the rail member 132C with an urging force twice that in the ultrasonic motor explained in connection with FIGS. 40A through 40H, it is possible to drive the motor, and hence the driving force can be enhanced twice that of the conventional motor. Moreover, since the moments from the two longitudinal vibrators 124C on the mounting portions 127Ca which fix the driving member 132C to the supporting frame 121C are offset, the driving member 132C operates stably.

Figure 38:
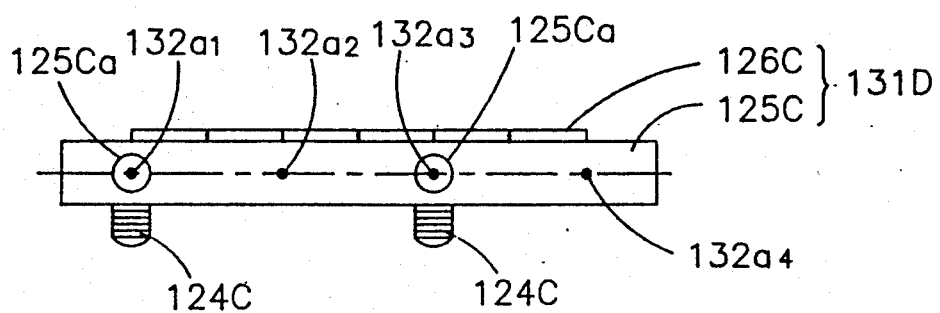
FIG. 38 is a side view of a driving member used in an ultrasonic motor according to a tenth embodiment of the present invention.

FIG. 38 is a side view of a driving member in an ultrasonic motor according to a tenth embodiment of the present invention. This tenth embodiment is greatly different from the above ninth embodiment in that the flexural vibrator 131C in the ninth embodiment generates a second-order flexural vibration, whereas a flexural vibrator used in this tenth embodiment generates a third-order flexural vibration. Except for this point, that is, with respect to the other constructional points of the vibrators, this tenth embodiment is the same as the ninth embodiment, so the explanation of such constructional points will be omitted.

Since in this tenth embodiment there is generated a third-order flexural vibration there are four flexural vibration nodes as indicated at $132a_1$, $132a_2$, $132a_3$ and $132a_4$, and hence two sets of nodes are present, each set being in phase. In such a flexural vibration of an odd-number order, nodes of the same phase, e.g. $132a_1$ and $132a_3$, are not in symmetrical positions with respect to a longitudinal center of a flexural vibrator 131D, as shown in the figure. Although the present invention is applicable also to the case of such an odd number-order flexural vibration as in this tenth embodiment, the balance of flexural vibration is not so good for the nodes of the same phase, so in order to realize a stable ultrasonic motor of high efficiency it is better to avoid the said application of the invention.

Figure 39:
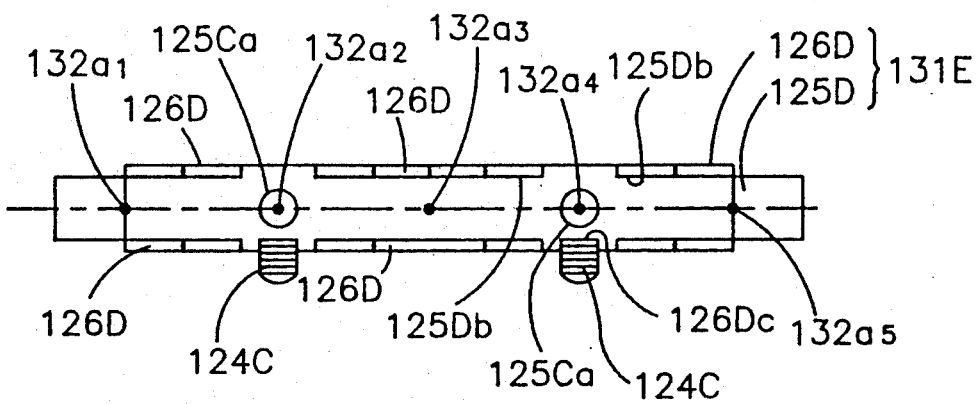
FIG. 39 is a side view of a driving member used in an eleventh embodiment of the present invention.
Figure 40A:
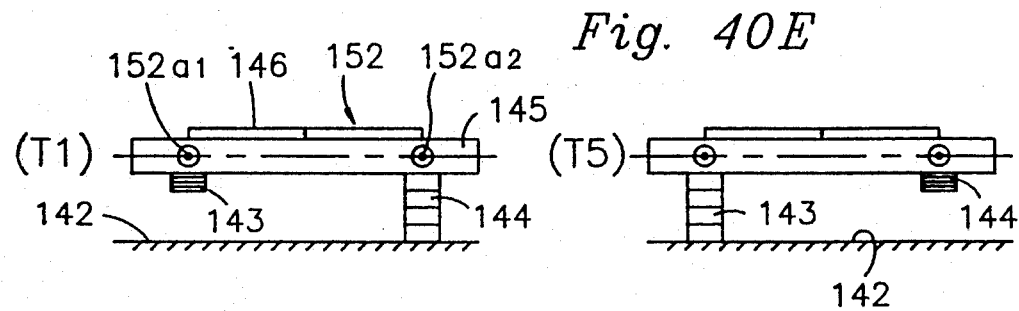
FIGS. 40A through 40H are operation diagrams for explaining vibrating conditions of a driving member in the above ultrasonic motors.
Figure 40B:
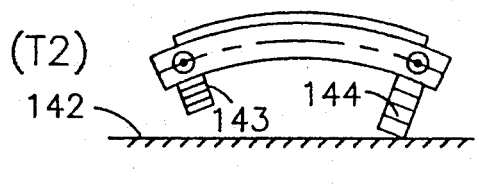
Figure 40C:
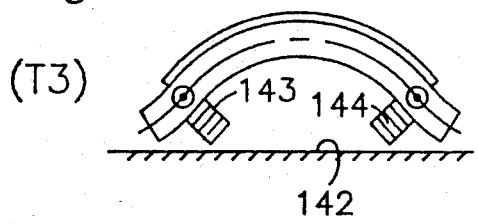
Figure 40D:
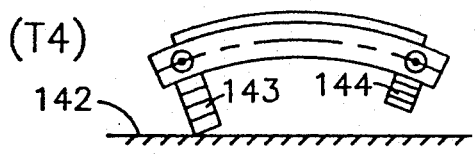
Figure 40E:
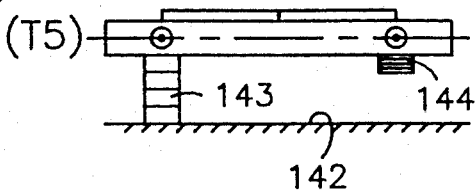
Figure 40F:
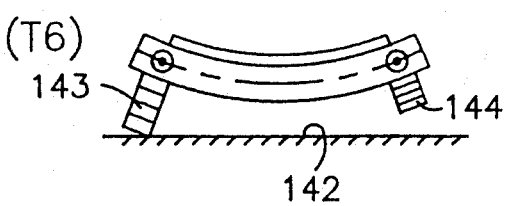
Figure 40G:
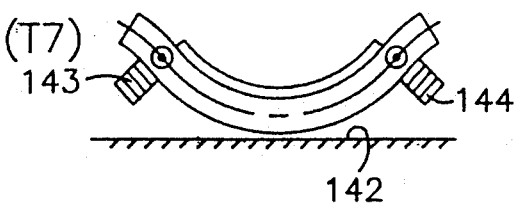
Figure 40H:
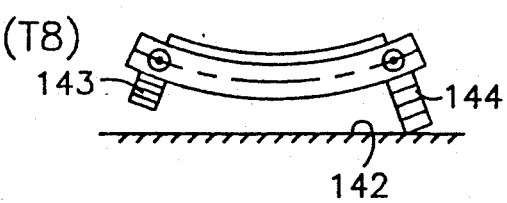

FIG. 39 is a side view of vibrators used in an ultrasonic motor according to an eleventh embodiment of the present invention. This eleventh embodiment is greatly different from the above ninth and tenth embodiment in that a flexural vibrator used therein generates a fourth-order flexural vibration and also in that positioning grooves 125Db and 125Dc are formed in an elastic member 125D for mounting piezoelectric elements 126D and longitudinal vibrators 124C to the elastic member 125D with high accuracy. Except for these points, that is, with respect to the other constructional points of the vibrators, this eleventh embodiment is the same as the above tenth embodiment, so the explanation of such constructional points will be omitted.

In the eleventh embodiment illustrated in FIG. 39, like the ninth embodiment, there is used a flexural vibration of an even-number order, so nodes of the same phase occupy symmetrical positions with respect to the center of a flexural vibrator 131E. Unlike the ninth embodiment, the nodes of the same phase are not the nearest to the end faces of the flexural vibrator 131E, so the vibration of each node itself is stable. More particularly, in the case of a node nearest to an end face of the flexural vibrator as in the ninth embodiment, the node will be influenced by irregular reflections of flexural vibration from the end face, thus making it impossible to perform a stable node motion. In this eleventh embodiment, since the piezoelectric elements 126D are fixed symmetrically to the upper and lower surfaces of the flexural vibrator 131E, a stronger flexural vibration is obtained and it is possible to excite a stable flexural vibration of high efficiency, in addition to the foregoing effects.

The following description is now provided about a hollow linear type ultrasonic motor in which a moving member such as a hollow driven member can be driven rectilinearly and also can be positioned and guided with high accuracy relative to a stationary member in a limited space by a simple structure.

Figure 41:
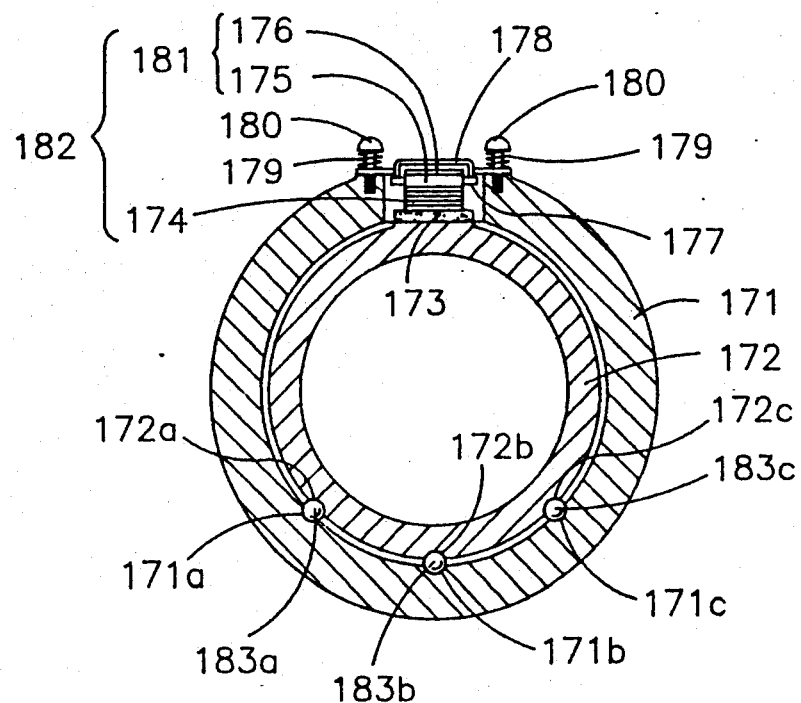
FIGS. 41 and 42 are respective sectional views of an ultrasonic motor according to a twelfth embodiment of the present invention.
Figure 42:
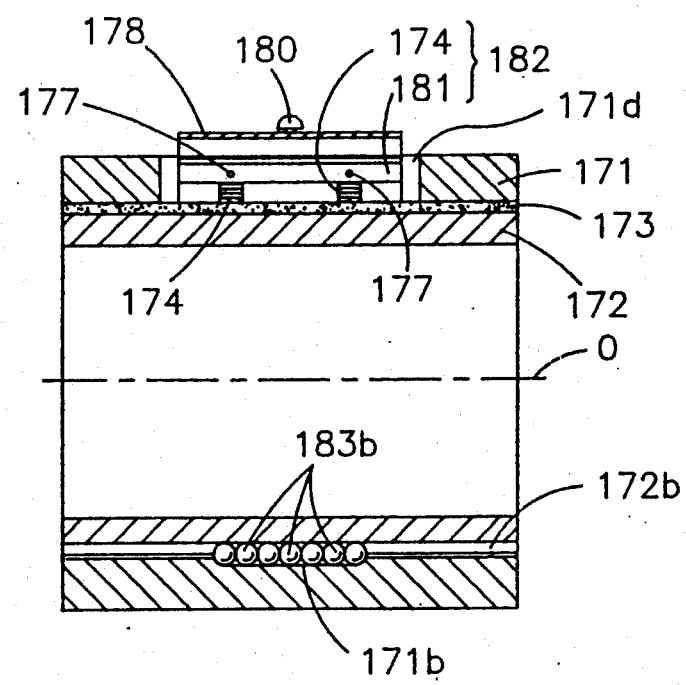

FIGS. 41 and 42 are sectional views of an ultrasonic motor according to a twelfth embodiment of the present invention. Inside a stationary frame 171 as a stationary member constituted by a hollow cylinder is disposed a moving frame 172 as a moving member also constituted by a hollow cylinder. The moving frame 172 is movable axially while a certain gap is formed between it and the stationary frame 171. In an upper part (in FIG. 41) of the gap formed between the stationary frame 171 and the moving frame 172, a sliding plate 173 extending axially of the moving frame 172 is fixed onto the moving frame 172, while in a middle part of the stationary frame 171 opposed to the sliding plate 173 there is formed a rectangular cutout hole 171d (see FIG. 43) which is long axially in the longitudinal direction. The cutout hole 171d is for disposing a later-described driving member therein.

In the gap portion on the side opposite to the side where the sliding plate 173 is disposed there is provided a mechanism for supporting and guiding the moving frame 172. In this embodiment the said supporting and guiding mechanism is composed of three guide grooves and a support member as a guide member comprising a plurality of bearing balls disposed in those guide grooves. More specifically, in a position opposite to the sliding plate 173 with respect to a central axis 0 a rectilinear groove 172b in the form of a partially arcuate recess is formed in the outer peripheral surface of the moving frame 172 in the axial direction of the moving frame, while in the inner peripheral surface of the stationary frame 171 a rectilinear groove 171b in the form of a partially arcuate recess is formed axially of the stationary frame in a middle axial position opposed to the groove 172. Further, in circumferentially equidistant positions on both sides of the rectilinear grooves 171b and 172b, rectilinear grooves 171a, 172a, 171c and 172c each in the form of a partially arcuate recess are formed in the direction of the central axis 0 in the inner peripheral surface of the stationary frame 171 and the outer peripheral surface of the moving frame 172. In the spaces defined by the rectilinear grooves 171a, 172a; 171b, 172b; and 171c, 172c there are disposed support members 183a, 183b and 183c, respectively, each constituting a guide member and comprising a plurality of bearing balls.

In this support mechanism, if a driving member 182, which will be described later, disposed in the position opposed to the support member 183b of the moving frame 172 is pushed in the direction of the central axis 0, a centripetal action is created by the rectilinear grooves 172a-171c, 172a-172c and the support members 183a-183c, whereby the moving frame 172 is disposed accurately and precisely so that the axis thereof is coincident with that of the stationary frame 171. As shown in FIG. 42, moreover, since the plurality bearing balls of the support members 183a-183c are disposed axially of the stationary frame 171, the moving frame 172 is supported without deflection of its axis. Further, since the moving frame 172 is supported by only the support members 183a-183c, the moving frame 172 can be positioned accurately with respect to the stationary frame 171 so long as the rectilinear grooves 171a-171c and 172a-172c of the stationary frame 171 are formed with high accuracy.

Figure 43:
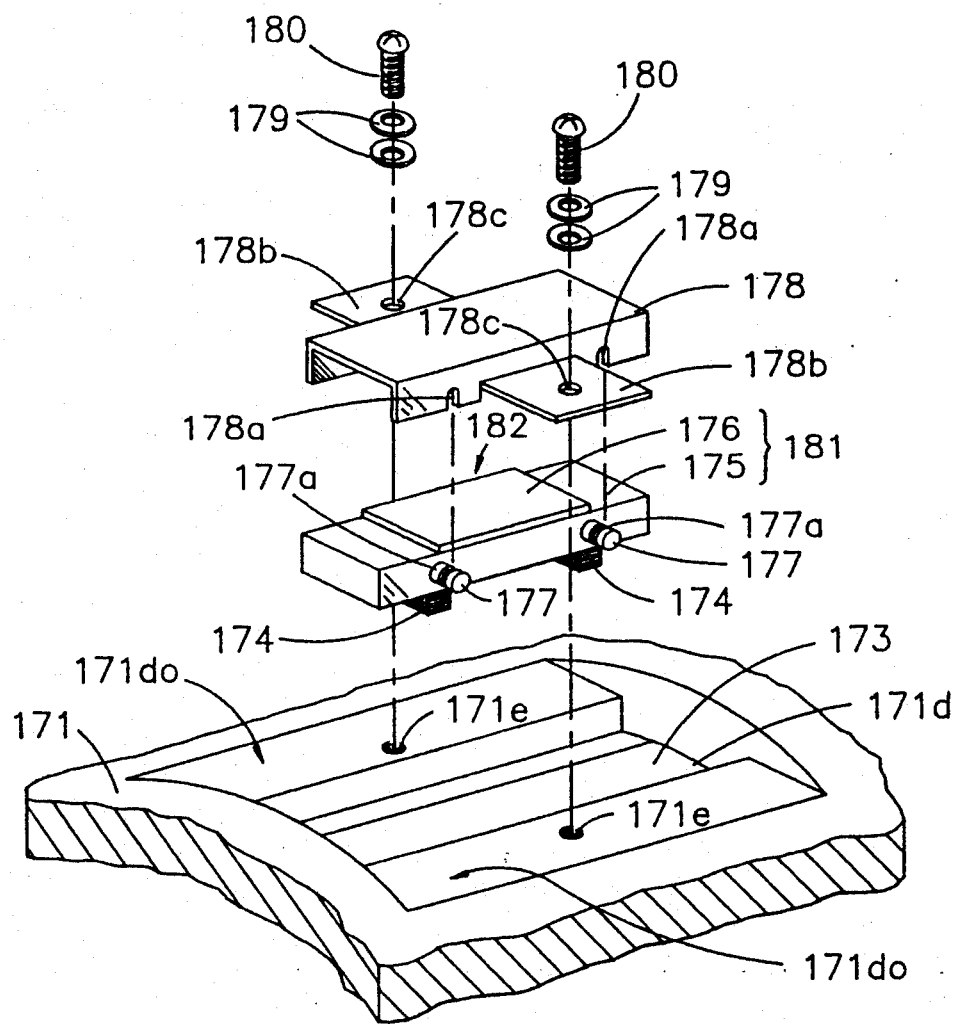
FIG. 43 is an exploded perspective view showing a mounting structure of a driving member used in the ultrasonic motor of the twelfth embodiment.

The cutout hole 171d, as shown in FIG. 43, is formed in an upper middle position of the stationary frame 171 opposite to the sliding plate 173. More specifically, a middle portion of the upper peripheral surface of the stationary frame 171 is cut out in a direction perpendicular to the central axis 0 to form a plane portion, and centrally of this plane portion there is formed the cutout hole 171d which is an axially long, rectangular through hole. Consequently, plane portions 171d$_0$ are formed on both axial sides of the cutout hole 171d. The plane portions 171d$_0$ serve as mounting portions for a holder 178 which supports the driving member 182.

The driving member 182 comprises a flexural vibrator 181 and longitudinal vibrators 174. The flexural vibrator 181 comprises a relatively thick, rectangular elastic member 175 having a size which permits the elastic member to be disposed with margin within the hole 171d, and a thin, rectangular piezoelectric element 176 which is shorter than the elastic member 175. The piezoelectric element 176 is fixed onto the upper surface of the elastic member 175 using an epoxy adhesive. To the piezoelectric element 176 of the flexural vibrator 181 is applied a high-frequency voltage for driving in the thickness direction to generate a first-order flexural resonance in the case of this embodiment. The longitudinal vibrators 174 formed in the shape of a rectangular pillar by a laminate of piezoelectric elements and adapted to perform a longitudinal vibration in the thickness direction of the laminate, namely in the thickness direction of the flexural vibrator 181, are fixed to the lower surface of the elastic member with the piezoelectric element 176 not fixed thereto, in the positions of two flexural vibration nodes.

Four columnar support pins 177 extending outwardly sideways in the width direction of the flexural vibrator 181 in the node positions are fixed to the elastic member 175, and a holder mounting groove 177a is formed circumferentially in a middle position of each pin 177.

The driving member 182 thus constructed is received into the holder 178 from below and is held thereby, the holder 178 having a channel-like section and shaped to cover the driving member 182 from above. More specifically, the holder 178 is formed by bending an elastic thin plate, and arcuate receptacle portions 178a each having a lower opening are formed in both depending walls of the holder in the positions corresponding to the support pins 177. The lower openings of the receptacle portions 178a are formed as cutouts having a width a little larger than the diameter of the holder mounting grooves 177a. Both depending walls of the holder 178 are provided in middle positions thereof with mounting and fixing portions 178b which are bent outwards and extend horizontally. In each mounting and fixing portion 178 there is formed an aperture 178c for insertion therethrough of a fixing machine screw 180.

The holder mounting grooves 177a of the support pins 177 are loosely fitted in the receptacle portions 178a, whereby the driving member 182 is received in the holder 178 vibratably. Thereafter, the fixing machine screws 180 are inserted into the apertures 178c of the holder 178 through coned disc springs 179 and then threadedly engaged with threaded holes 171e formed in the plane portions 171d$_0$ of the stationary frame 171, whereby the driving member 182 is disposed in the cutout hole 171d of the stationary frame 171. In this state, the lower end faces of the longitudinal vibrators 174 are in pressure contact with the upper plane of the sliding plate 173 fixed to the moving frame 172.

The operation principle of the ultrasonic motor of this embodiment thus constructed is the same as in the foregoing embodiments. By setting the phase difference between flexural and longitudinal vibrations at 90°, elliptical vibrations which cause the moving frame 172 to move forward and backward in the axial direction thereof are generated at end faces of the longitudinal vibrators 174. The two longitudinal vibrators 174 are constructed so as to vibrate 180° out of phase with each other, so that only unidirectional operation of pendulum vibrations around flexural vibration nodes is allowed to act on the sliding plate 173 of the moving frame 172. Consequently, the moving frame 172 axially moves forward and backward.

By constructing the ultrasonic motor as in this twelfth embodiment the driving member 182 is disposed in the cutout hole 171d of the stationary frame 171, and the support members 183a-183c are disposed in the gap formed between the stationary frame 171 and the moving frame 172, so a hollow, linear type ultrasonic motor can be constructed very compactly. Moreover, the holder 178 can be fabricated by pressing of a thin plate and that in the form of channel (inverted U shape), so even a thin plate can retain its rigidity. This is effective in reducing the size of the ultrasonic motor. As to the receptacle portions 178a of the holder 178, by making their cutout width smaller than the outside diameter of the mounting grooves 177a of the support pins 177, the driving member 182 can be operated for mounting and removal in a one-touch manner like a C-ring type anti-dislodgement ring. Thus, the ultrasonic motor of this embodiment is superior in assemblability. Besides, since the inside diameter of the receptacle portions 178a is set large with margin as compared with the outside diameter of the mounting grooves 177a and therefore a high motor efficiency is attained without obstructing the flexural vibration of the flexural vibrator 181.

In this embodiment, moreover, since two longitudinal vibrators 174 are used, the moving frame 172 is supported more stably. More particularly, one of the two longitudinal vibrators 174 is sure to be in contact with the upper surface of the sliding plate 173 of the moving frame 172 also during operation of the motor, so that the moving frame 172 is always in a pressed state toward the support member 183b and is hence held in a stable position with respect to the stationary frame 171.

Although in this embodiment the support members 183a-183c are symmetrically disposed in three rows in the positions opposed to the driving member 182, even with only one central row of the support member 183b, there can be obtained a satisfactory holding function, or instead there may be used only two rows of the support members 183a and 183c. Further, support members may also be disposed in the gap portion between the moving frame 172 and the stationary frame 171 in positions above the central axis 0 to support the moving frame 172 by only the support members without allowing the driving member 182 to participate in holding the moving frame 172. This construction is advantageous in that when an external force large enough to deflect the axis of the moving frame 172 is exerted on the moving frame, the vibrators are protected without direct imposition of a large pressure-contact force on the vibrators.

Figure 44:
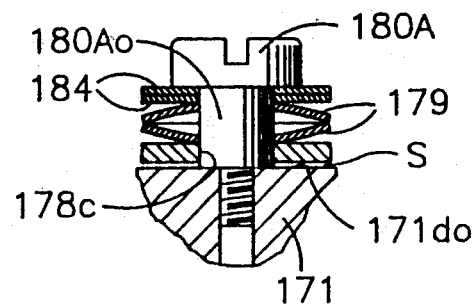
FIG. 44 is an enlarged sectional view of a principal portion of the driving member, showing a modification of a driving member mounting structure.

FIG. 44 illustrates a modification of the pressure-holding portion of the holder 178 in the above embodiment. In this modification, the holder fixing machine screws 180 used in the above embodiment are replaced with stepped machine screws 180A, and spacers 184 for pressure control are used.

Such construction of this modification is advantageous in that a stepped shaft portion 180Ao of a larger diameter of each stepped machine screw 180A can be fitted in the aperture 178c of each holder mounting and fixing member 178b with high accuracy, and hence the driving member 182 can be positioned with higher accuracy The ultrasonic vibration generated in the driving member 182 is strong. When the holder 178 is fixed by fitting the machine screws 180 loosely in the apertures 178c, as shown in FIG. 43, the driving member 182 generates unnecessary vibrations due to wobbling of the loosely fitted portions, thus resulting in deterioration of the motor efficiency or the generation of audible sounds as noises. Therefore, in the case where the driving member 182 is held using the machine screws 180 which are not stepped, it is necessary that the machine screws 180 be fixed to the holder 178 and the stationary frame 171 using an adhesive which exhibits a vibration insulating property.

As shown in the modification of FIG. 44, however, the use of the stepped machine screws 180A permits the stepped shaft portions 180Ao, to come into abutment with the stationary frame 171, so the machine screws 180A are fixed to the stationary frame 171 with a sufficient fixing force even without bonding thereof to the stationary frame 171 if only they are tightened fully.

On the other hand, if the force of pressure contact of the driving member 182 with the upper surface of the sliding plate 173 is not set with sufficient accuracy, the stability of the motor output may be impaired or the efficiency thereof deteriorated, or audible sounds may be generated. In the modification illustrated in FIG. 44, a gap S is formed between the plane portions 171$d_o$ of the stationary frame 171 and the mounting/fixing portions 178b in an abutted state of the longitudinal vibrators 174 with the upper surface of the sliding plate 173. Utilizing this gap, the spacer 184 for pressure control which is in the form of a doughnut plate is fitted on the stepped shaft portion 180Ao of each machine screw 180A so as to be positioned between the coned disc spring 179 and the head of the screw 180A. By changing the thickness of the spacer 184 for pressure control, the biasing force of the spring 179 is adjusted to obtain an optimal force of pressure contact of the driving member 182 with the sliding plate 173. In this modification, once such optimal pressure is set by adjustment, there will be no deviation from the set value.

Thus, according to the modification illustrated in FIG. 44, the driving member 182 can be mounted to the stationary frame 171 firmly with higher accuracy, and the force of pressure contact of the driving member with the sliding plate 173 can be set accurately, so it is possible to provide a holder mounting structure for a stable motor of high efficiency without generation of audible sounds.

Although in the above embodiment and modification there are used the coned disc springs 179 as holder mounting springs, there may be used other resilient members such as coil springs or plate springs. The mounting and fixing portions 178b of the holder 178 may be formed as plate springs of a cantilever type or may be used as springs.

Although the mounting and fixing portions 178b are provided in two positions symmetrically in the width direction of the driving member 182, it goes without saying that they may be provided in two or more positions. And their extending direction may be the longitudinal direction of the driving member 182. Further, the mounting and fixing portions 178b need not always be provided symmetrically so long as the position in which the driving member 182 is brought into pressure contact with the upper surface of the sliding plate 173 and the positions in which the support members are disposed are balanced momentwise.

Figure 45:
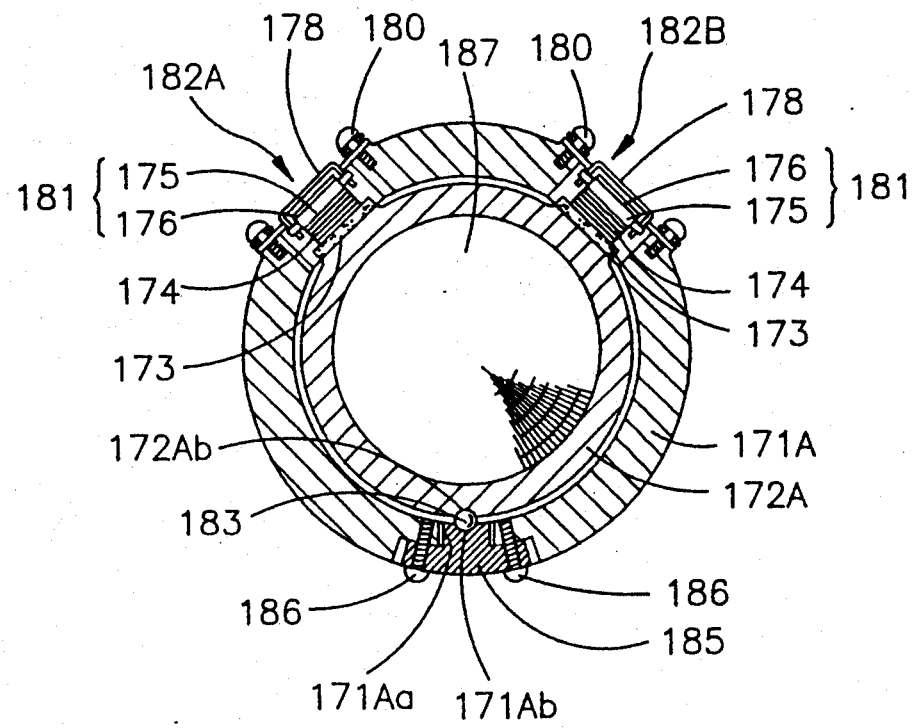
FIGS. 45 and 46 are respective sectional views of an ultrasonic motor according to a thirteenth embodiment of the present invention.
Figure 46:
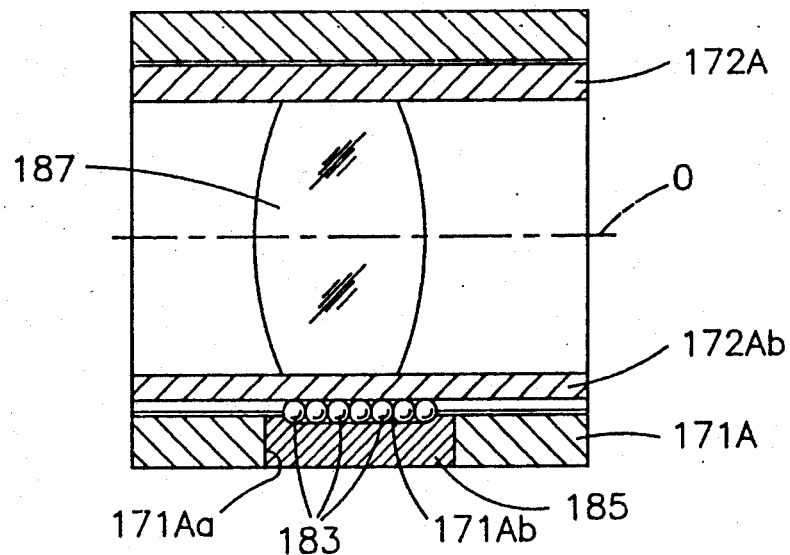

FIGS. 45 and 46 are sectional views of an ultrasonic motor according to a thirteenth embodiment of the present invention. This thirteenth embodiment is constructed so that a photographic lens of a camera is actually moved in the optical axis direction thereof for focusing or zooming by the ultrasonic motor. A photographic lens 187 is fixed in the interior of a moving frame 172A.

The ultrasonic motor of this thirteenth embodiment is different from the ultrasonic motor of the twelfth embodiment in that two ultrasonic driving members 182A and 182B are disposed in a stationary frame 171A and also in that a single support member 183 formed in a row is used and a holding portion on the stationary frame 171A side for the support member 183 is constituted by a holder member 185 separate from the stationary frame 171A.

More specifically, both ultrasonic driving members 182A and 182B are constructed in just the same manner as in the twelfth embodiment and are disposed in positions which are equidistant circumferentially from the position opposed to the position of the support member 183. The holder member 185 is closely fitted in an opening 171A$a$ formed by cutting out a lower central part (in FIG. 45) of the stationary frame 171A, and is fixed to the stationary frame 171A with machine screws 186, whereby it is constituted as part of the stationary frame 171A. A rectilinear groove 171A$b$ in the shape of a partially arcuate recess for holding the support member 183 is formed in the inner peripheral surface of the holder member 185, extending axially of the holder member. In the space defined by the rectilinear groove 171A$b$ and a rectilinear groove 172A$b$ formed in the moving frame 172A there is disposed the support member 183 which comprises a plurality of bearing balls.

According to the thirteenth embodiment thus constructed, the driving members 182A, 182B and the support member 183 are disposed well-balancedly in approximately trisected positions in the gap formed between the stationary frame 171A and the moving frame 172A; therefore, as in the twelfth embodiment, the moving frame 172A can be positioned accurately with respect to the stationary frame 171A. Additionally, since there are used plural driving members 182A and 182B in this thirteenth embodiment, the driving force for moving the moving frame 172A which holds the photographic lens 187 forward and backward in the optical axis direction doubles. Besides, there can be used about the same space as that for the ultrasonic motor of the twelfth embodiment and it is possible to constitute the motor as a compact motor despite the high output obtained.

Further, since the holder member 185 for holding the support member 183 is provided separately from the stationary frame 171A and is fixed to the stationary frame 171A with machine screws 186, the position of the support member 183 can be finely adjusted in the mounting thereof with respect to the mounted positions of the driving members 182A and 182B, and it is possible to correct manufacturing errors of the moving frame 172A and the stationary frame 171A. It is necessary that the rectilinear grooves of the moving and stationary frames with which the support member 183 is in contact should be made of an abrasion-resistant material. But in this thirteenth embodiment, since there is used the holder member 185 as a separate member, it is not necessary to form the whole of the stationary frame using an abrasion-resistant material. Only the holder member 185 need be formed using an abrasion-resistant material. This is an outstanding effect.

Figure 47:
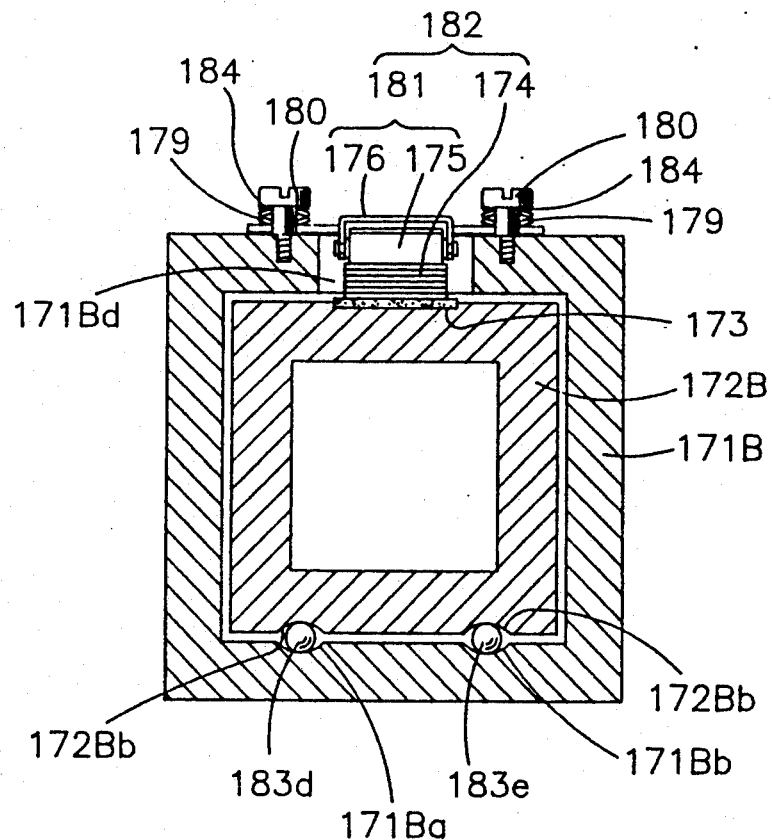
FIG. 47 is a sectional view of an ultrasonic motor according to a fourteenth embodiment of the present invention.

FIG. 47 is a sectional view of an ultrasonic motor according to a fourteenth embodiment of the present invention. The ultrasonic motor of this fourteenth embodiment is different from the ultrasonic motors of the twelfth and thirteenth embodiments in that a stationary frame 171B and a moving frame 172B are each formed by a hollow square pillar, as shown in section in FIG. 47. A driving member 182 and a holder 178 are constructed in just the same manner as in the twelfth embodiment and are disposed within a cutout hole 171B$d$ formed centrally in one side, for example, the upper side of the square section of the stationary frame 171B, and are fixed so that an end face of a longitudinal vibrator 174 comes into pressure contact with the upper surface of a sliding plate 173, using machine screws 180 which are threaded into the upper surface of the stationary frame 171B each through a coned disc spring 179, a spacer 184 for pressure control and a holder opening 178$c$.

On the other hand, in the inner surface of the bottom side of the stationary frame 171B opposed to the driving member 182 thus disposed there are formed rectilinear grooves 171B$a$ and 171B$b$ like those used in the twelfth embodiment in positions close to both sides. The rectilinear grooves 171B$a$ and 171B$b$ are formed symmetrically right and left with respect to the driving member 182. Also, rectilinear grooves 172B$a$ and 172B$b$ are formed in the outer surface of the bottom side of the moving frame 172B in opposed relation to the rectilinear grooves 171B$a$ and 171B$b$. Within the spaces defined by the rectilinear grooves 172B$a$, 172B$b$ and 171B$a$, 171B$b$ there are disposed support members 183$d$ and 183$e$ respectively serving as guide members each comprising a plurality of bearing balls.

The ultrasonic motor of this embodiment even constructed as above operates in just the same manner as the ultrasonic motor of the twelfth embodiment.

In this fourteenth embodiment the stationary frame 171B has flat portions and this permits easy mounting of a vibrator which is in the shape of a flat plate.

In a conventional lens frame for a camera, in driving the lens frame, it is necessary to reduce wobbling between moving and stationary frames in order to enhance the positional accuracy of the frames with respect to each other, and to this end there have been used cylindrical frames. According to the construction of this embodiment, the moving member 172B and the stationary frame 171B can be positioned accurately so long as the rectilinear grooves 171B$a$, 171B$b$ and 172B$a$, 172B$b$ and the support members 183$d$, 183$e$ are formed precisely, and therefore the stationary frame and the moving frame can be formed into any desired shape. Although in this embodiment the sliding plate 173 is provided separately from the moving frame 172B, the sliding plate 173 is not always needed provided the moving frame 172B is formed using an abrasion-resistant material. Further, in the case where the square pillar frame mentioned above is used as a lens frame for a camera, by forming lenses themselves rectangularly it is made possible to attain the reduction of size with respect to lenses having a square field such as film or finder field.

Figure 48:
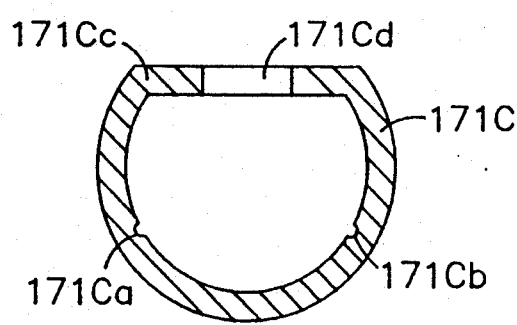
FIGS. 48 and 49 are respective sectional views showing modifications of a stationary frame used in the fourteenth embodiment.
Figure 49:
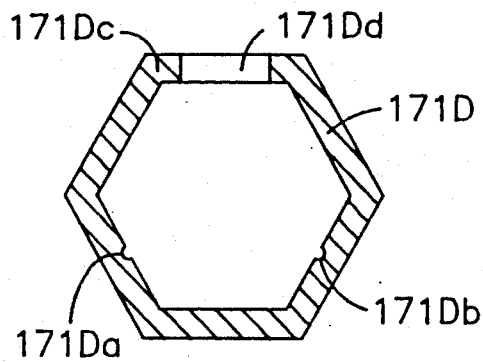

Referring now to FIGS. 48 and 49, there are shown modifications of the stationary frame 171B used in the ultrasonic motor of the above fourteenth embodiment. A stationary frame 171C shown in FIG. 48 is constituted by a hollow cylinder a part of which (upper portion) is formed as a flat portion 171C$c$. A cutout hole 171C$d$ is formed centrally in the flat portion 171C$c$, and rectilinear grooves 171C$a$ and 171C$b$ are formed in the inner surface of the stationary frame 171C so as to be symmetrical right and left with respect to the cutout hole 171C$d$.

On the other hand, a stationary frame 171D shown in FIG. 49 is constituted by a hollow, polygonal cylinder, e.g. a hexagonal cylinder. A cutout hole 171D$d$ is formed centrally in an upper flat portion 171D$c$ of the stationary frame 171D, and rectilinear grooves 171D$a$ and 171D$b$ are formed in the inner surface of the stationary frame 171D so as to be symmetrical right and left with respect to the cutout hole 171D$d$.

Moving frames corresponding to the stationary frames 171C and 171D shown in these modifications may be formed so as to have sectional shapes similar to those of the stationary frames 171C and 171D. They may have other different shapes so long as they can be received inside the inner peripheral surfaces of the stationary frames 171C and 171D. Their shapes are not limited to those illustrated in FIGS. 47 to 49. The moving frames may each be in the form of a hollow frame constituted by the combination of other curves or straight lines.

Although in the above twelfth to fourteenth embodiments there are used bearing balls as the support members 183, 183a-183c, 183d and 183e, there may be used bearing rollers in place of such bearing balls.

The following description is now provided about how to manufacture the electro-mechanical transducing element (hereinafter referred to simply as "laminate type actuator") constituted by a laminate of piezoelectric elements or electrostrictive elements and used in the above ultrasonic motor.

An ultrasonic motor comprising a laminate type actuator constituted by a laminate of piezoelectric elements or electrostrictive elements to induce longitudinal displacements and driving force, and an elastic member fixed to an end face of the actuator, is well known. In this known ultrasonic motor, elliptical vibrations are generated at an end face of the laminate type actuator or of the elastic member fixed thereto, and a moving member is driven by being contacted with the said end face.

The laminate type actuator used in the above ultrasonic motor has heretofore been manufactured by forming electrodes, e.g. silver, on both sides of a piezoelectric ceramic sheet such as, for example, lead zirconate titanate (Pb(Zr-Ti)O$_3$, hereinafter referred to simply as "PZT"), subjecting the piezoelectric ceramic sheet with the electrodes to a polarizing treatment, and then laminating and bonding together a plurality of such piezoelectric ceramic sheets.

However, PZT is a very fragile material, so when used in an ultrasonic motor of the type in which a moving member is brought into contact with the end face of the laminate type actuator mentioned above, it is likely that the said end face portion will be worn off by elliptical vibrations induced at the end face of the laminate type actuator, resulting in breakage or functional impairment of the actuator, or deteriorated efficiency of the ultrasonic motor.

According to a proposed method for preventing such wear, an anti-abrasion member formed by a polyimide resin or a polyamide resin, or a mixture thereof with carbon fibers, which has been processed into the same size as that of the end face of the laminate type actuator, namely, the face of contact with the moving member, is stuck on the said end face or the contact face. In this case, however, it is necessary that the anti-abrasion member be processed in conformity with the shape of the end face of the laminate type actuator, resulting in that not only the manufacturing process becomes complicated but also a positioning jig is required for sticking the anti-abrasion member on the end face of the actuator so as not to cause displacement of the anti-abrasion member.

Further, even if such positioning jig is used, it is difficult to fix the anti-abrasion member firmly with high accuracy. Particularly it is very difficult to manufacture a laminate type actuator about 1 mm high with high accuracy.

In the case where the anti-abrasion member is small-sized and thin and when the protrusion of an adhesive is considered, it is impossible to manufacture a small-sized laminate type actuator with high accuracy. Further, unless the amount of an adhesive to be applied for the sticking of the anti-abrasion member, the pressure-bonding force and the setting time are maintained constant, the resulting laminate type actuators with anti-abrasion members fixed thereon will be non-uniform in overall length.

If laminate type actuators not uniform in overall length are used in the foregoing ultrasonic motor requiring a plurality of laminate type actuators, there will be different states of contact between a driven member and the actuators. Consequently, elliptical vibrations generated at the upper end faces of the laminate type actuators are not transferred efficiently to the driven member.

In order to prevent such inconvenience it is necessary to grind anti-abrasion members of plural laminate type actuators at one time so that all of the plural actuators have the same overall length. But this is disadvantageous in that the manufacturing process becomes complicated.

The following description is now provided about a laminate type actuator manufacturing method free of such drawbacks and capable of manufacturing laminate type actuators having a high dimensional accuracy in a simple manner.

FIGS. 50 to 54 are perspective views showing products in manufacturing steps according to the said laminate type actuator manufacturing method.

First, electrodes 192, e.g. silver, are formed on both sides of a piezoelectric ceramic sheet 191 such as a PZT sheet by sputtering, vapor deposition, or application, and thereafter the piezoelectric ceramic sheet 191 is polarized in the thickness direction.

Figure 50:
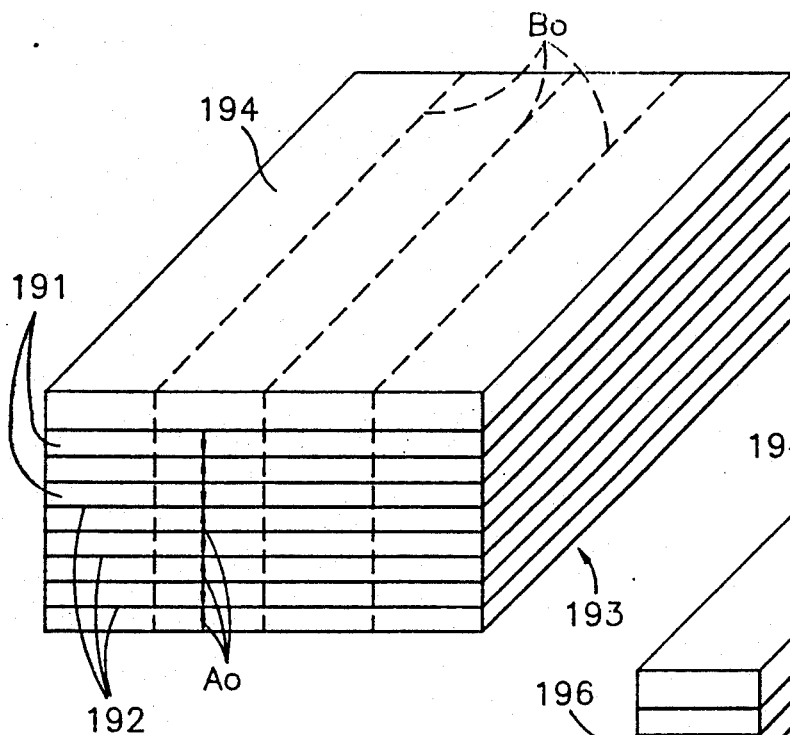
FIGS. 50 to 54 are perspective manufacturing process diagrams showing an example of a manufacturing process for a laminate type actuator used in an ultrasonic motor according to the present invention.

Then, a plurality of such piezoelectric ceramic sheets 191 after the polarizing treatment are laminated while being bonded together to fabricate a matrix 193 as shown in FIG. 50. In this case, the piezoelectric ceramic sheets are laminated so that adjacent ceramic sheets are opposite in polarizing direction to each other as indicated by arrows Ao in FIG. 50.

And to the top of the matrix 193 there is bonded a thin film-like anti-abrasion member 194 constituted by a polyimide resin, a polyamide resin, or a mixture thereof with carbon fibers, or alumina ceramics, carbon film, or hard alloy.

Figure 51:
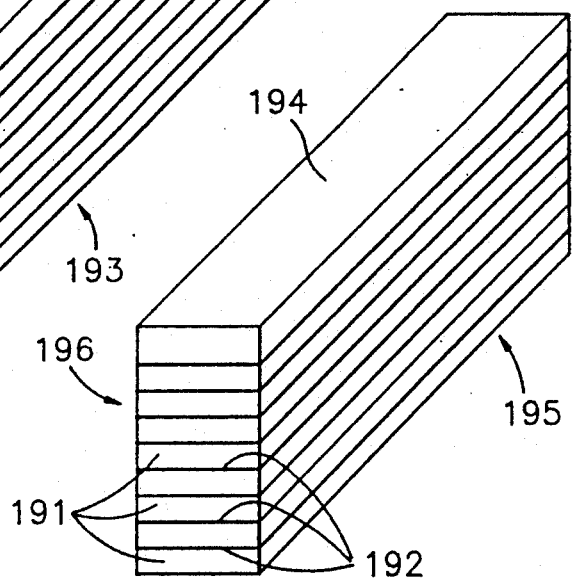

The matrix 193 is cut along broken lines Bo in FIG. 50 by means of a cutter using a diamond blade to obtain such a piezoelectric laminate 195 as shown in FIG. 51.

Figure 52:
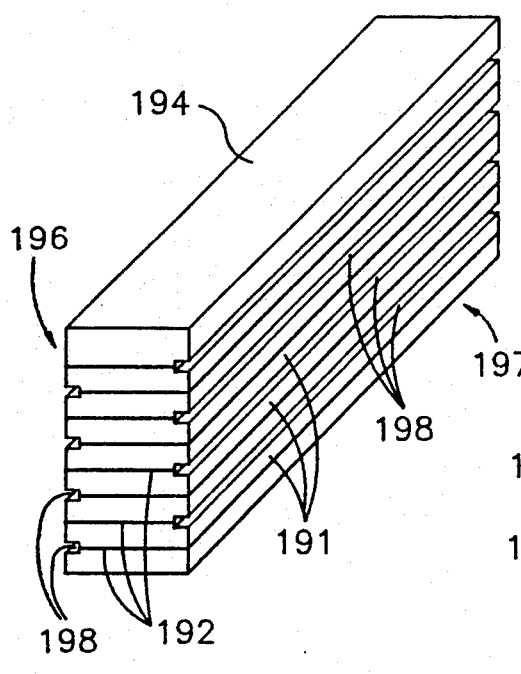

Then, end portions of the electrodes 192 exposed to a left side face 196 in FIG. 51 are cut out alternately as in FIG. 52, while at a right side face 197 end portions of the electrodes are also cut out in the same manner, but in alternately shifted positions.

Figure 53:
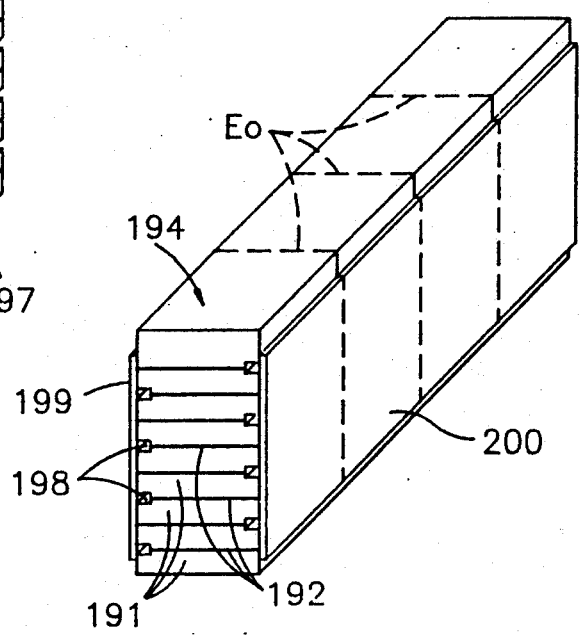
Figure 54:
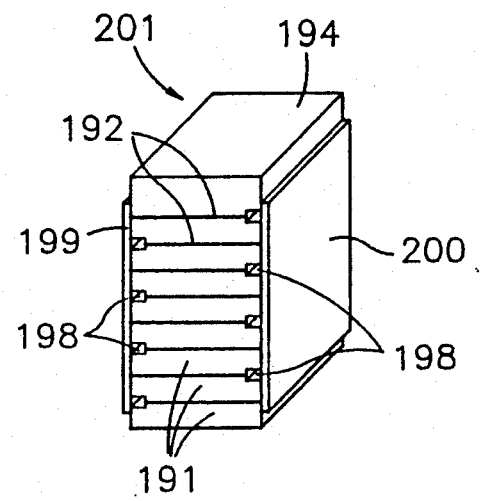

Then, an insulating material is poured into such cut-out portions and solidified to form insulating portions 198, as shown in FIGS. 52 and 53. It goes without saying that the insulating portions 198 may be formed by inserting a solid insulating material having a size conforming to each cutout portion into each cutout portion, followed by bonding, and thereafter grinding the left and right side faces 196, 197.

Thereafter, an electrode, e.g. silver, is formed on almost the whole surface of each of the left and right sides 196, 197 of the piezoelectric laminate 195 by application, vapor deposition, or sputtering, to obtain external electrodes 199 and 200, as shown in FIG. 53. The piezoelectric laminate 195 thus provided with the external electrodes 199 and 200 is cut along broken lines Eo in FIG. 53 by means of a cutter using a diamond blade to obtain a laminate type piezoelectric actuator 201 shown in FIG. 54.

Although in the above manufacturing process the anti-abrasion member 194 is provided only on the upper end face of the laminate type piezoelectric actuator 201 (see FIG. 54), it may be provided on both upper and lower end faces of the same actuator in some particular shape of the ultrasonic motor used.

The anti-abrasion member 194 may be formed by coating of such a material as titanium nitride, aluminum nitride, or silicon nitride, using a physical vapor deposition (hereinafter referred to simply as "PVD") method such as vacuum evaporation, ion plating, or sputtering.

According to the above manufacturing process it is possible to manufacture a large quantity of laminate type piezoelectric actuators of the same size which are superior in durability. Also in the case where such a laminate type piezoelectric actuator is used as a driving source of an ultrasonic motor, there can be obtained an ultrasonic motor which is small-sized, high in accuracy, easy to manufacture and highly durable.

Figure 55:
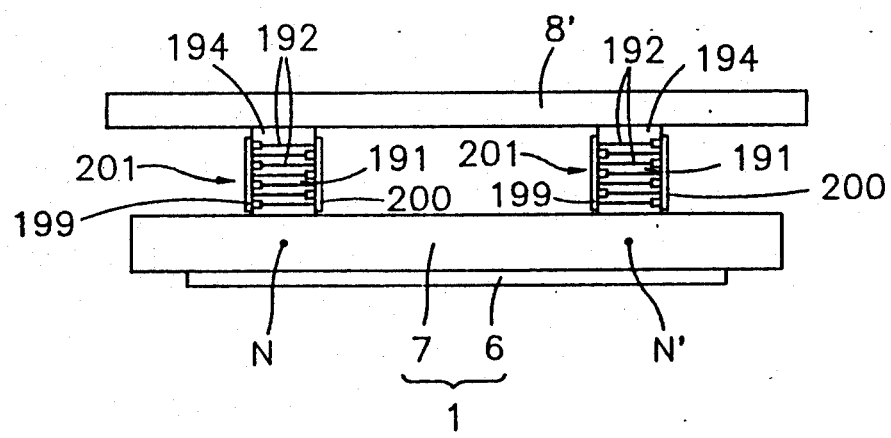
FIG. 55 is a side view in which the laminate type actuator manufactured by the above-mentioned process is used as an ultrasonic motor driving source.

Referring now to FIG. 55, there is shown an example in which the laminate type piezoelectric actuator 201 described above is used as a driving source of an ultrasonic motor. More specifically, such laminate type actuators 201 are used as longitudinal vibrators which are one of the driving sources of the ultrasonic motor illustrated in the foregoing first embodiment.

To the lower surface of an elastic member 7 which is in the form of a thin plate there is fixed a piezoelectric element 6 which is polarized in the thickness direction of the elastic member 7, to thereby constitute a flexural vibrator 1.

When AC voltage is applied to the piezoelectric element 6, the flexural vibrator 1 performs a flexural vibration.

Laminate type piezoelectric actuators 201 fabricated in the manner described above are fixed onto two nodes N and N' of such flexural vibration in the thickness direction of the elastic member 7. A guide member or a driven member 8', e.g. a linear rail, is kept in pressure contact with the upper end faces of the laminate type piezoelectric actuators 201, namely, the upper surfaces of the anti-abrasion members 194 by a biasing force of a resilient means, and hence pressed against the flexural vibrator 1.

In this construction, AC voltage is applied to the piezoelectric element 6 to induce a flexural vibration of the flexural vibrator 1, thus causing end portions of the actuators 201 to reciprocate, centered on the nodes N and N'.

In order that a unidirectional motion out of such reciprocating motions may be exerted on the driven member 8', the laminate type piezoelectric actuators 201 are expanded and contracted alternately in synchronism with the flexural vibration of the flexural vibrator 1 to generate elliptical vibrations at end faces of the actuators 201, thereby causing the moving member 8' to move in one direction with respect to the flexural vibrator 1 and the actuators 201.

Thus, in the case where the laminate type piezoelectric actuators 201 are applied to an ultrasonic motor, since it is possible to manufacture such actuators of the same height in a large quantity, it is not necessary to adjust the height of each actuator. Consequently, a very stable ultrasonic motor of high efficiency can be manufactured easily.

Figure 56:
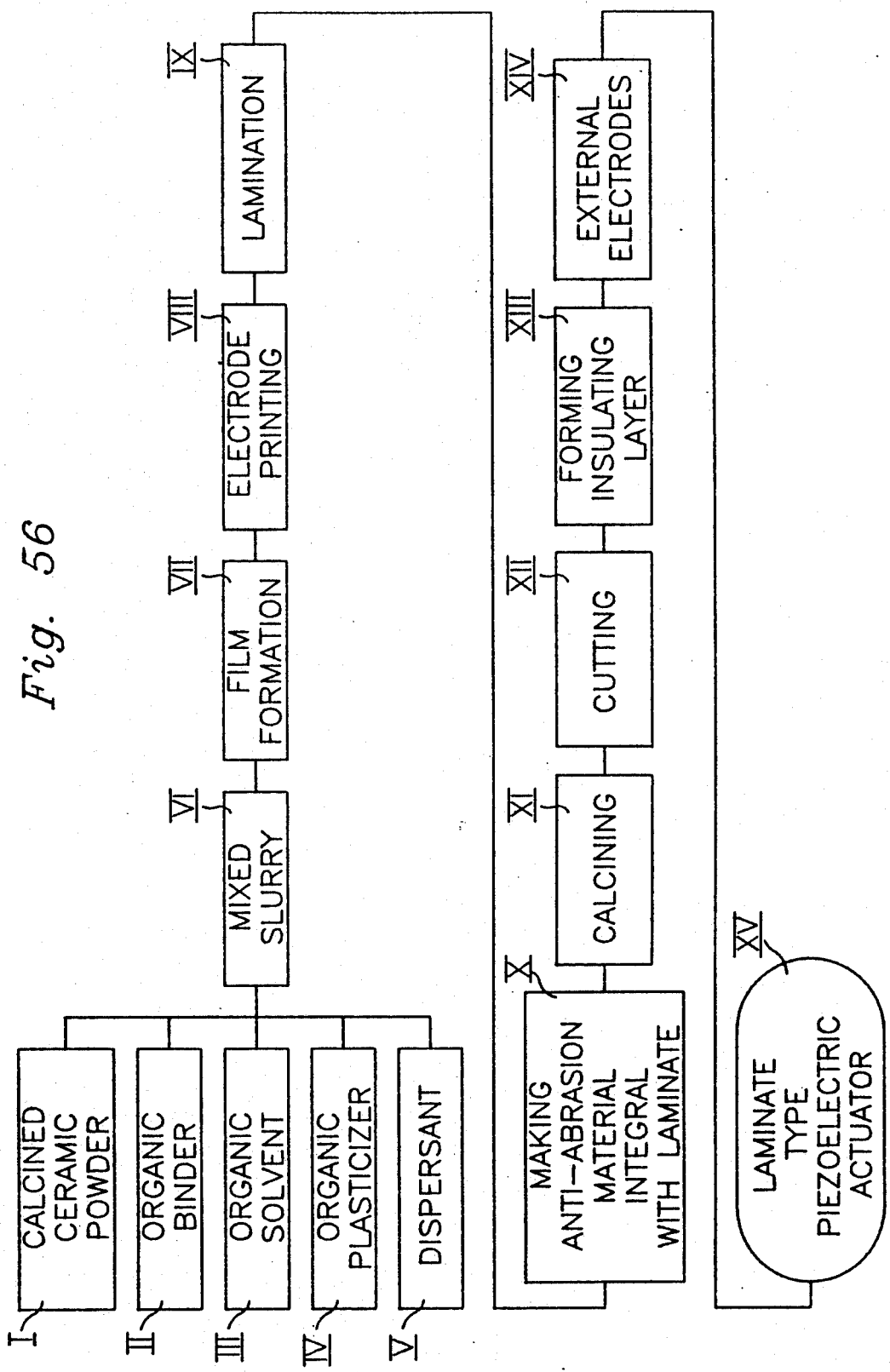
FIG. 56 is a manufacturing process diagram showing another example of a laminate type actuator manufacturing process.
Figure 57:
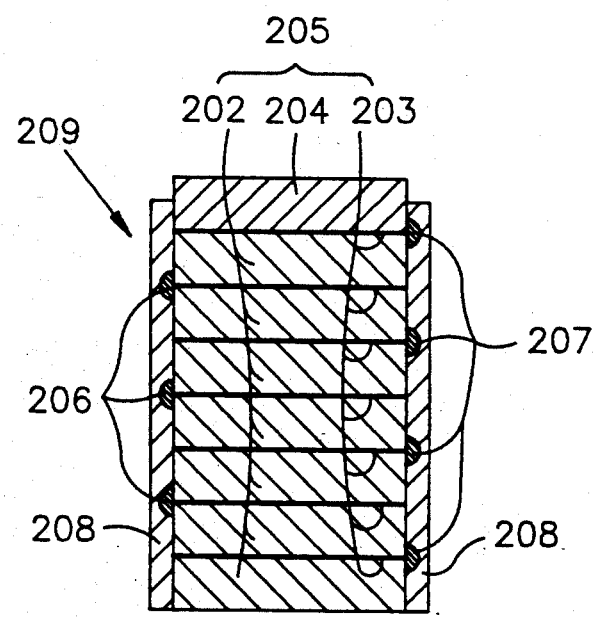
FIG. 57 is a sectional view of a laminate type actuator fabricated by the manufacturing process shown in FIG. 56.

Now, how to manufacture a laminate type actuator by a green sheet method will be described with reference to FIGS. 56 and 57. FIG. 56 illustrates laminate type actuator manufacturing steps according to a green sheet method, and FIG. 57 is a sectional view of a finished laminate type actuator obtained by this manufacturing method.

This manufacturing process is almost the same as the green sheet lamination process heretofore adopted in the production of laminated ceramic capacitors.

First, in steps I to V there is prepared a slurry by adding an organic binder, an organic solvent, an organic plasticizer and a dispersant to a calcined powder of piezoelectric ceramic material.

Then, in steps VI and VII, the slurry is applied onto a carrier film at a predetermined thickness, say, 100 $\mu$m, using a doctor blade, followed by drying and separation from the carrier film to prepare a green sheet 202.

Next, in step VIII, a suitable size is punched from the green sheet 202, and a metallic paste for an internal electrode 203 is screen-printed to one side of the green sheet of a suitable size.

In step IX, a required number of such green sheets 202 each having the internal electrode 203 printed thereon are laminated together. Then, in step X, an anti-abrasion member 204 which is in the form of a thin film and constituted by alumina, zirconia or titania is put on the top of the laminate and made integral therewith by pressing at a pressure of several hundred kilograms per square centimeter or by heat pressing under heating at about 100° C. and at a pressure of several hundred kilograms per square centimeter, to obtain a laminate 205. The pressing temperature depends on the softening temperature of the organic binder used.

Since the organic binder is contained in a fairly large amount in the green sheet 202, the thus pressure-bonded laminate 205 is heated before calcining slowly up to a temperature of 500° C. to 600° C. to thermally decompose organic components completely.

Thereafter, in step XI, the laminate 205 is calcined at a temperature of about 1,200° C., whereby the green sheet 202, the internal electrode 203 and the anti-abrasion member 204 are rendered integral to obtain a calcined chip.

Then, in step XII, the laminate 205 is cut into a desired size. Thereafter, as shown in FIG. 57, a glass insulator is deposited by electrophoresis on every other end portion of the internal electrodes 203 on the left side face of the laminate 205, followed by baking to form glass insulator layers 206.

Then, in step XIII, glass insulator layers 207 are formed also on the right side face in alternate positions with respect to the glass insulator layers 206 by the same method as above.

Lastly, in step XIV, external electrodes 208 are formed on the right and left side faces of the laminate 205 so as to cover the glass insulator layers 206 and 207 by printing or application, whereby there is completed a laminate type piezoelectric actuator 209 (step XV) in which all of the internal electrodes 203 are connected in parallel to the external electrodes 208 in an alternate manner.

The laminate type piezoelectric actuator 209 thus obtained is small-sized and has a high dimensional accuracy, and it can be manufactured in a simple manner as described above.

Although in the above manufacturing method the thin film-like anti-abrasion member 204 is made integral with the green sheets 202 simultaneously with the lamination of the green sheets, it goes without saying that there may be adopted a method in which first the green sheets 202 alone are laminated together and calcined and thereafter the thin film-like anti-abrasion member 204 is fixed to the resulting laminate.

Although in the foregoing manufacturing method a thin film of alumina, zirconia or titania is used as the anti-abrasion member 204, there may be adopted a method in which after lamination and calcining by the green sheet method, the resulting laminate is coated with titanium nitride, aluminum nitrode or silicon nitride by the PVD method.

Also when the laminate type piezoelectric actuator 209 fabricated by the foregoing manufacturing method is used as a longitudinal vibrator which is one of the driving sources of the ultrasonic motor described above, there can be obtained the same effects as in the use of the laminate type piezoelectric actuator 201 fabricated by the foregoing manufacturing method.

What is claimed is:

1. A method for producing a superior longitudinal vibrator comprising the steps of:

providing a plurality of piezoelectric ceramic sheets of substantially uniform thickness length and width;

coating at least one major surface of each ceramic sheet with a conductive material;

polarizing each coated sheet in the thickness direction;

bonding all of said sheets together to fabricate a matrix wherein adjacent ceramic sheets in opposite polarizing directions are next to one another;

bonding a film-like anti-abrasion member upon the surface of one of the exposed ceramic sheets of said matrix;

cutting the matrix to form a plurality of individual piezoelectric laminates so that the conductive coatings are exposed along both longitudinal sides of each laminate;

electrically insulating alternating ones of the conductive coatings exposed along one longitudinal side of each of said piezoelectric laminates;

electrically insulating the conductive coatings exposed along the opposite longitudinal side of each of said piezoelectric laminates wherein the alternating ones of the conductive coatings being electrically insulated are interspersed with the alternating ones of the conductive coatings being insulated on the opposite side of said piezoelectric laminate; and applying a conductive coating to substantially the entire surface of both longitudinal sides of each piezoelectric laminate whereby each of said conductive coatings is electrically connected with conductive coatings between said ceramic sheets which extend to the longitudinal side of the associated conductive coating.

2. The method for producing longitudinal vibrators as set forth in claim 22 wherein the step of forming a conductive coating on each ceramic sheet further comprises the step of forming the electrode coating through one of the methods including sputtering and vapor deposition.

3. The method of claim 2 wherein the conductive coating is silver.

4. The method of claim 1 wherein the anti-abrasion member is taken form the group of members including polyimide resin, polyamide resin, a mixture of polyamide and polyimide resins and carbon fibers, alumina ceramics, a carbon film and a hard alloy.

5. The method of claim 1 wherein said step of cutting the matrix further comprises the steps of utilizing a cutter having a diamond blade.

6. The method of claim 1 wherein said step of insulating alternating ones of said conductive coatings further comprises the steps of removing a portion of the alternating conductive coatings extending to the longitudinal sides of each separated piezoelectric laminate to form elongated recesses; and filling said elongated recesses with an insulation material.

7. The method of claim 1 wherein the step of electrically insulating alternating ones of said conductive coatings along the longitudinal sides of each piezoelectric laminate further comprises the step of applying an insulating material along each of the alternating conductive coatings being insulated.

8. The method of claim 1 wherein the step of conductive coatings on the longitudinal surfaces of each piezoelectric laminate comprises applying a conductive material by one of the methods including vapor deposition and sputtering.

9. The method of claim 8 wherein said conductive material is silver.

* * * * *

UNITED STATES PATENT AND TRADEMARK OFFICE
CERTIFICATE OF CORRECTION

PATENT NO. : 5,191,688
DATED : March 9, 1993
INVENTOR(S) : Takizawa et al.

It is certified that error appears in the above-identified patent and that said Letters Patent is hereby corrected as shown below:

```
Column 4, line 26, after "vibrator" insert --.--
Column 5, line 13, change "hot" to --not--
Column 5, line 33, change "inefficiency" to --in efficiency--
Column 7, line 1, change "and" to --to--
Column 7, line 25, before "12C" delete "and"
Column 12, line 18, delete "to"
Column 14, line 15, change "rotatable" to --rotatably--
Column 14, line 37, change "Ωt" to --ωt--
Column 14, line 38, change "w" to --ω--
Column 14, line 44, change "3" to --l₃--
Column 18, line 2, change "aisposed" to --disposed--
Column 25, line 37, after "vibrator." insert the following
    which begins a new paragraph:  --In the mesurement, the
    height T of each--
Column 37, line 32, change "172a-171c" to --171a-171c--
Column 48, line 21, change "form" to --from--
```

Signed and Sealed this

Eleventh Day of January, 1994

BRUCE LEHMAN

*Attest:*

*Attesting Officer*     *Commissioner of Patents and Trademarks*

UNITED STATES PATENT AND TRADEMARK OFFICE
CERTIFICATE OF CORRECTION

PATENT NO. : 5,191,688
DATED : March 2, 1993
INVENTOR(S) : BRADNER L. HISEY

It is certified that error appears in the above-indentified patent and that said Letters Patent is hereby corrected as shown below:

Column 22, line 47, between "each" and "therewith" add --stationary vane, each stationary vane having associated--.

Signed and Sealed this

Second Day of April, 1996

Attest:

BRUCE LEHMAN

*Attesting Officer*  *Commissioner of Patents and Trademarks*